United States Patent
Chiang et al.

(10) Patent No.: US 12,009,261 B2
(45) Date of Patent: Jun. 11, 2024

(54) NANOSHEET DEVICES WITH HYBRID STRUCTURES AND METHODS OF FABRICATING THE SAME

(71) Applicant: Taiwan Semiconductor Manufacturing Company, Ltd., Hsin-Chu (TW)

(72) Inventors: Kuo-Cheng Chiang, Hsinchu County (TW); Shi Ning Ju, Hsinchu (TW); Guan-Lin Chen, Hsinchu County (TW); Jung-Chien Cheng, Tainan (TW); Chih-Hao Wang, Hsinchu County (TW); Kuan-Lun Cheng, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 398 days.

(21) Appl. No.: 17/520,385

(22) Filed: Nov. 5, 2021

(65) Prior Publication Data
US 2022/0254882 A1 Aug. 11, 2022

Related U.S. Application Data

(60) Provisional application No. 63/146,149, filed on Feb. 5, 2021.

(51) Int. Cl.
*H01L 21/8234* (2006.01)
*H01L 27/088* (2006.01)
(Continued)

(52) U.S. Cl.
CPC ........... *H01L 21/823412* (2013.01); *H01L 21/823418* (2013.01); *H01L 21/823431* (2013.01);
(Continued)

(58) Field of Classification Search
CPC ..... H01L 21/823412; H01L 21/823418; H01L 21/823431; H01L 21/823437; H01L 21/823807; H01L 21/823821; H01L 27/088; H01L 27/0886; H01L 29/0665; H01L 29/0673; H01L 29/165;
(Continued)

(56) References Cited

U.S. PATENT DOCUMENTS

2017/0229476 A1 8/2017 Kim et al.
2019/0057867 A1 2/2019 Smith et al.
(Continued)

OTHER PUBLICATIONS

Cheng, Jung-Chien et al "Hybrid Semiconductor Device" U.S. Appl. No. 17/226,851; Assignee: Taiwan Semiconductor Manufacturing Company, Ltd. 38 pages of Specification, 37 pages of Drawings.

*Primary Examiner* — Cheung Lee
(74) *Attorney, Agent, or Firm* — Haynes and Boone, LLP

(57) ABSTRACT

A semiconductor structure includes a first stack of active channel layers and a second stack of active channel layers disposed over a semiconductor substrate, where the second stacking include a dummy channel layer and the first stack is free of any dummy channel layer, a gate structure engaged with the first stack and the second stack, and first S/D features disposed adjacent to the first stack and second S/D features disposed adjacent to the second stack, where the second S/D features overlap with the dummy channel layer.

20 Claims, 58 Drawing Sheets

(51) Int. Cl.
    *H01L 29/06*     (2006.01)
    *H01L 29/423*     (2006.01)
    *H01L 29/66*     (2006.01)
    *H01L 29/786*     (2006.01)

(52) U.S. Cl.
    CPC ...... *H01L 27/0886* (2013.01); *H01L 29/0665* (2013.01); *H01L 29/42392* (2013.01); *H01L 29/66545* (2013.01); *H01L 29/78618* (2013.01); *H01L 29/78696* (2013.01)

(58) Field of Classification Search
    CPC ......... H01L 29/42392; H01L 29/66439; H01L 29/66545; H01L 29/66795; H01L 29/6681; H01L 29/775; H01L 29/7848; H01L 29/78618; H01L 29/78696; H01L 21/82314; B82Y 10/00
    See application file for complete search history.

(56) References Cited

U.S. PATENT DOCUMENTS

2019/0378915 A1*   12/2019   Frougier ........... H01L 29/78651
2021/0005747 A1     1/2021   Wu et al.

* cited by examiner

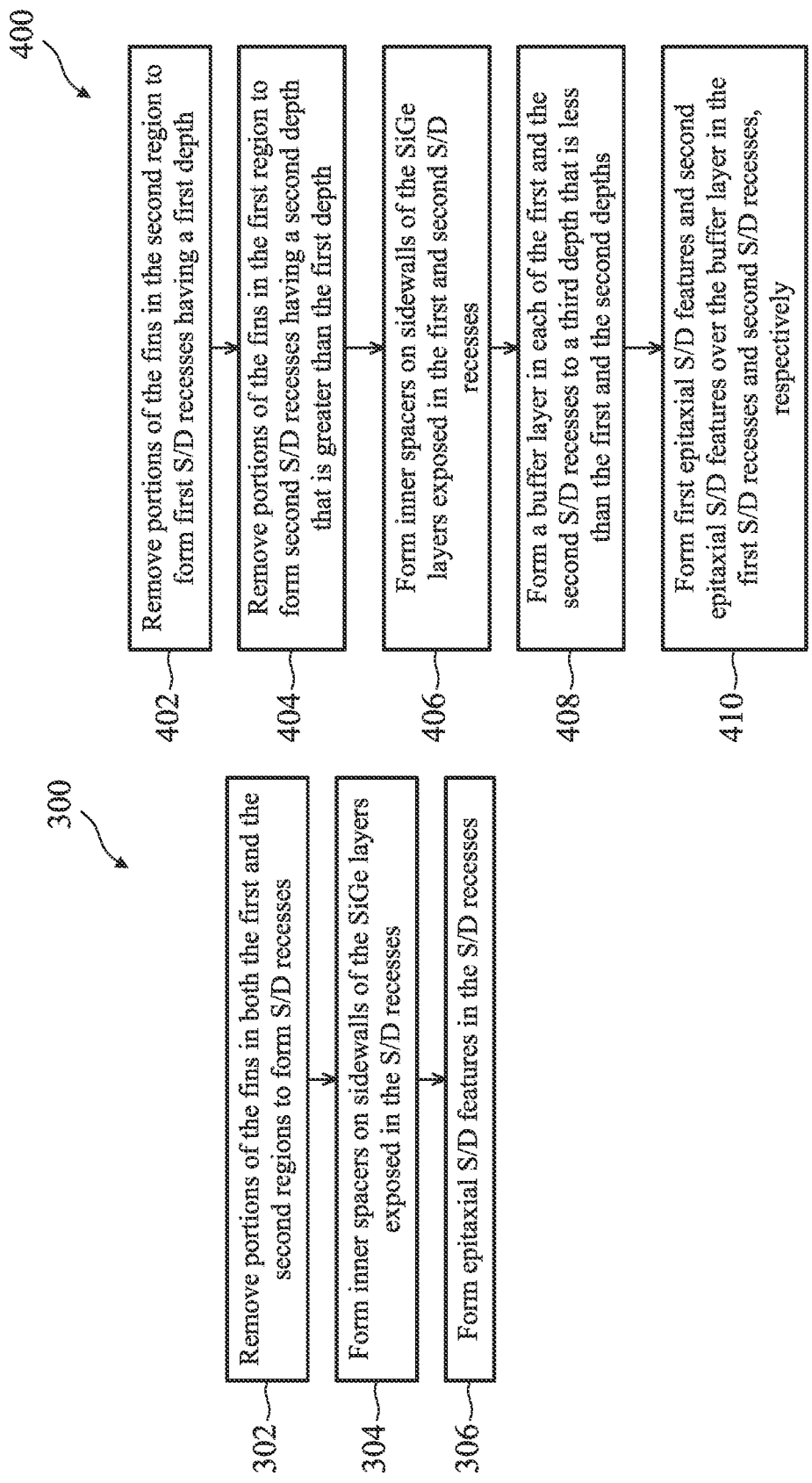

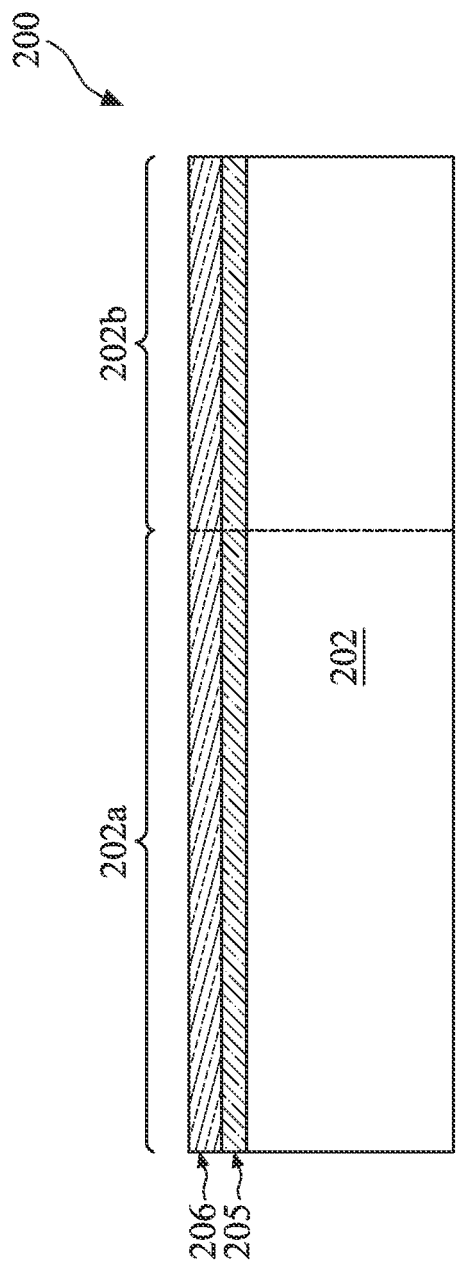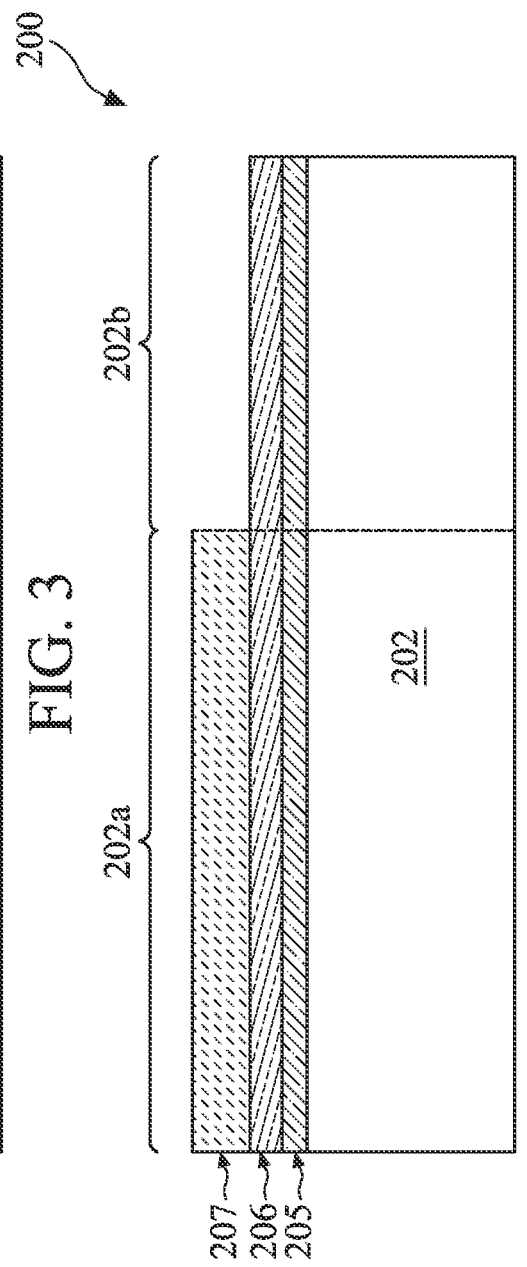

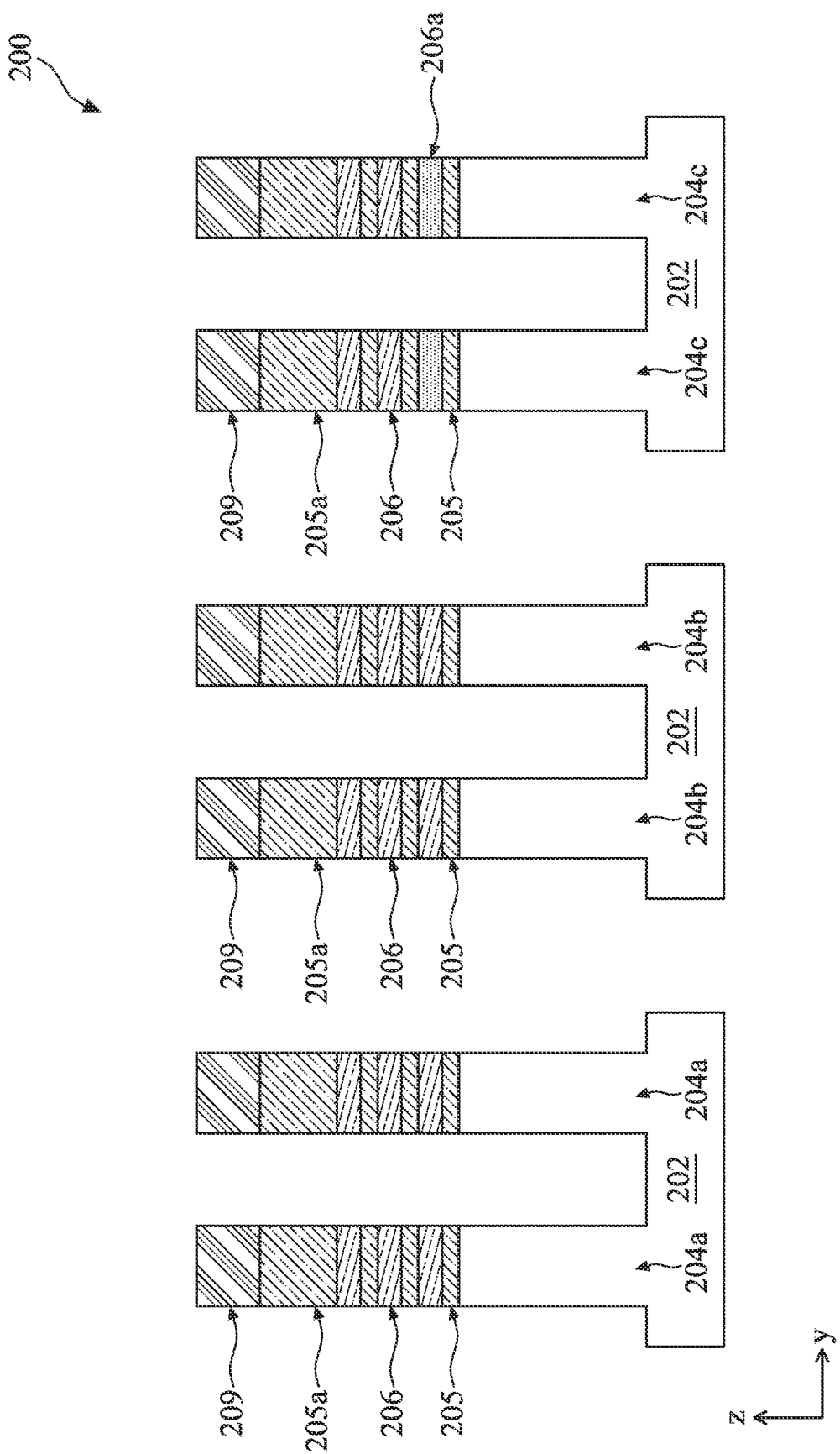

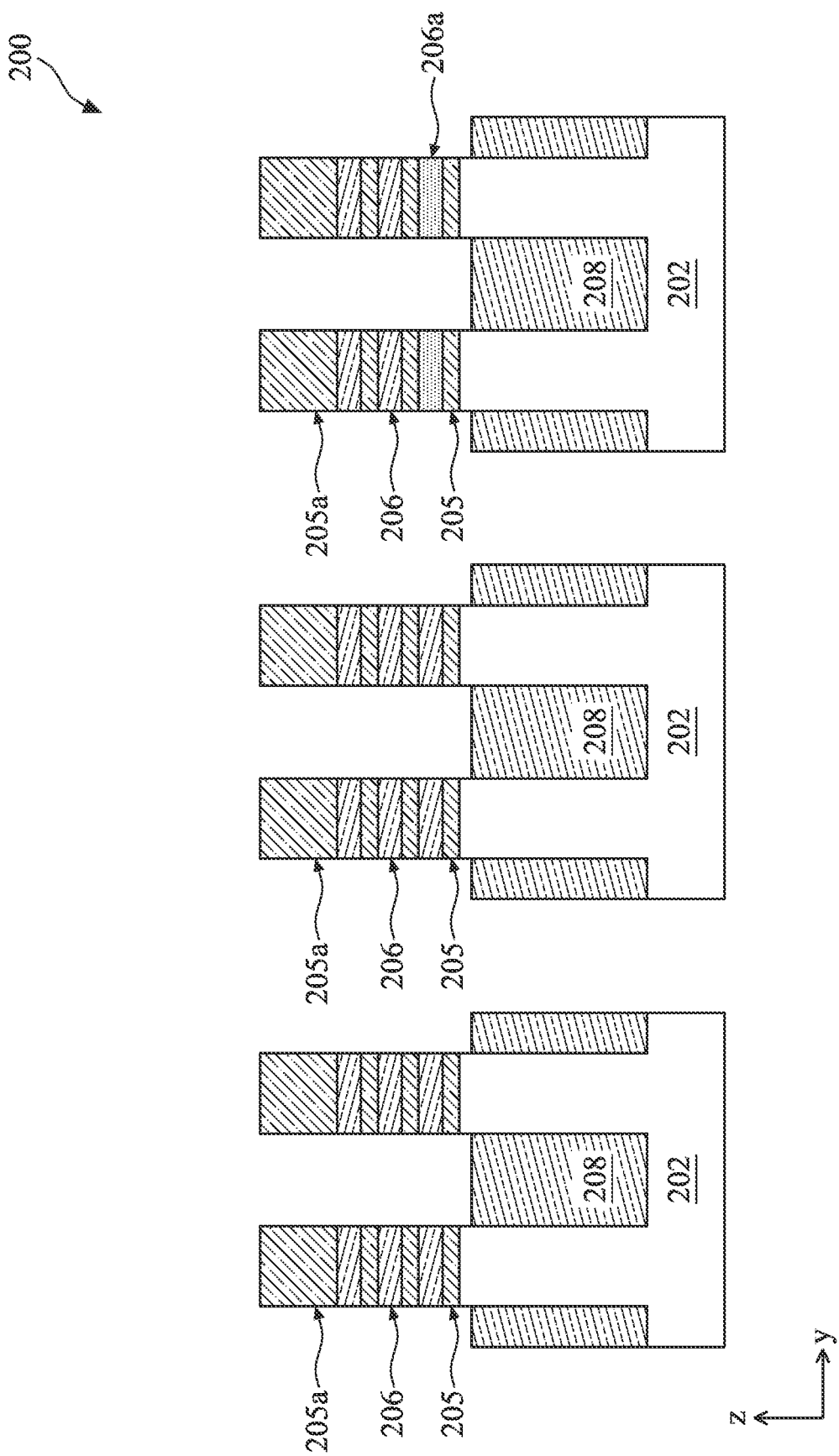

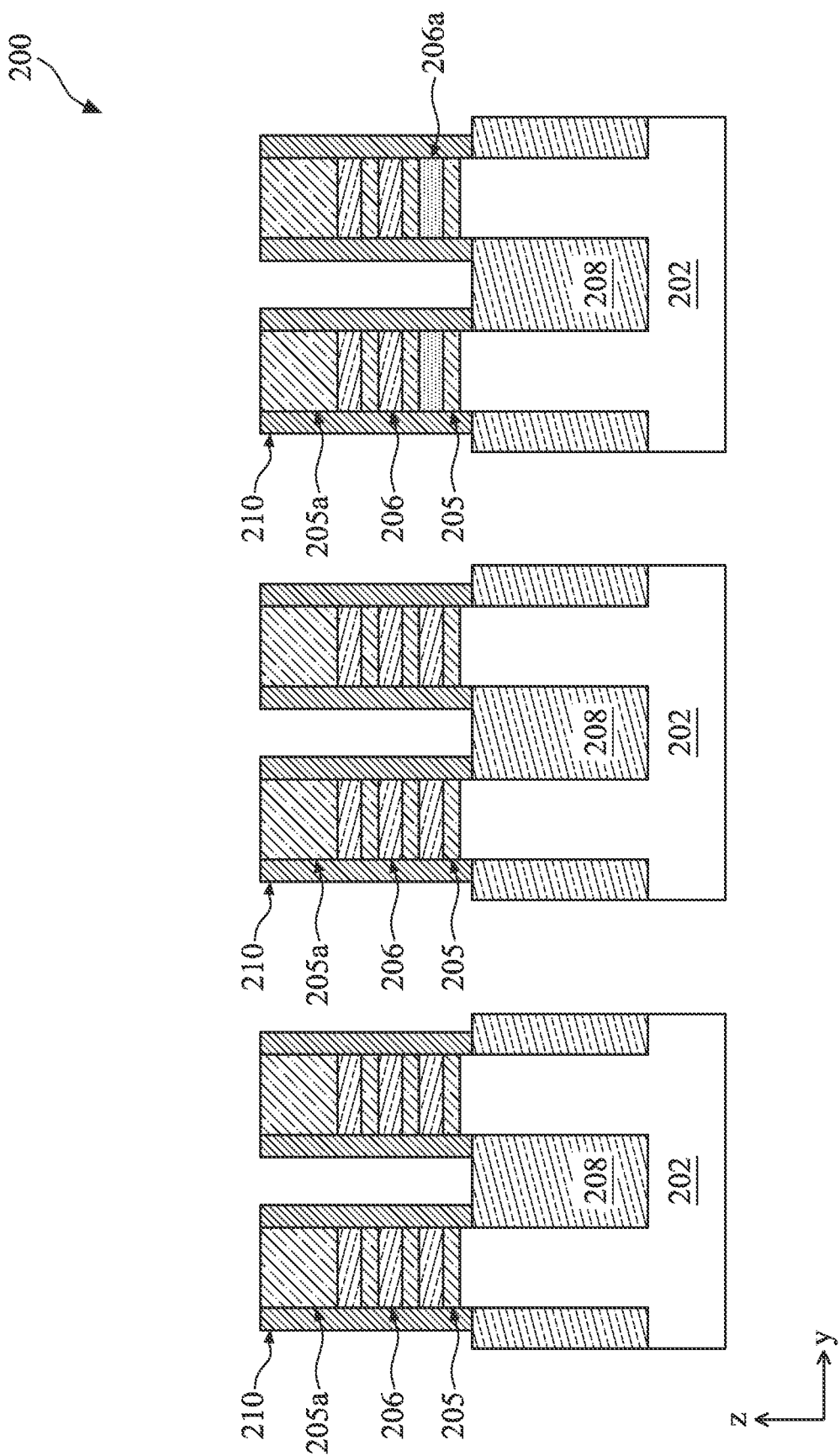

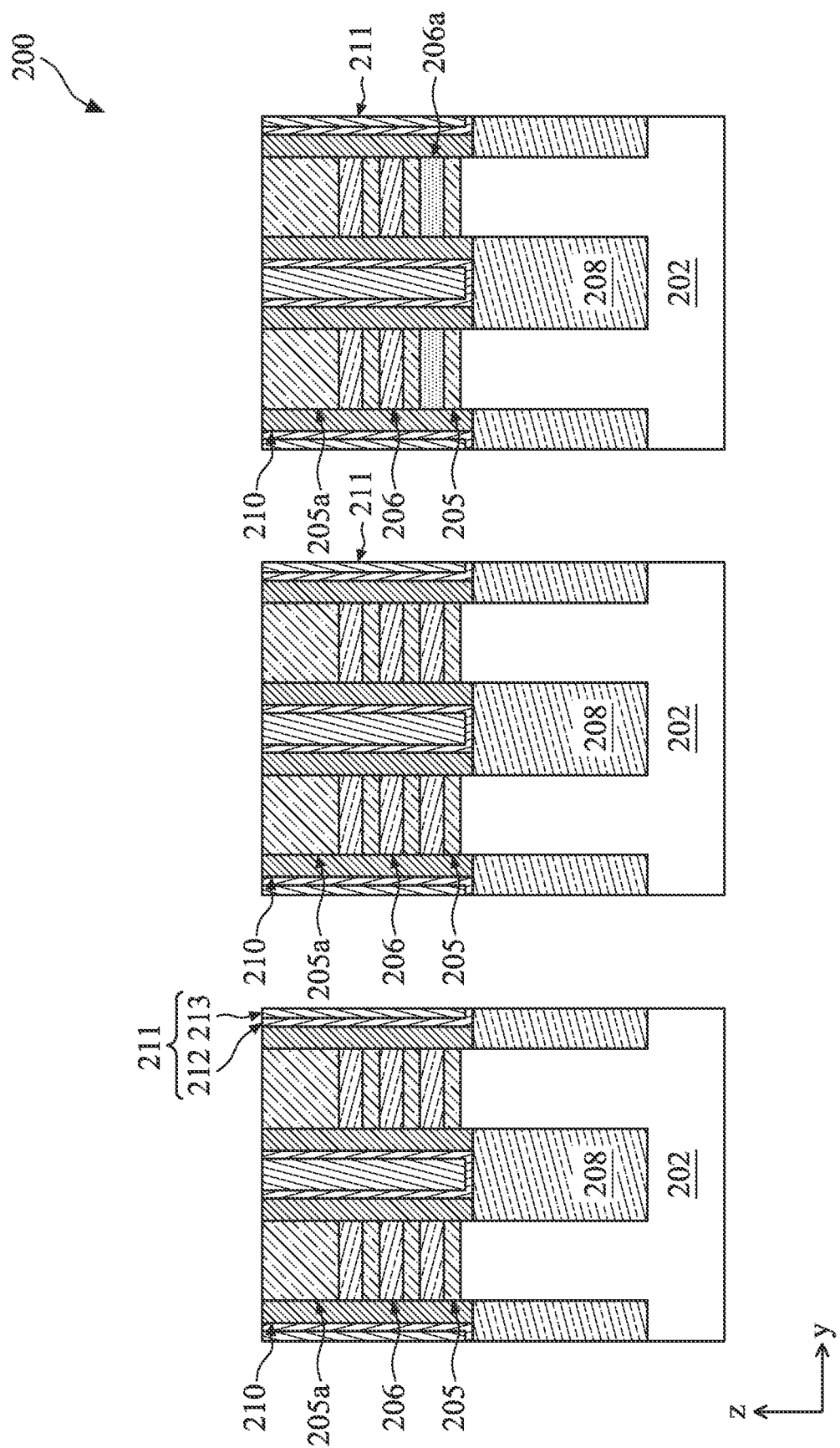

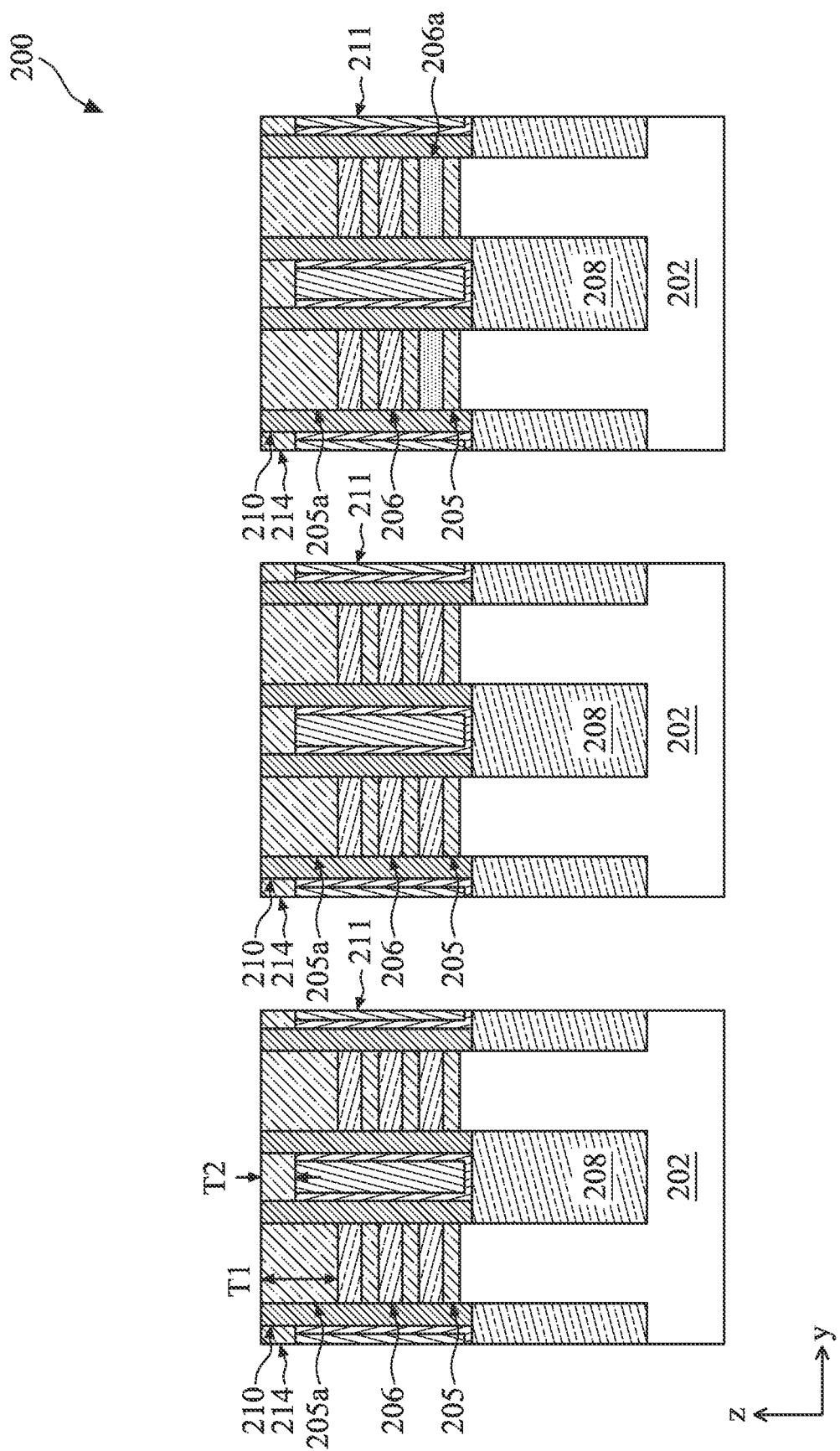

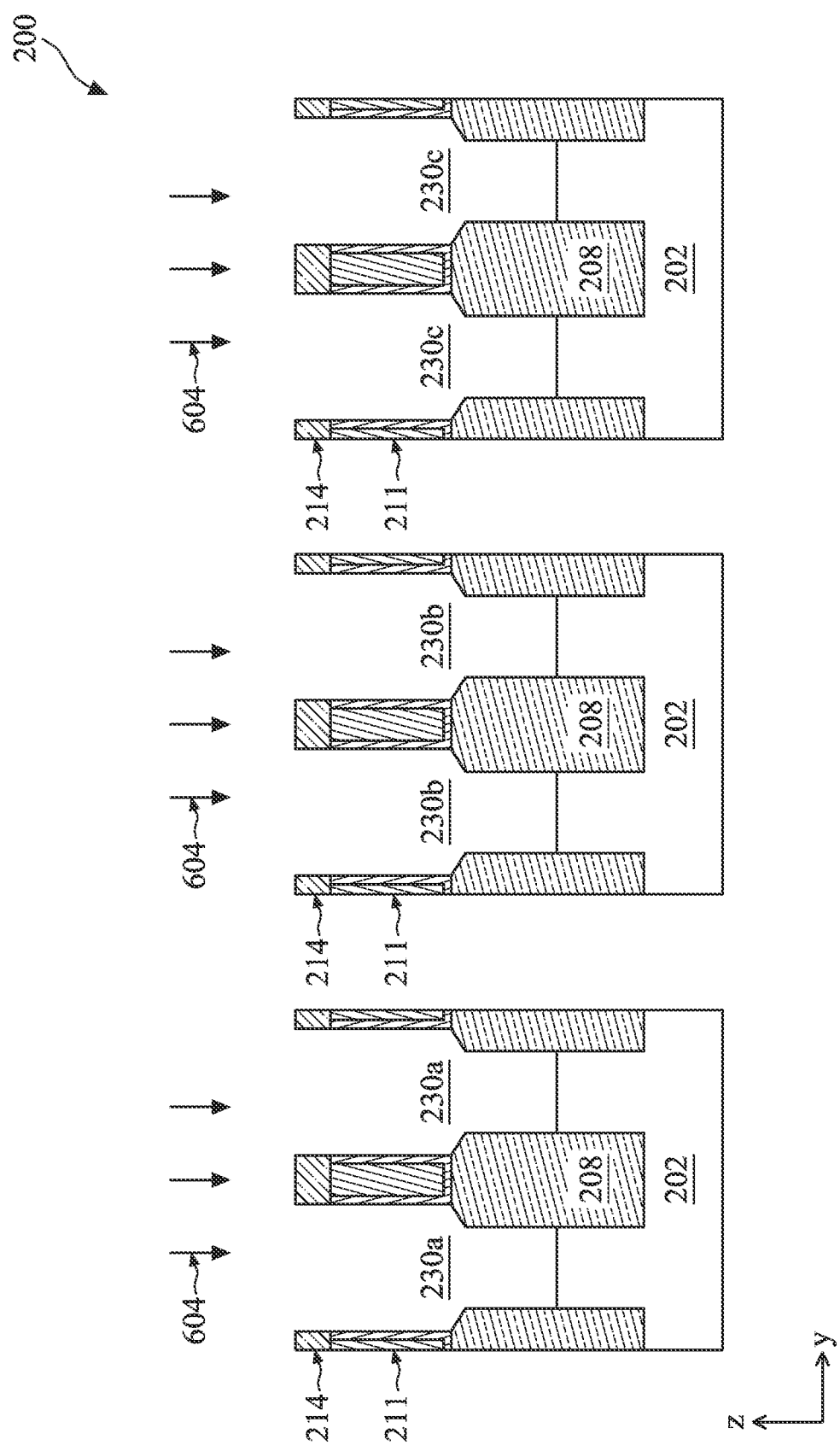

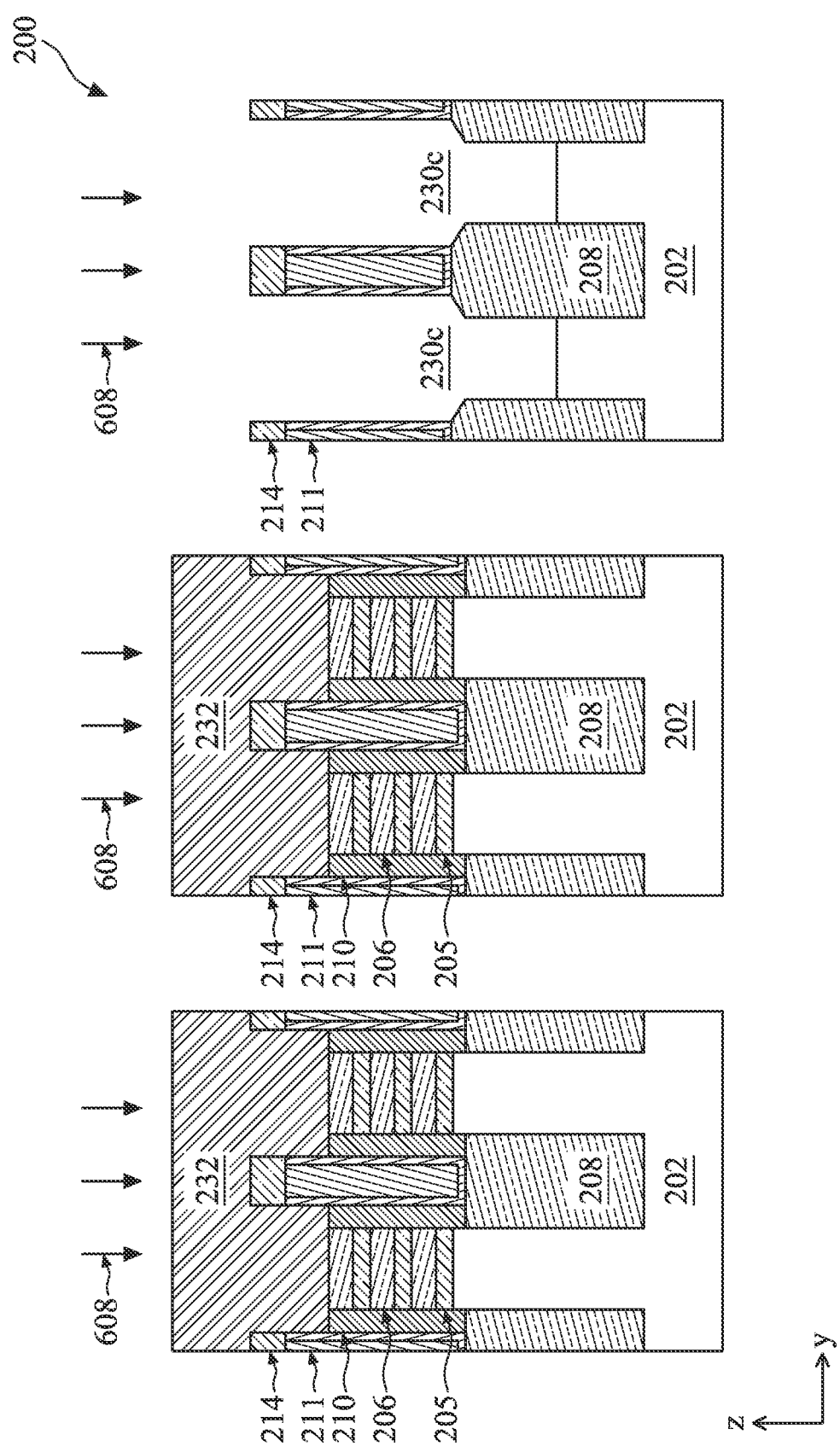

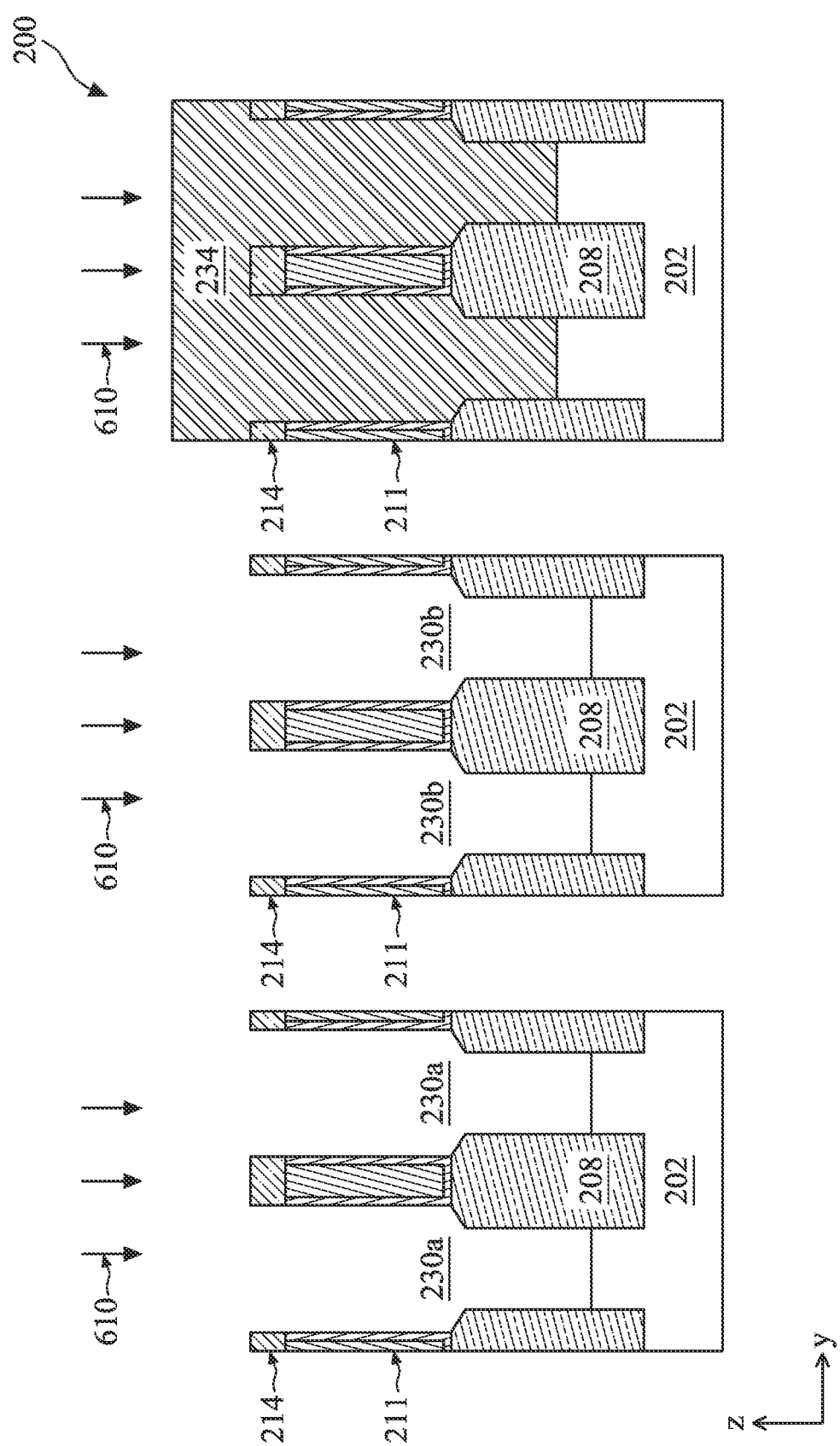

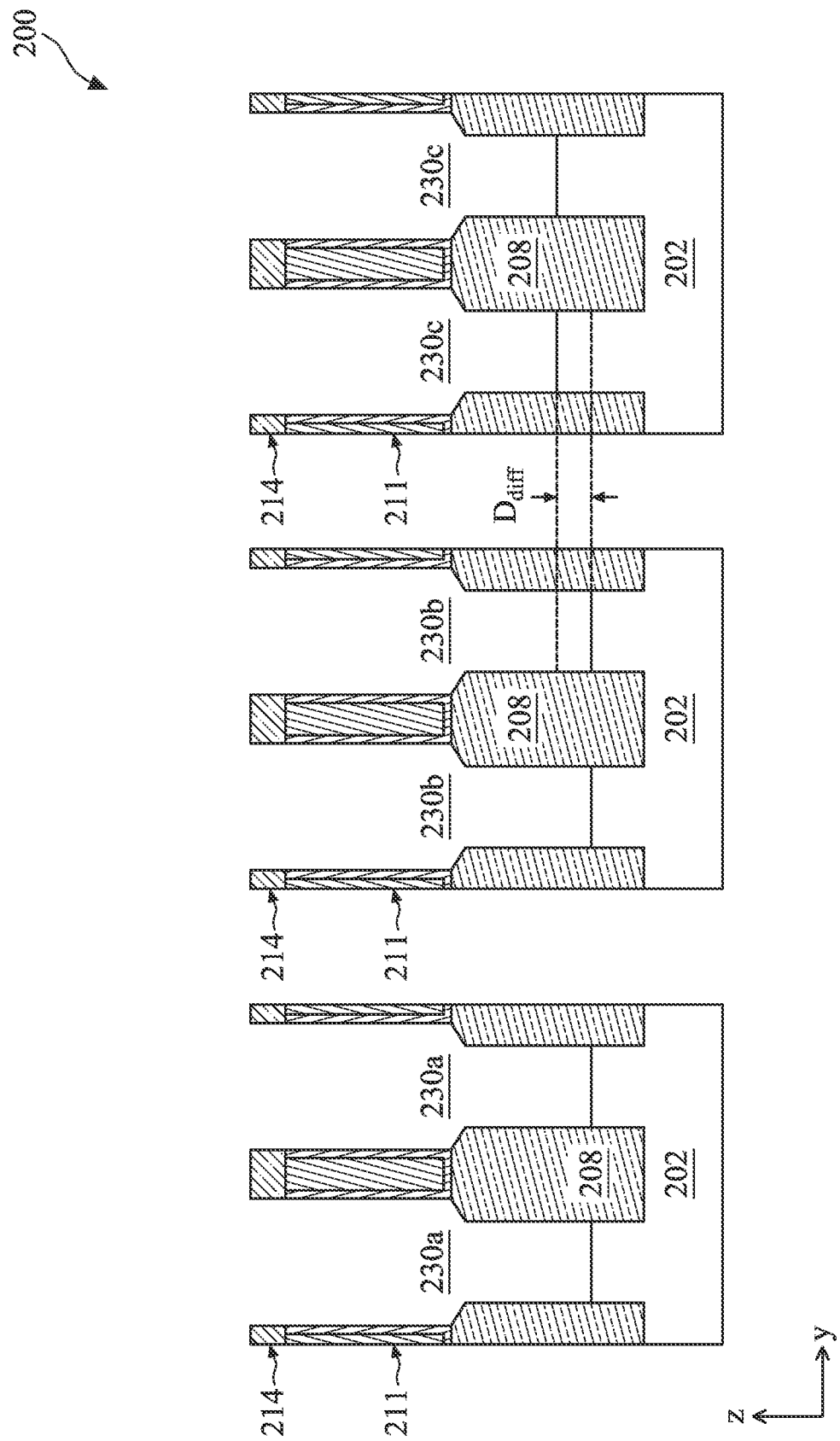

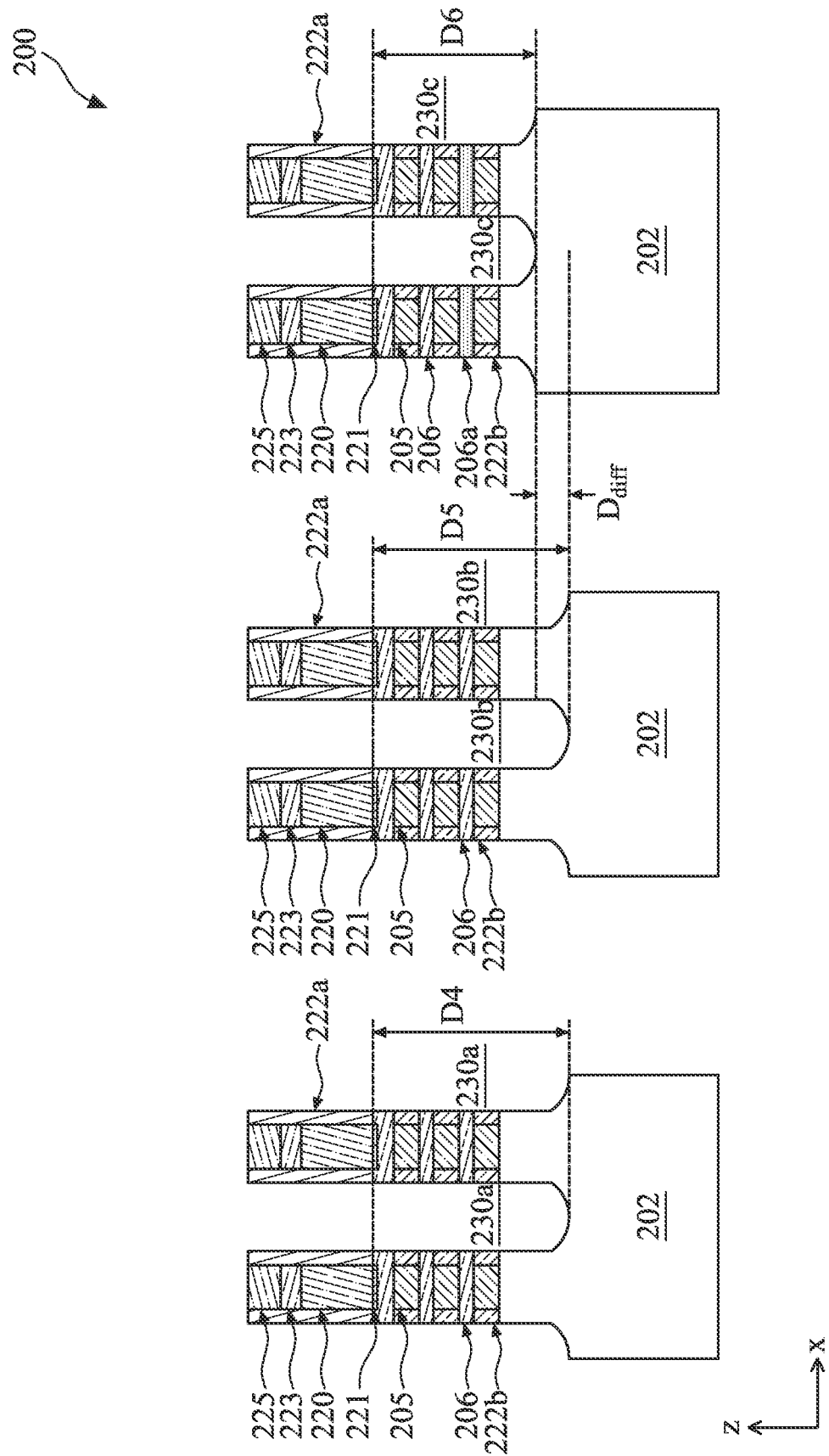

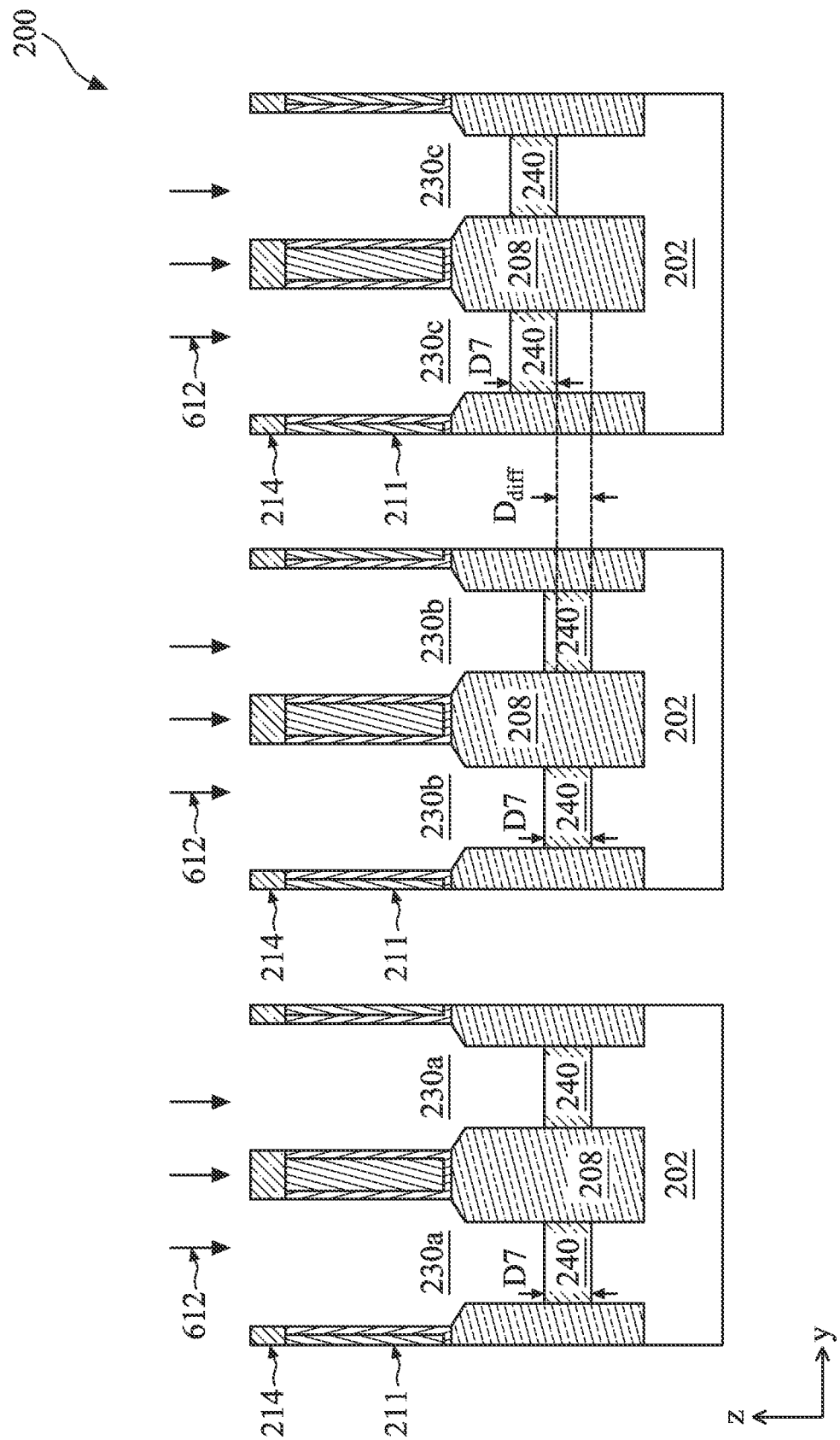

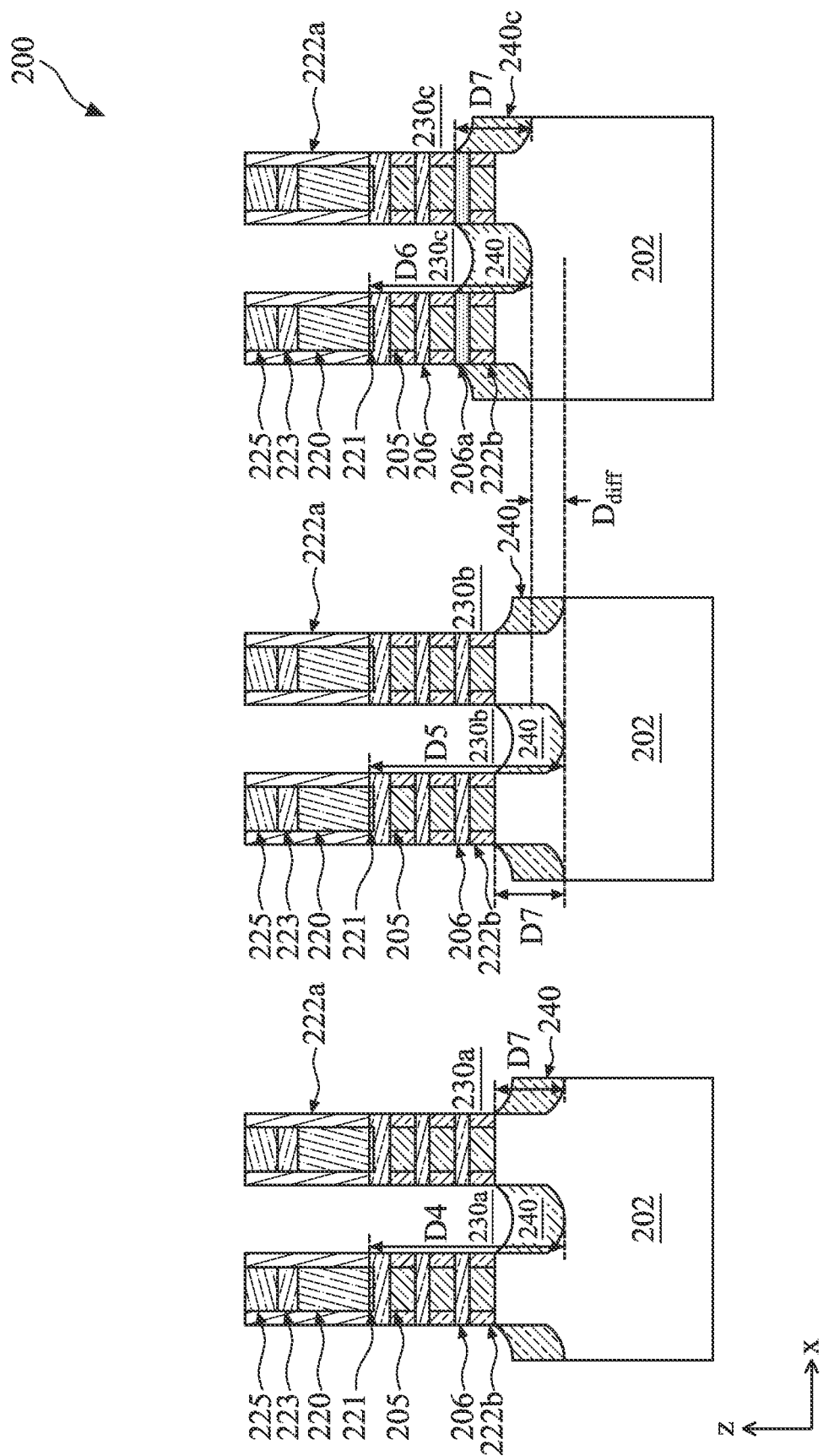

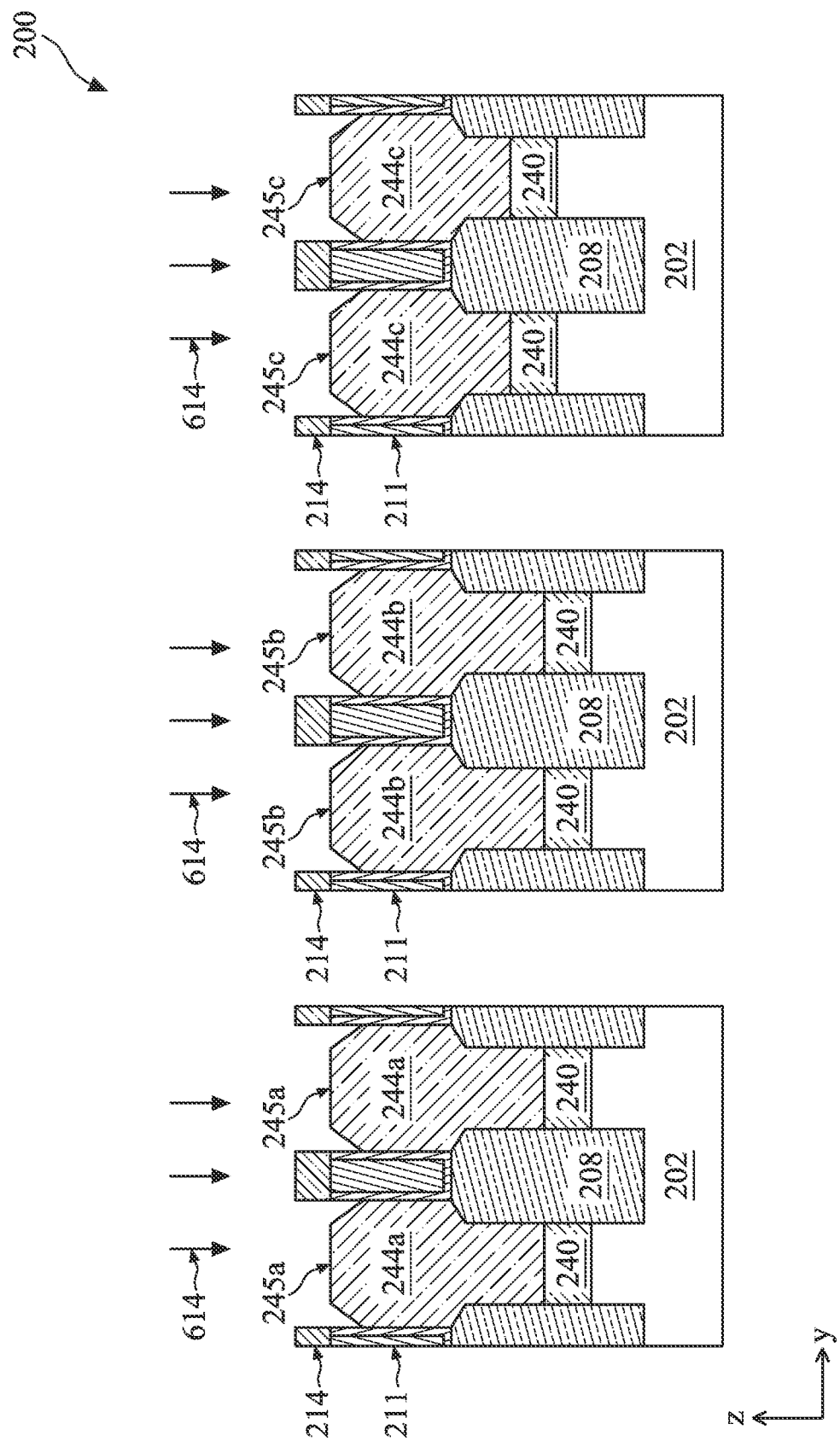

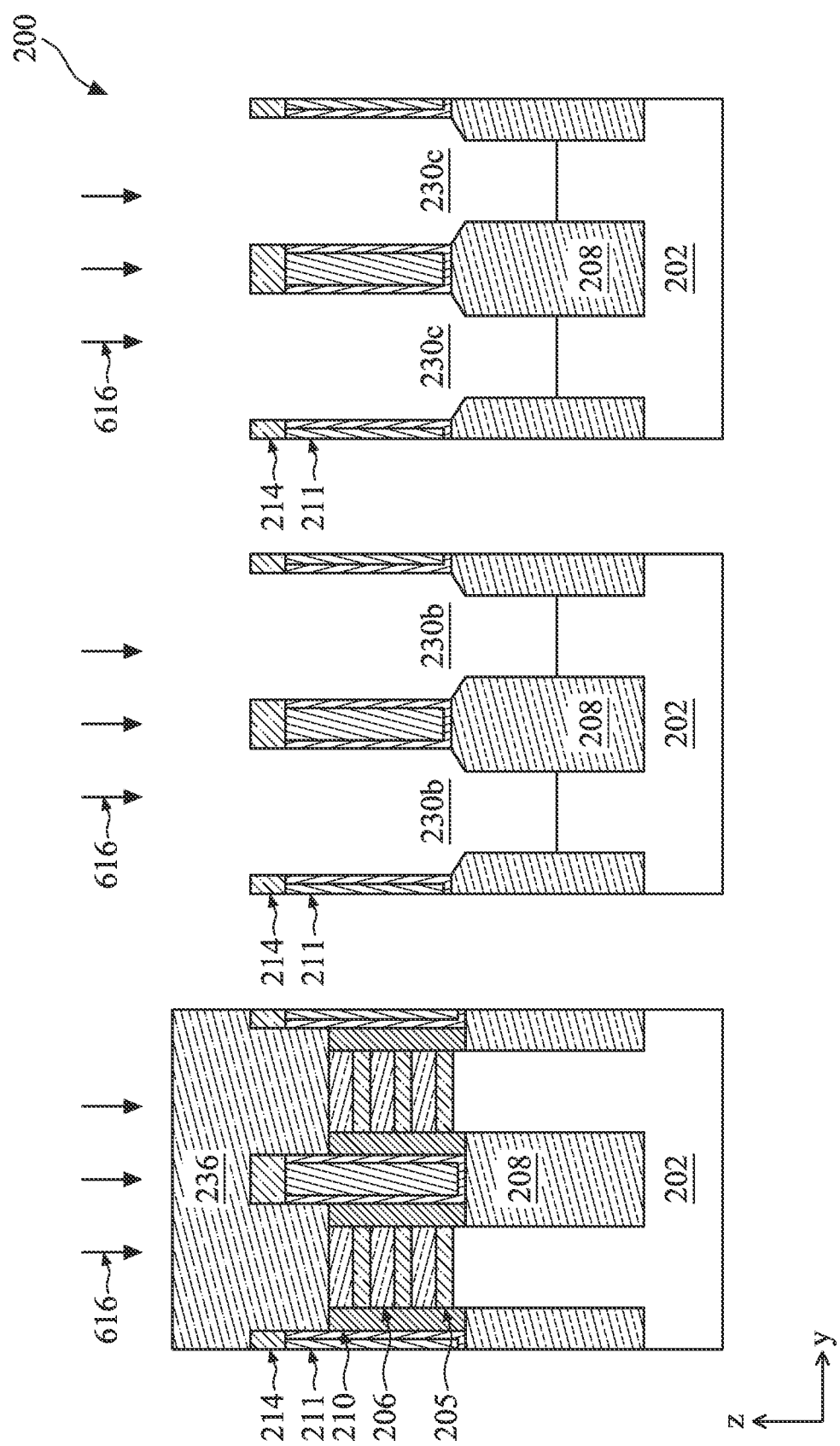

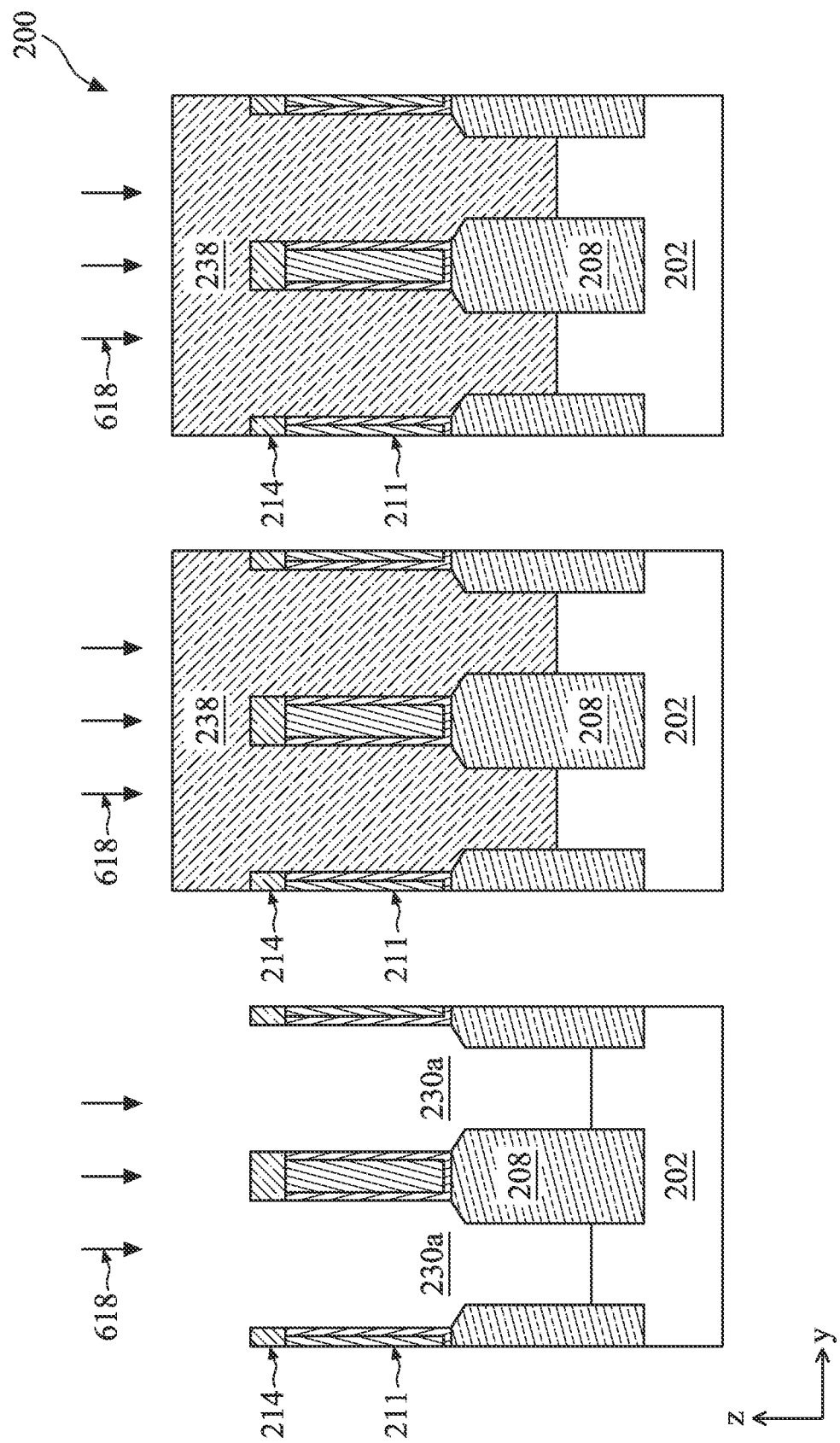

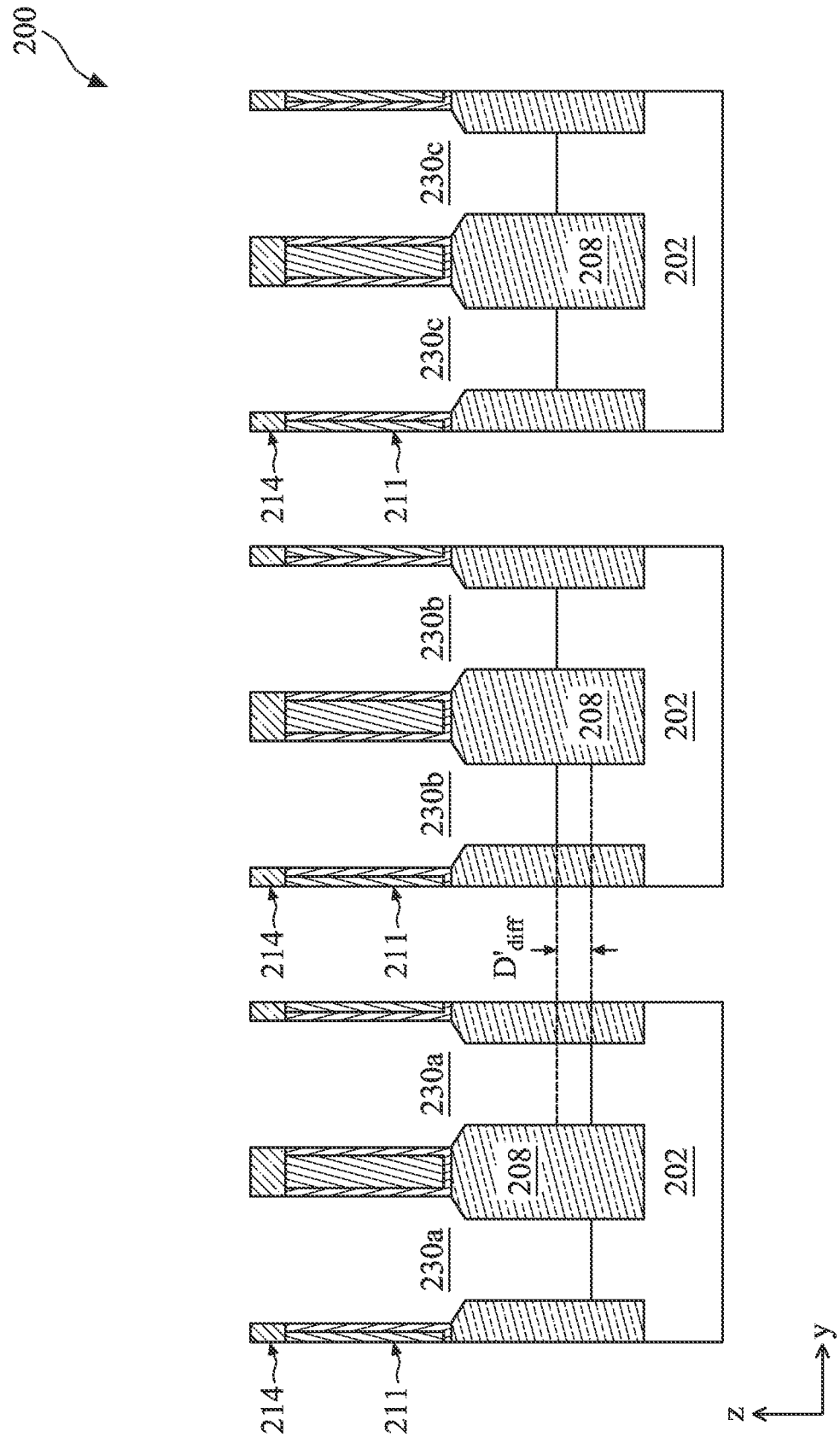

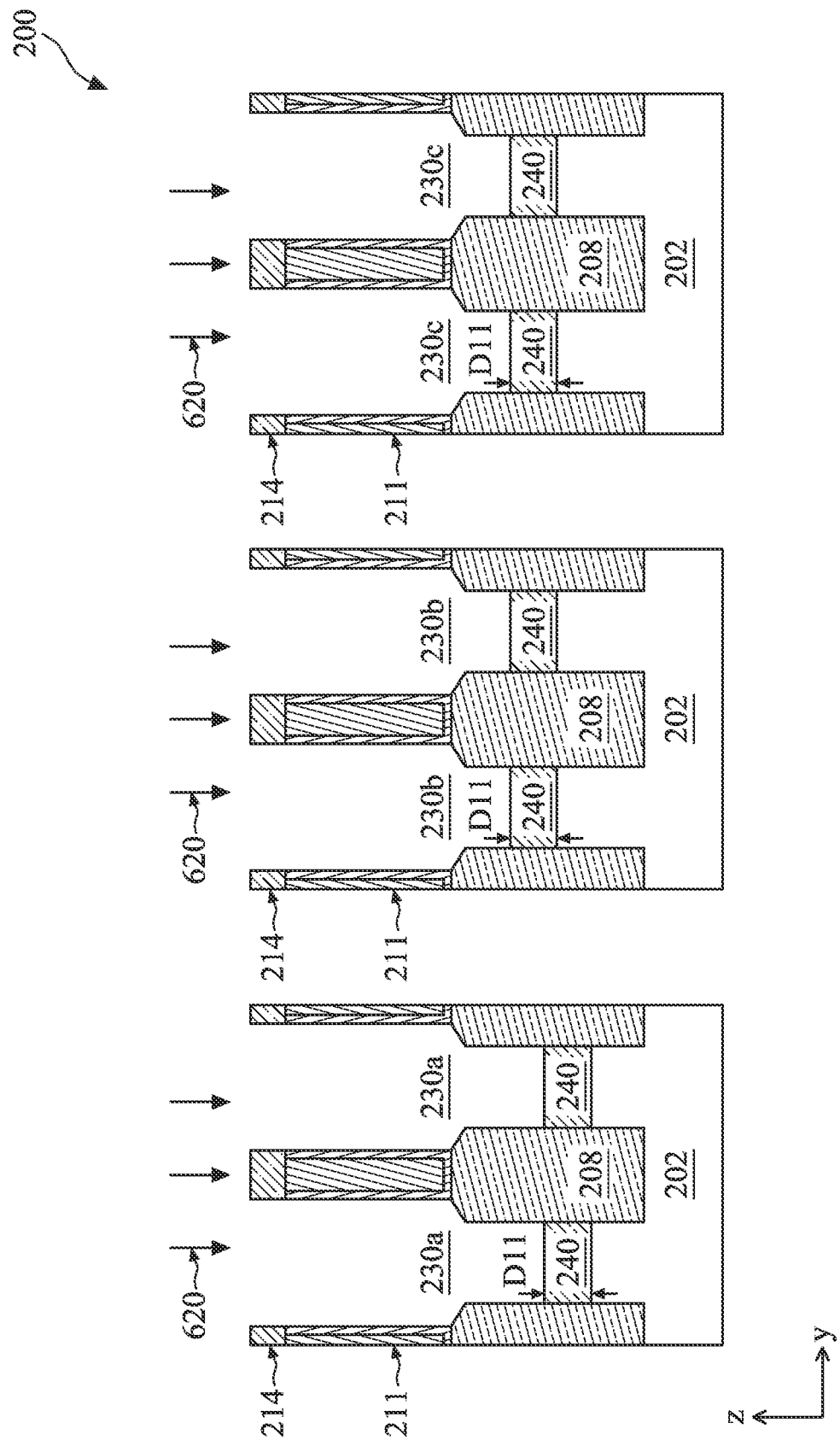

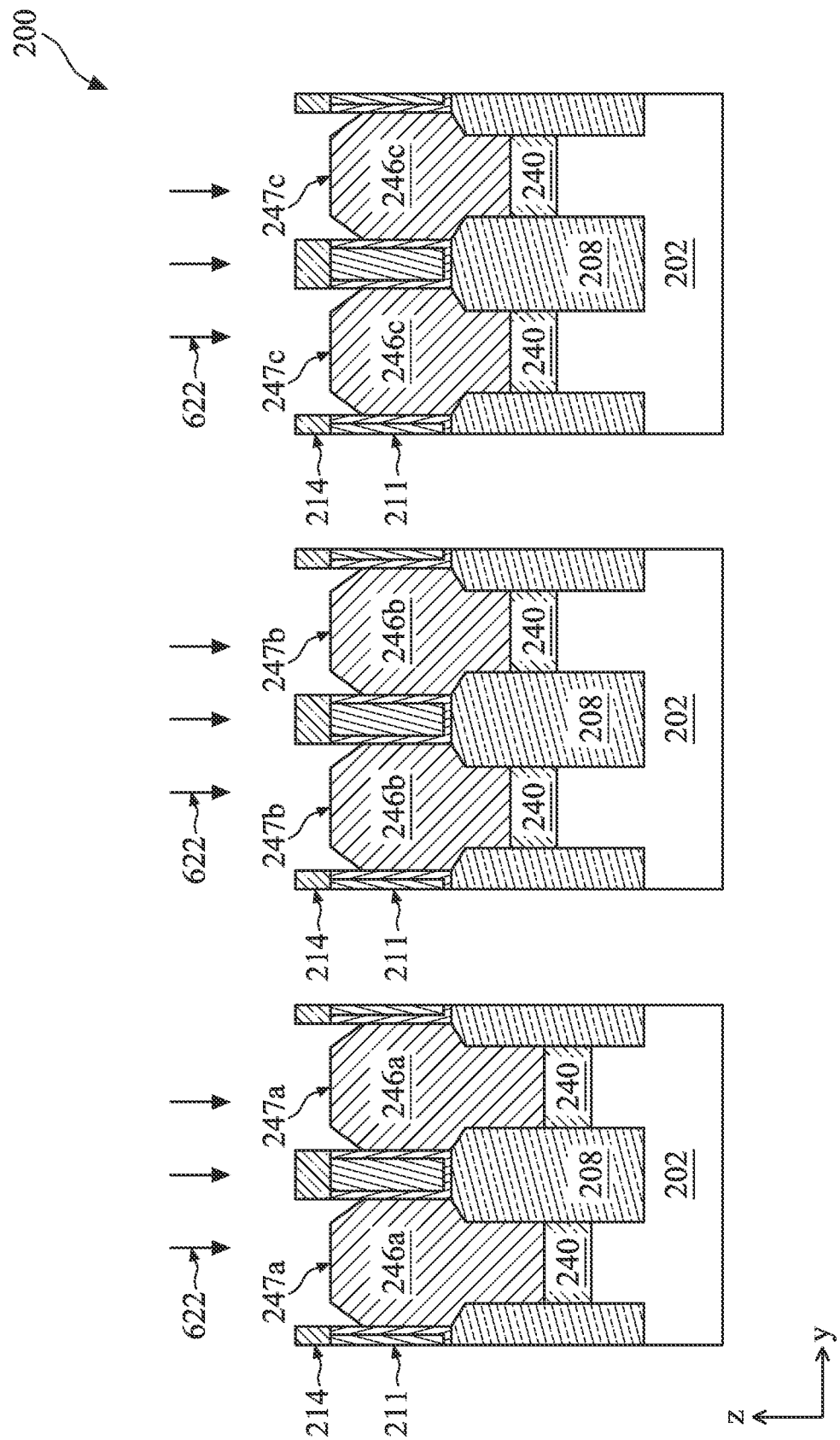

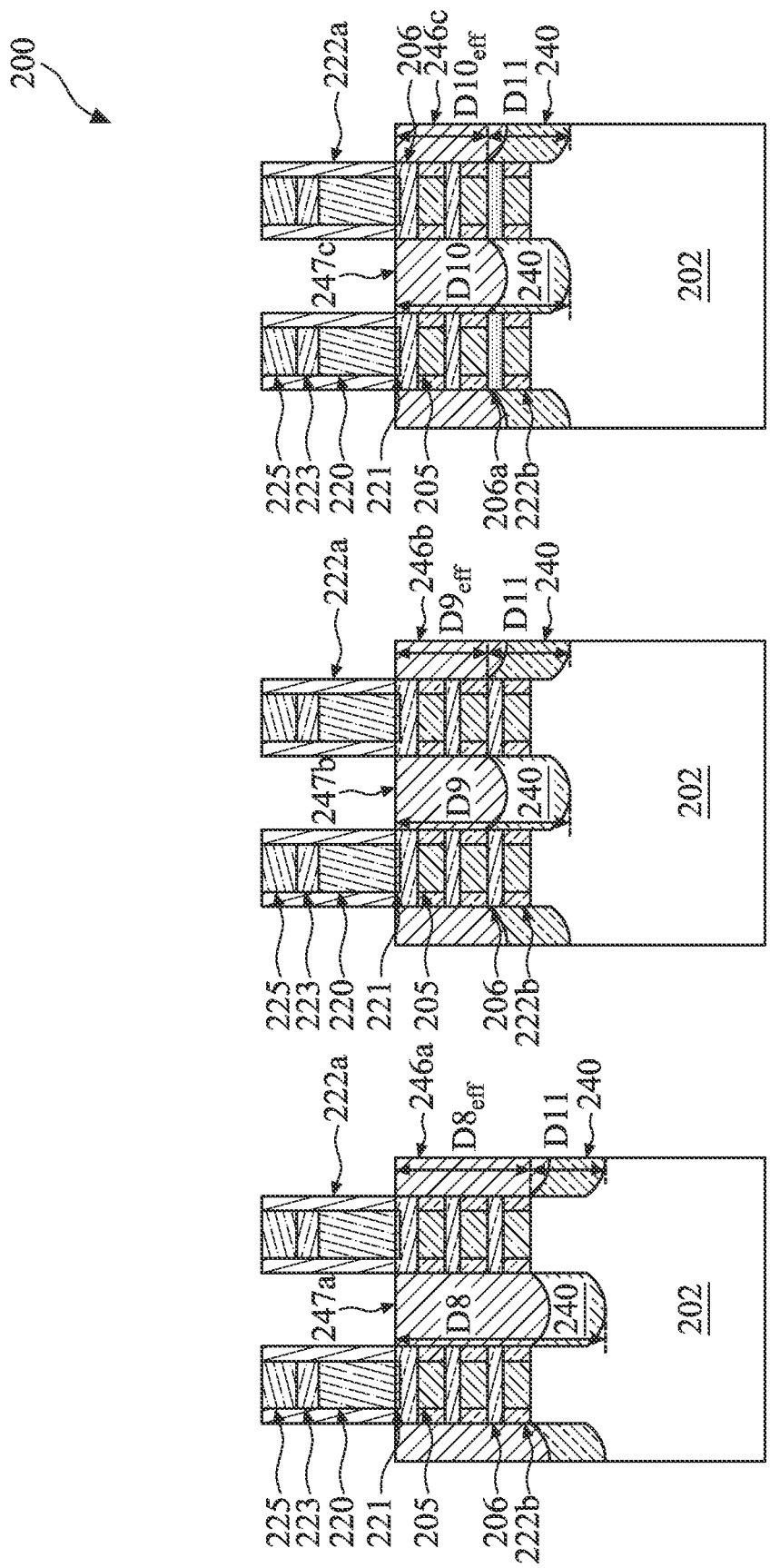

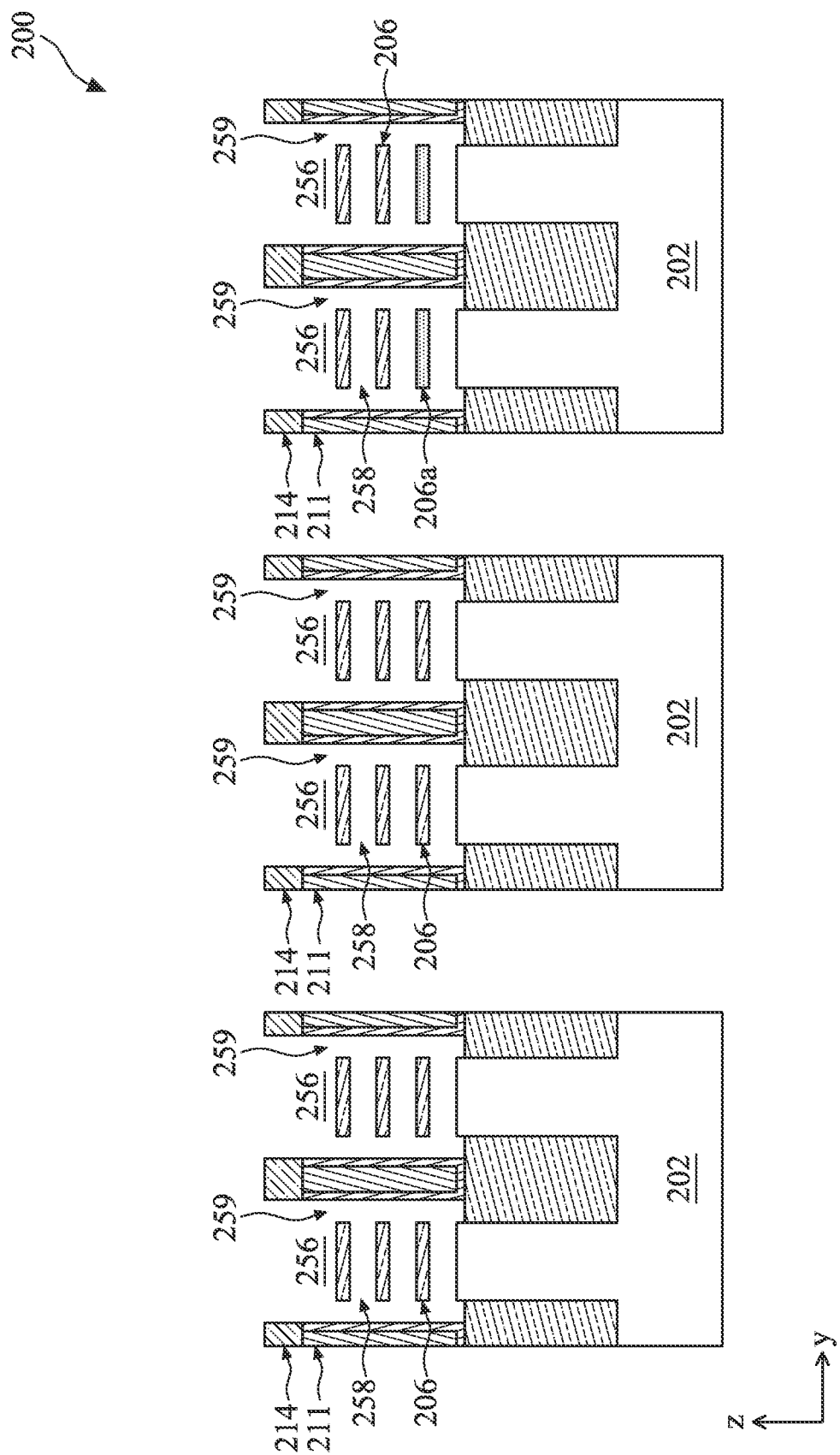

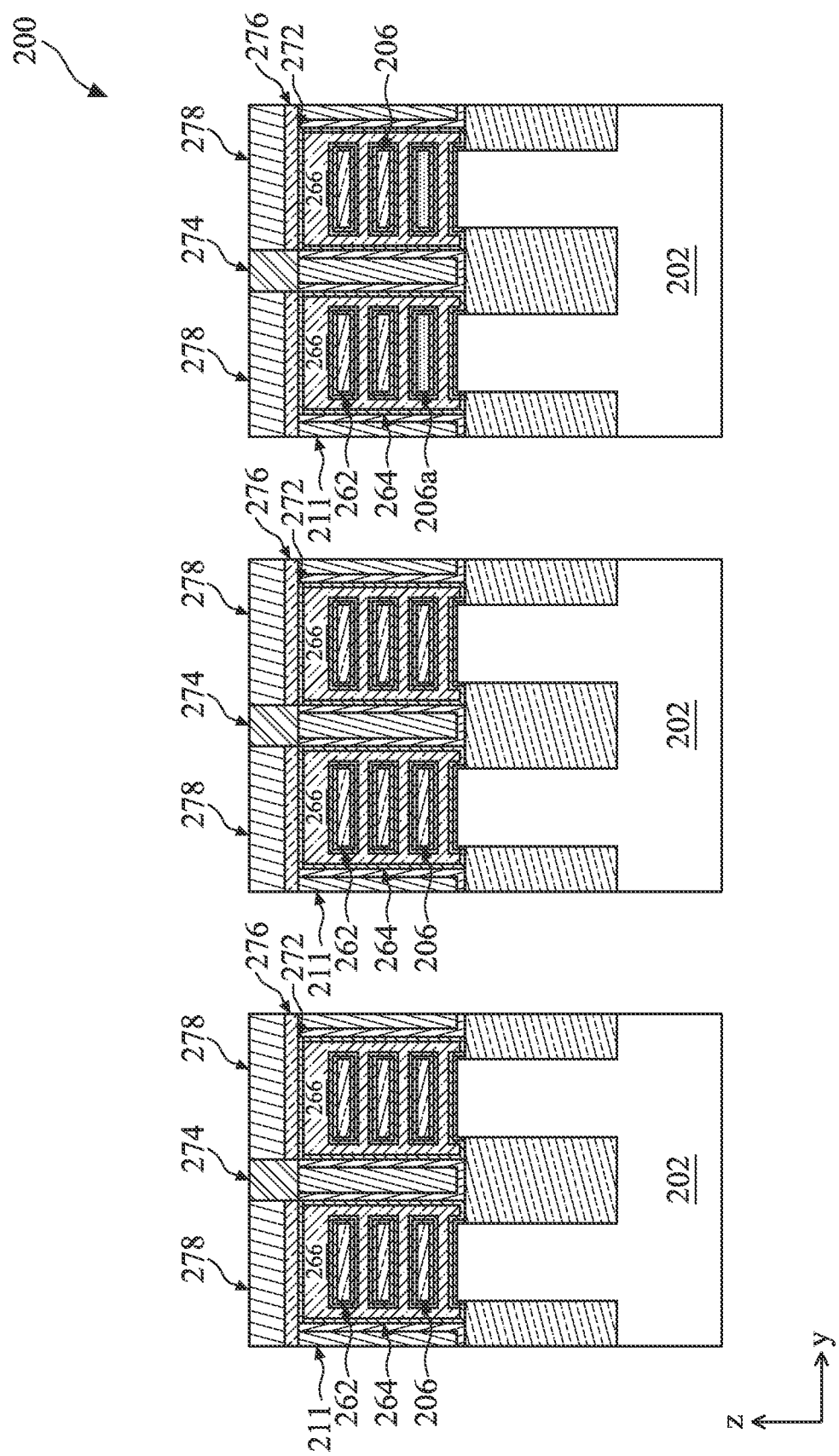

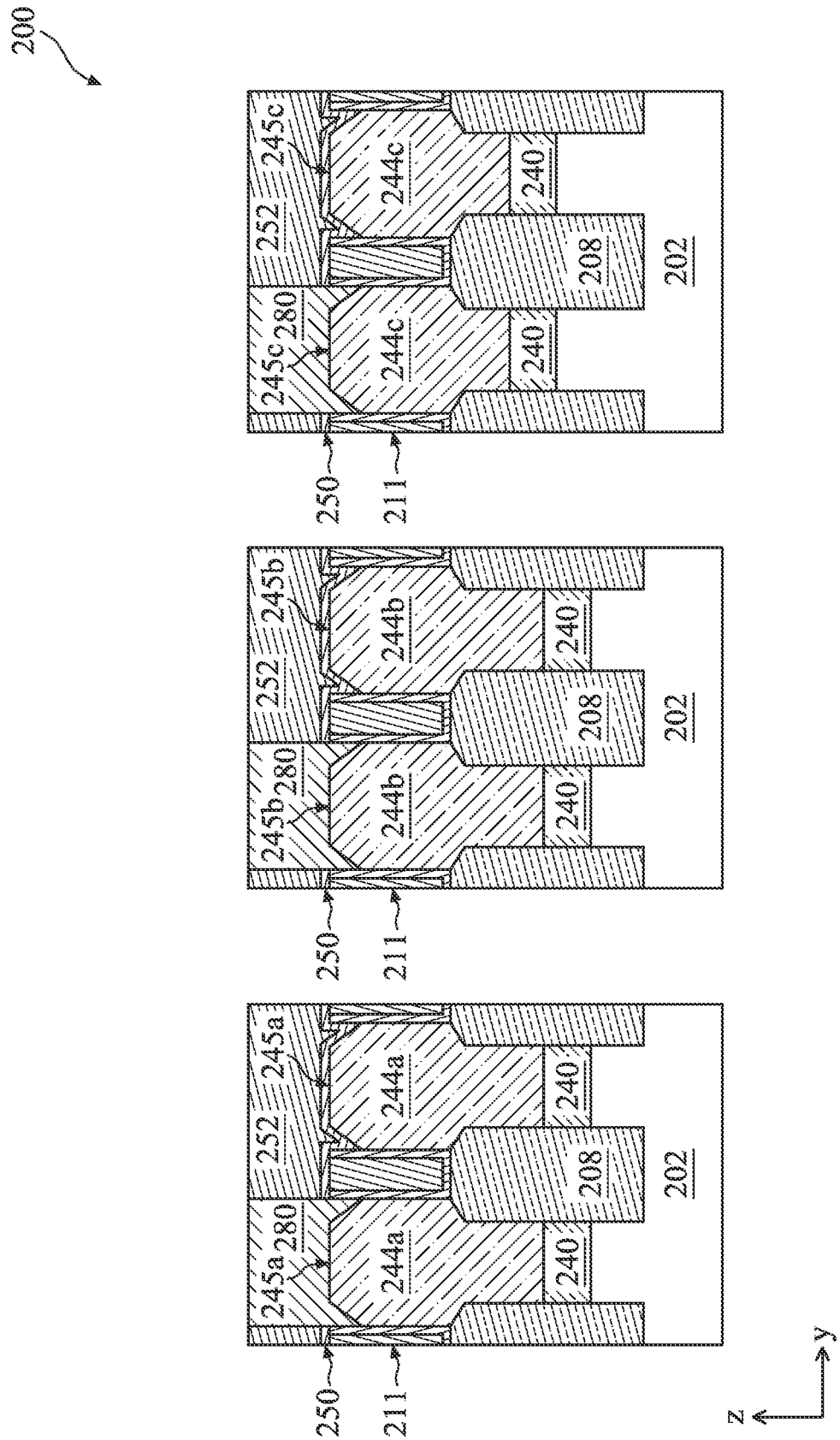

NANOSHEET DEVICES WITH HYBRID STRUCTURES AND METHODS OF FABRICATING THE SAME

CROSS-REFERENCE TO RELATED APPLICATIONS

This application claims priority to U.S. Provisional Application Ser. No. 63/146,149, filed Feb. 5, 2021 and titled "Nanosheet Devices with Hybrid Structures and Methods of Fabricating the Same," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, three-dimensional multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. A nanosheet field-effect transistor (NS FET; alternatively referred to as a gate-all-around, or GAA, FET) is an example of a multi-gate device. An NS FET generally includes a gate structure that can extend, partially or fully, around a channel region to provide access to the channel region on two or more sides. NS FETs with different configurations may be suitable for different circuit functions due to their different performance characteristics. While existing NS FETs and methods for forming NS FETs are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1C, 1D, and 1E each illustrate a flowchart of an example method for fabricating a portion of a semiconductor device according to various embodiments of the present disclosure.

FIGS. 3, 4, 5, and 6A are cross-sectional views of the semiconductor device taken along line LL' as shown in FIG. 2 during intermediate stages of the method shown in FIGS. 1A, 1B, 1C, 1D, and/or 1E according to various embodiments of the present disclosure.

FIGS. 7A, 8A, 9A, 10A, 11A, and 12A are cross-sectional views of the semiconductor device taken along line AA' as shown in FIG. 6B during intermediate stages of the method shown in FIGS. 1A, 1B, 1C, 1D, and/or 1E according to various embodiments of the present disclosure.

FIGS. 7B, 8B, 9B, 10B, 11B, and 12B are cross-sectional views of the semiconductor device taken along line BB' as shown in FIG. 6B during intermediate stages of the method shown in FIGS. 1A, 1B, 1C, 1D, and/or 1E according to various embodiments of the present disclosure.

FIGS. 7C, 8C, 9C, 10C, 11C, and 12C are cross-sectional views of the semiconductor device taken along line CC' as shown in FIG. 6B during intermediate stages of the method shown in FIGS. 1A, 1B, 1C, 1D, and/or 1E according to various embodiments of the present disclosure.

FIGS. 14A, 16A, 18A, 19A, 20A, 22A, 24A, 26A, 27A, 28A, 30A, 32A, 34A, 35A, 49A, 51A, and 53A are cross-sectional views of the semiconductor device taken along line AA' as shown in FIG. 13A during intermediate stages of the method shown in FIGS. 1A, 1B, 1C, 1D, and/or 1E according to various embodiments of the present disclosure.

FIGS. 14B, 16B, 18B, 19B, 20B, 22B, 24B, 26B, 27B, 28B, 30B, 32B, 34B, 35B, 49B, 51B, and 53B are cross-sectional views of the semiconductor device taken along line BB' as shown in FIG. 13A during intermediate stages of the method shown in FIGS. 1A, 1B, 1C, 1D, and/or 1E according to various embodiments of the present disclosure.

FIGS. 14C, 16C, 18C, 19C, 20C, 22C, 24C, 26C, 27C, 28C, 30C, 32C, 34C, 35C, 49C, 51C, and 53C are cross-sectional views of the semiconductor device taken along line CC' as shown in FIG. 13A during intermediate stages of the method shown in FIGS. 1A, 1B, 1C, 1D, and/or 1E according to various embodiments of the present disclosure.

FIGS. 13B, 37A, 39A, 41A, 43A, 45A, 46A, and 47A are cross-sectional views of the semiconductor device taken along line DD' as shown in FIG. 13A during intermediate stages of the method shown in FIGS. 1A, 1B, 1C, 1D, and/or 1E according to various embodiments of the present disclosure.

FIGS. 13C, 37B, 39B, 41B, 43B, 45B, 46B, and 47B are cross-sectional views of the semiconductor device taken along line EE' as shown in FIG. 13A during intermediate stages of the method shown in FIGS. 1A, 1B, 1C, 1D, and/or 1E according to various embodiments of the present disclosure.

FIGS. 13D, 37C, 39C, 41C, 43C, 45C, 46C, and 47C are cross-sectional views of the semiconductor device taken along line FF' as shown in FIG. 13A during intermediate stages of the method shown in FIGS. 1A, 1B, 1C, 1D, and/or 1E according to various embodiments of the present disclosure.

FIGS. 15A, 17A, 21A, 23A, 25A, 29A, 31A, 33A, 36A, 38A, 40A, 42A, 44A, 48A, 50A, 52A, and 54A are cross-sectional views of the semiconductor device taken along line GG' as shown in FIG. 13A during intermediate stages of the method shown in FIGS. 1A, 1B, 1C, 1D, and/or 1E according to various embodiments of the present disclosure.

FIGS. 15B, 17B, 21B, 23B, 25B, 29B, 31B, 33B, 36B, 38B, 40B, 42B, 44B, 48B, 50B, 52B, and 54B are cross-sectional views of the semiconductor device taken along line HH' as shown in FIG. 13A during intermediate stages of the method shown in FIGS. 1A, 1B, 1C, 1D, and/or 1E according to various embodiments of the present disclosure.

FIGS. 15C, 17C, 21C, 23C, 25C, 29C, 31C, 33C, 36C, 38C, 40C, 42C, 44C, 48C, 50C, 52C, and 54C are cross-sectional views of the semiconductor device taken along line II' as shown in FIG. 13A during intermediate stages of the method shown in FIGS. 1A, 1B, 1C, 1D, and/or 1E according to various embodiments of the present disclosure.

DETAILED DESCRIPTION

Figure 1A:
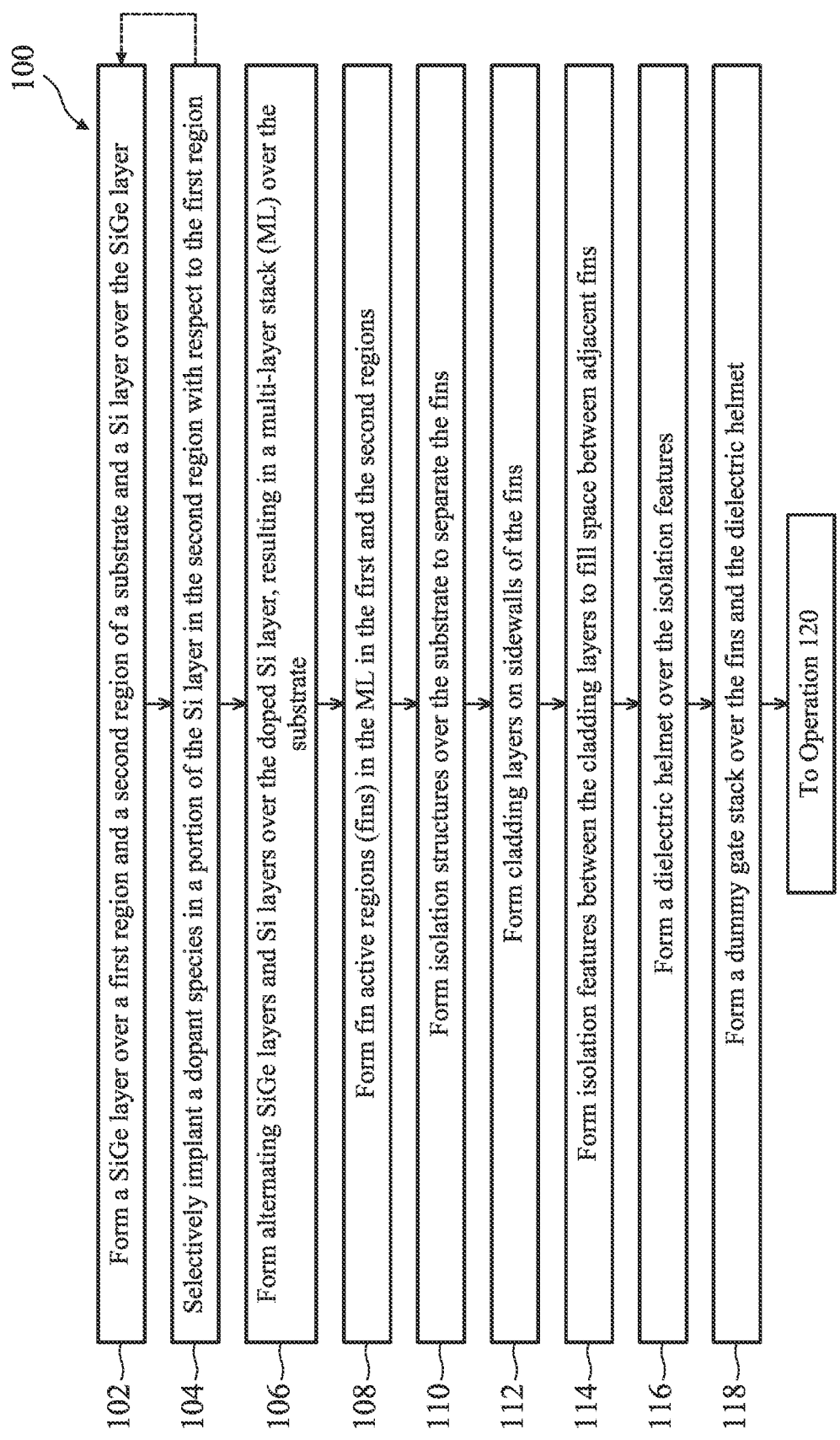
FIGS. 1A and 1B illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as three-dimensional, multi-gate nanostructure (NS) FETs (alternatively referred to as gate-all-around, or GAA, FETs), in memory and/or standard logic cells of an integrated circuit (IC) structure. Generally, NS FETs are configured with a plurality of vertically stacked sheets (e.g., nanosheets), wires (e.g., nanowires), or rods (e.g., nanorods) as channel regions engaged with a metal gate stack, thereby allowing better gate control, lowered leakage current, and improved scaling capability for various IC applications. The present disclosure includes multiple embodiments. Different embodiments may have different advantages, and no particular advantage is necessarily required of any embodiment.

Figure 1B:
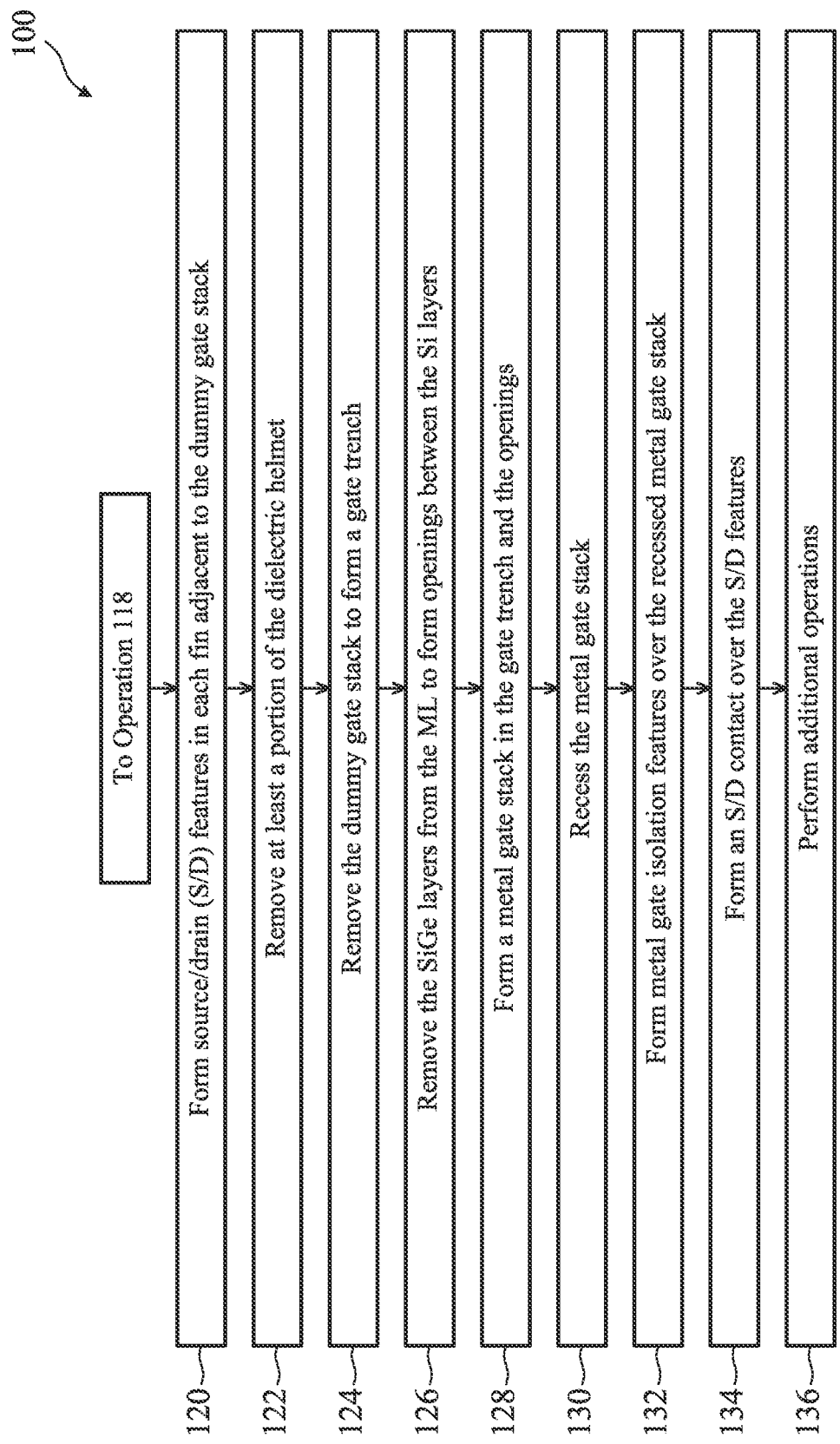
Figure 1E:
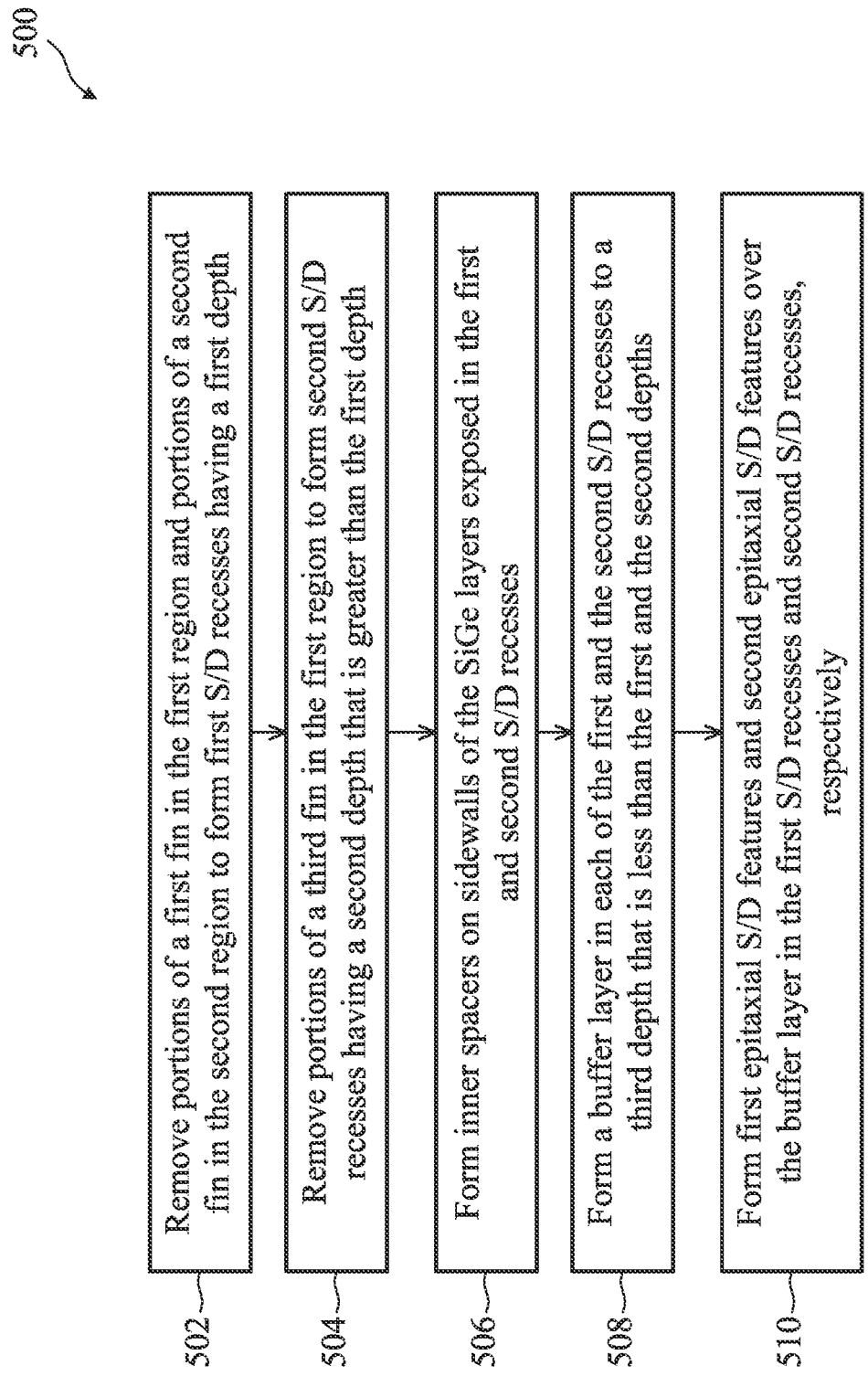
Figure 2:
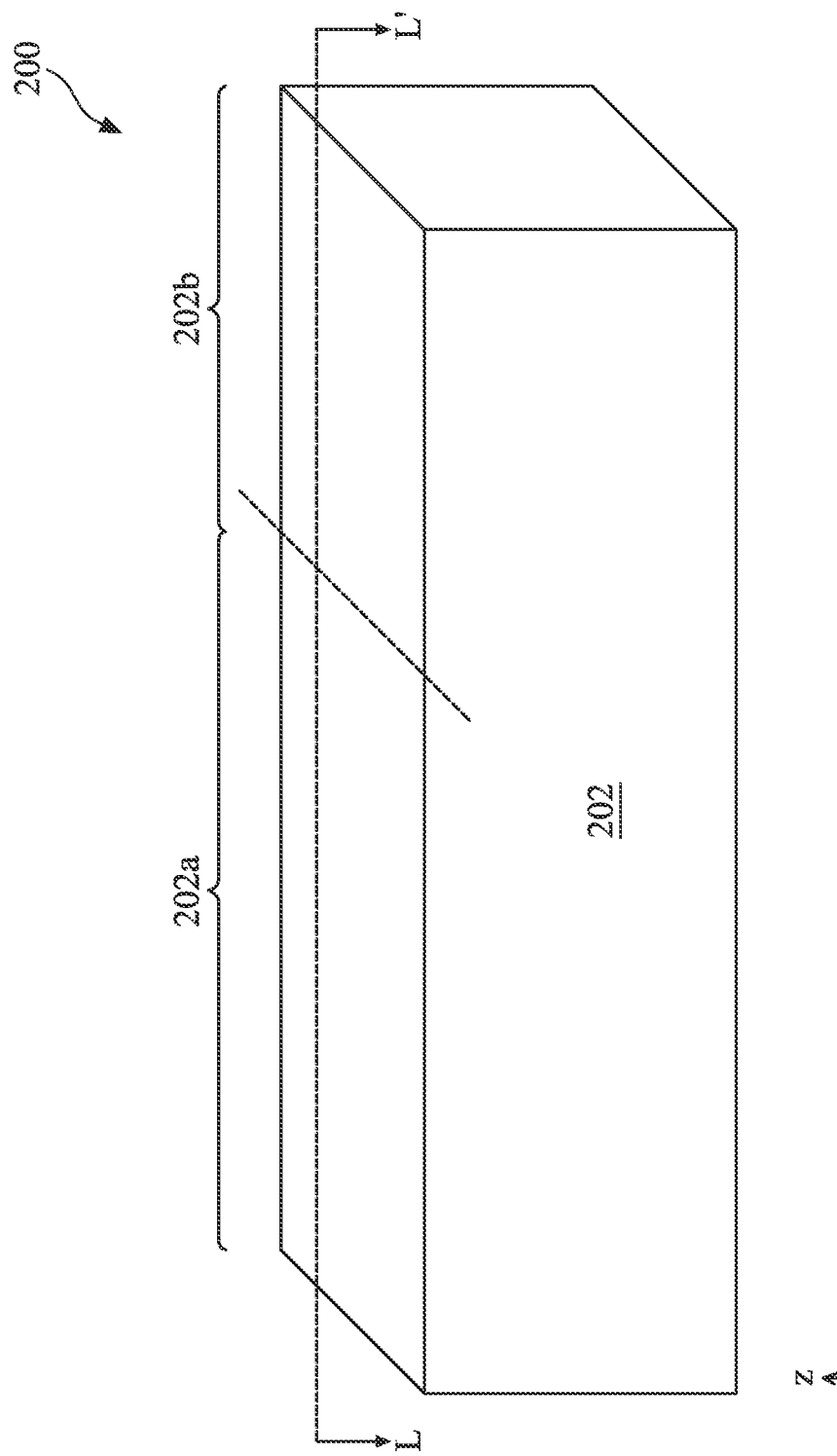
FIG. 2 is a three-dimensional perspective view of a portion of an example semiconductor device according to various embodiments of the present disclosure.
Figure 13A:
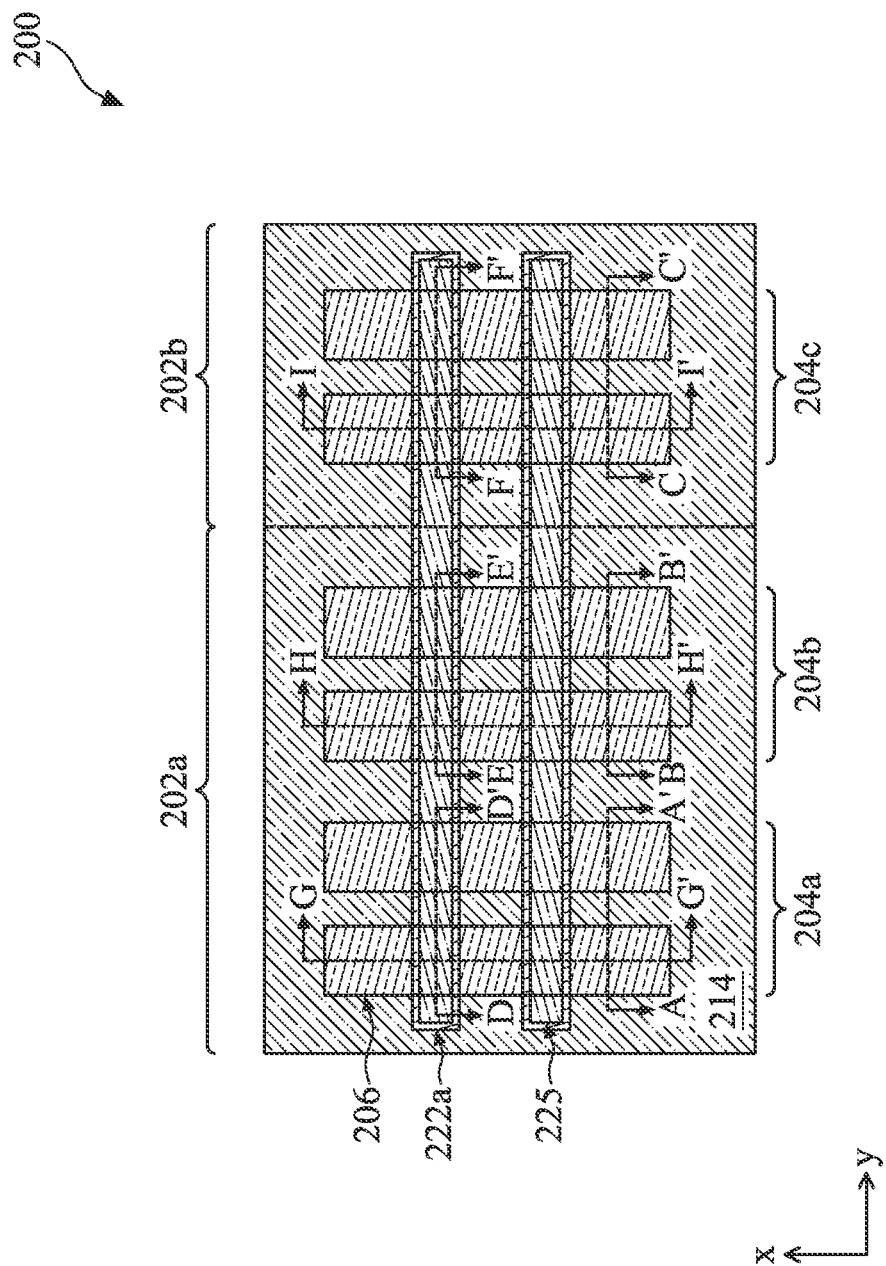
Figures 13B, 13C, 13D:
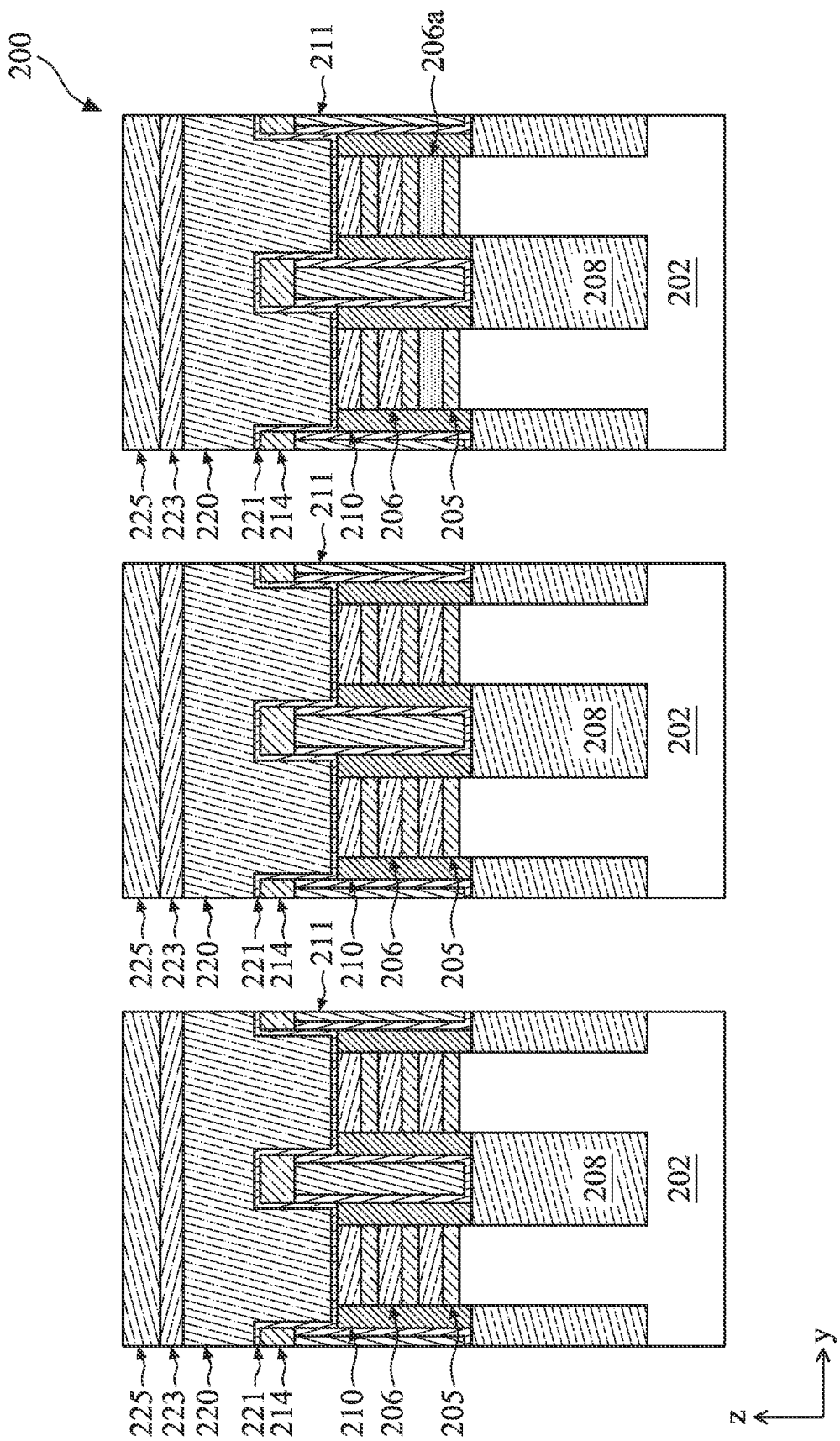
Figures 54A, 54B, 54C:
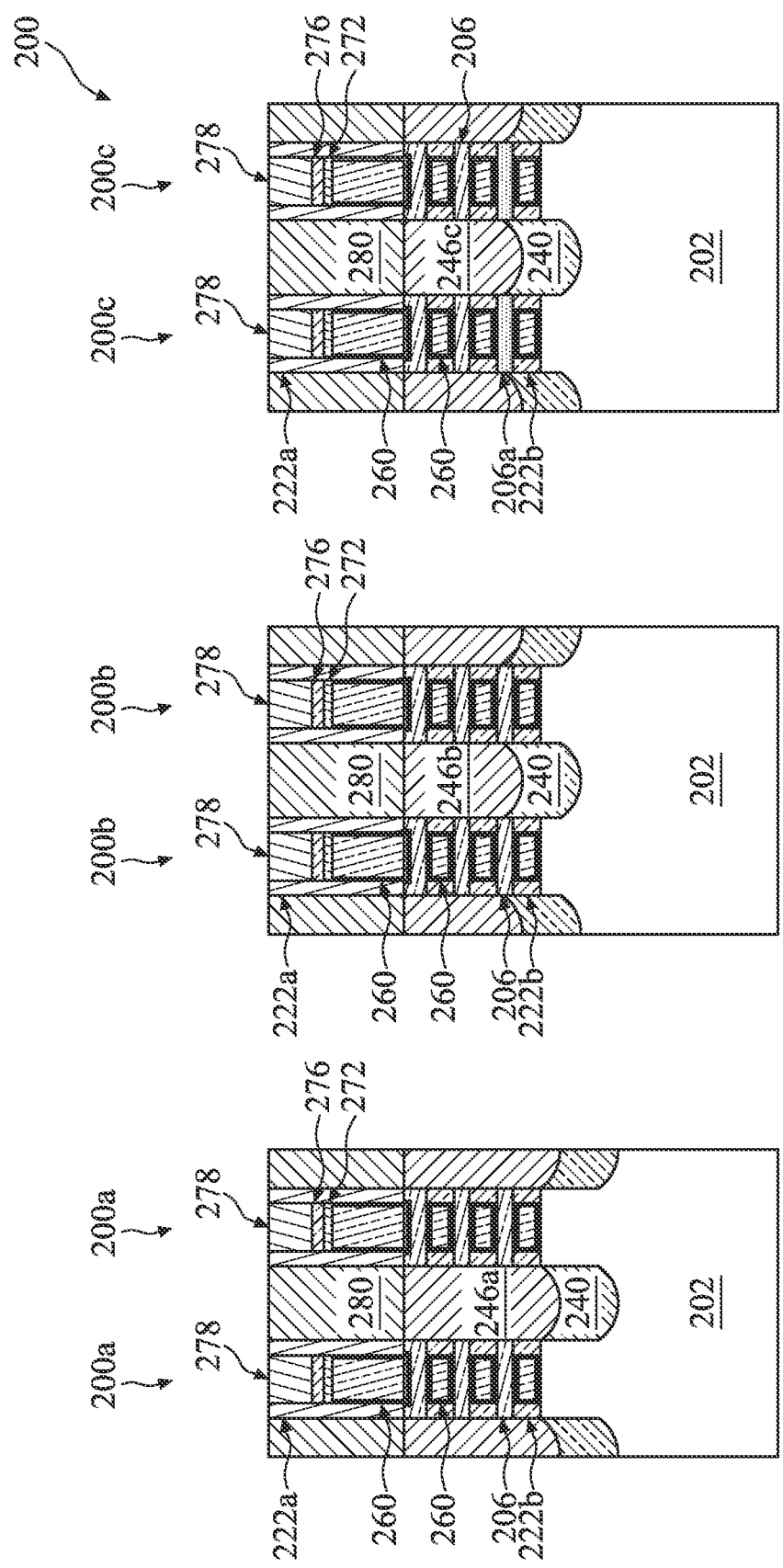

Referring now to FIGS. 1A and 1B collectively, a flowchart of a method 100 of forming a semiconductor structure 200 (hereafter simply referred to as the structure 200) is illustrated according to various aspects of the present disclosure. FIGS. 1C-1E illustrate a flowchart of a method 300, a method 400, and a method 500, respectively, of forming a portion of the structure 200 according to various aspects of the present disclosure. Methods 100, 300, 400, and 500 are merely examples and are not intended to limit the present disclosure beyond what is explicitly recited in the claims. Additional operations can be provided before, during, and after methods 100, 300, 400, and 500, and some operations described can be replaced, eliminated, or moved around for additional embodiments of the method. Methods 100, 300, 400, and 500 are described below in conjunction with FIGS. 2-54C, which are various cross-sectional and top planar views of the structure 200 at intermediate steps of method 100. For examples, FIG. 2 is a three-dimensional perspective view of a portion of the structure 200; FIGS. 3, 4, 5, and 6A are cross-sectional views of the structure 200 taken along line LL' as shown in FIG. 2; and FIGS. 6B and 13A are planar top views of the structure 200. Furthermore, FIGS. 7A, 8A, 9A, 10A, 11A, and 12A are cross-sectional views of the structure 200 taken along line AA' as shown in FIG. 6B; FIGS. 7B, 8B, 9B, 10B, 11B, and 12B are cross-sectional views of the structure 200 taken along line BB' as shown in FIG. 6B; FIGS. 7C, 8C, 9C, 10C, 11C, and 12C are cross-sectional views of the structure 200 taken along line CC' as shown in FIG. 6B; FIGS. 14A, 16A, 18A, 19A, 20A, 22A, 24A, 26A, 27A, 28A, 30A, 32A, 34A, 35A, 49A, 51A, and 53A are cross-sectional views of the structure 200 taken along line AA' as shown in FIG. 13A; FIGS. 14B, 16B, 18B, 19B, 20B, 22B, 24B, 26B, 27B, 28B, 30B, 32B, 34B, 35B, 49B, 51B, and 53B are cross-sectional views of the structure 200 taken along line BB' as shown in FIG. 13A; FIGS. 14C, 16C, 18C, 19C, 20C, 22C, 24C, 26C, 27C, 28C, 30C, 32C, 34C, 35C, 49C, 51C, and 53C are cross-sectional views of the structure 200 taken along line CC' as shown in FIG. 13A; FIGS. 13B, 37A, 39A, 41A, 43A, 45A, 46A, and 47A are cross-sectional views of the structure 200 taken along line DD' as shown in FIG. 13A; FIGS. 13C, 37B, 39B, 41B, 43B, 45B, 46B, and 47B are cross-sectional views of the structure 200 taken along line EE' as shown in FIG. 13A; FIGS. 13D, 37C, 39C, 41C, 43C, 45C, 46C, and 47C are cross-sectional views of the structure 200 taken along line FF' as shown in FIG. 13A; FIGS. 15A, 17A, 21A, 23A, 25A, 29A, 31A, 33A, 36A, 38A, 40A, 42A, 44A, 48A, 50A, 52A, and 54A are cross-sectional views of the structure 200 taken along line GG' as shown in FIG. 13A; FIGS. 15B, 17B, 21B, 23B, 25B, 29B, 31B, 33B, 36B, 38B, 40B, 42B, 44B, 48B, 50B, 52B, and 54B are cross-sectional views of the structure 200 taken along line HH' as shown in FIG. 13A; and FIGS. 15C, 17C, 21C, 23C, 25C, 29C, 31C, 33C, 36C, 38C, 40C, 42C, 44C, 48C, 50C, 52C, and 54C are cross-sectional views of the structure 200 taken along line II' as shown in FIG. 13A.

The structure 200 may be an intermediate device fabricated during processing of an IC, or a portion thereof, that may comprise static random-access memory (SRAM) and/or other logic circuits, passive components such as resistors, capacitors, and inductors, and active components such as NS FETs, FinFETs, metal-oxide semiconductor field effect transistors (MOSFETs), complementary metal-oxide semiconductor (CMOS) transistors, bipolar transistors, high voltage transistors, high frequency transistors, and/or other transistors. In the present embodiments, the structure 200 includes one or more NS FETs. The present disclosure is not limited to any particular number of devices or device regions, or to any particular device configurations. Additional features can be added to the structure 200, and some of the features described below can be replaced, modified, or eliminated in other embodiments of the structure 200.

At operation 102, referring to FIGS. 2-3, method 100 provides a substrate 202 and forms a non-channel layer 205 and a channel layer 206 over the substrate 202. In the present embodiments, the non-channel layer 205 and the channel layer 206 constitute a bottom portion of a multi-layer structure (ML) from which fin active regions (or fins) are formed. As depicted herein, method 100 at operation 102 forms the bottommost pair of non-channel layer 205 and channel layer 206.

The substrate 202 may include an elemental (single element) semiconductor, such as silicon (Si), germanium (Ge), and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In the present embodiments, the substrate 202 (and the subsequently formed ML thereover) includes two regions, 202a and 202b. Although depicted to be adjacent to each other, the regions 202a and 202b are not necessarily physically arranged so and may be separated by other region(s).

In the present embodiments, the non-channel layers 205 of the ML are sacrificial layers configured to be removed at a subsequent processing step, thereby providing openings between the channel layers 206 for forming portions of a metal gate stack therein. Each channel layer 206 may include a semiconductor material such as, for example, Si, Ge, SiC, SiGe, GeSn, SiGeSn, SiGeCSn, other suitable semiconductor materials, or combinations thereof, while each non-channel layer 205 has a composition different from that of the channel layer 206. In one such example, as in the present embodiments, the channel layer 206 may include elemental Si and the non-channel layer 205 may include SiGe. In another example, the channel layer 206 may include elemental Si and the non-channel layer 205 may include elemental Ge. In the present embodiments, the channel layers 206 are free, or substantially free, of any dopant species, and are therefore alternatively referred to as active channel layers.

In the present embodiments, forming the non-channel layers 205 and the channel layers 206 includes performing a series of epitaxy processes. The epitaxy processes may be implemented by chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors containing a suitable material (e.g., Ge for the non-channel layers 205), which interacts with the composition of the underlying substrate, e.g., the substrate 202. In some examples, the non-channel layer 205 and the channel layer 206 may be formed into nanosheets, nanowires, or nanorods.

Figure 5:
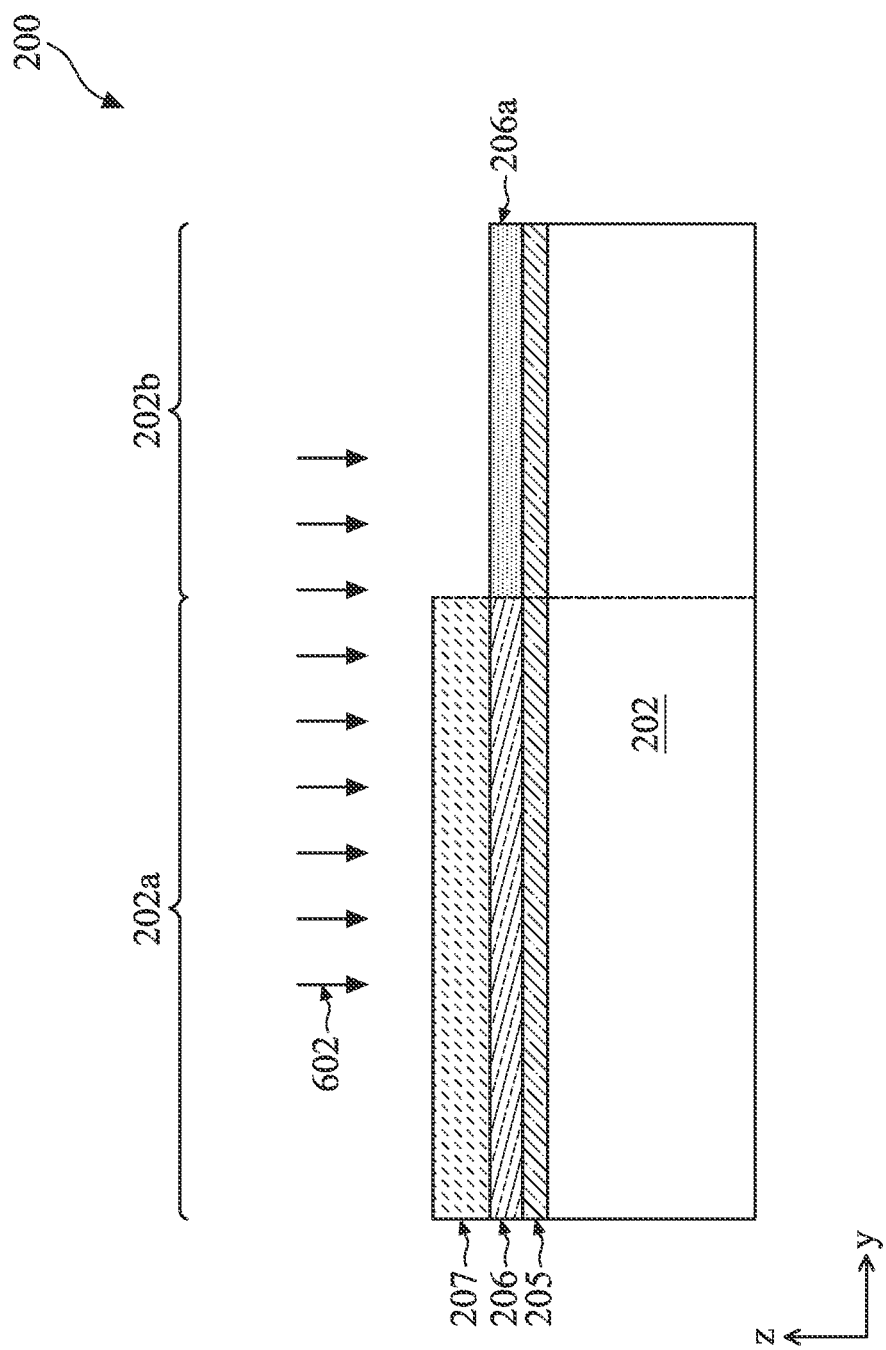

At operation 104, referring to FIGS. 4-5, method 100 selectively performs an implantation process (e.g., an ion implantation process) 602 to the region 202b with respect to the region 202a. Referring to FIG. 4, method 100 first forms a patterned masking element 207 over the region 202a to expose the region 202b. The patterned masking element 207 possesses etching selectivity with respect to the channel layer 206 and may be formed by a series of photolithography and etching processes. The patterned masking element 207 may be a tri-layer structure that includes a photoresist layer, a middle layer (containing a metal, a polymer, and/or other suitable materials), a bottom anti-reflective (BARC) layer. Forming the patterned masking element 207 may include exposing the photoresist layer, developing the photoresist layer, and etching the remainder of the masking element using the patterned photoresist layer as an etch mask.

Subsequently, referring to FIG. 5, method 100 performs the implantation process 602 to the region 202b exposed by the patterned masking element 207. The implantation process 602 is configured to form an anti-punch-through (APT) layer (alternatively referred to as a dummy channel layer) 206a over the non-channel layer 205 in the region 202b. In other words, the implantation process 602 injects a dopant species into the portion of the channel layer 206 in the region 202b, while portions of the channel layer 206 in the region 202a remain un-doped or substantially un-doped.

In some embodiments, the implantation process 602 is implemented with a beam energy of about 2 keV to about 100 keV, an ion dosage of about $1\times10^{13}$ ion/cm$^2$ to about $1\times10^{15}$ ions/cm$^2$, and at a temperature of about 600° C. to about 1100° C. Of course, the present embodiments are not limited to these implantation conditions. A thickness of the APT layer 206a is defined by a depth of the region having a minimum activation concentration of $1\times10^{18}$ ions/cm$^3$ or more. In some instances, the thickness of the APT layer 206a may be about 10 nm to about 30 nm and may be detectable using a technique such as energy-dispersive X-ray spectroscopy (EDS, EDX, EDXS or XEDS). Depending on the conductivity type of the devices to be fabricated over the regions 202a and 202b, the implantation process 602 may implant different dopant species. For example, to form an n-type device (e.g., an n-type NS FET), the APT layer 206a is implanted with a p-type dopant, such as boron (B) and/or boron difluoride (BF$_2$). Conversely, to form a p-type device (e.g., a p-type NS device), the APT layer 206a is implanted with an n-type dopant, such as phosphorus (P) or arsenic (As). After performing the implantation process 602, the patterned masking element 207 is removed from the structure 200 by a suitable method, such as plasma ashing and/or resist stripping.

Although the structure 200 as depicted herein only includes one APT layer 206a formed in the region 202b, it is noted that the present embodiments are not limited to such configuration. For example, after forming the APT layer 206a as discussed above, method 100 may repeat operations 102 and 104 by forming one or more additional pairs of non-channel layer 205 and channel layer 206 over the APT layer 206a, forming a patterned masking element (similar to the patterned masking element 207) thereover, and implementing an implantation process (similar to the implantation process 602) to form another APT layer (similar to the APT layer 206a) in the region 202b before proceeding to operation 106. In this regard, a number M of the APT layers formed over the substrate 202 and as a portion of the ML may be at least one in the region 202b (and none in the region 202a), or 1≤M in the region 202b, where M is a natural number and further defined below. Regardless of the total number of APT layers present in the structure 200, the present embodiments provide that at least the bottommost channel layer 206 in the region 202b is replaced with the APT layer 206a.

Figure 6A:
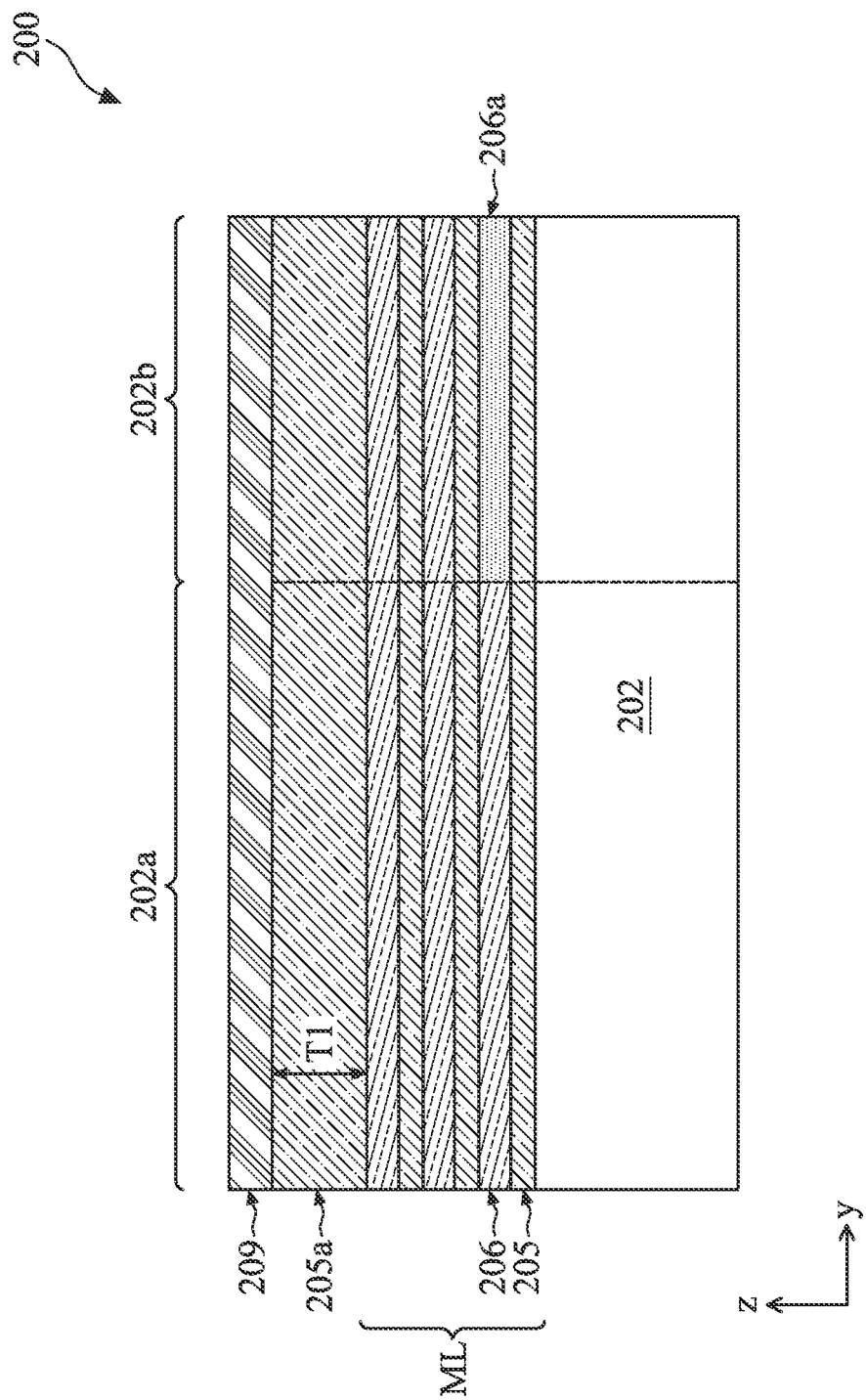
Figure 6B:
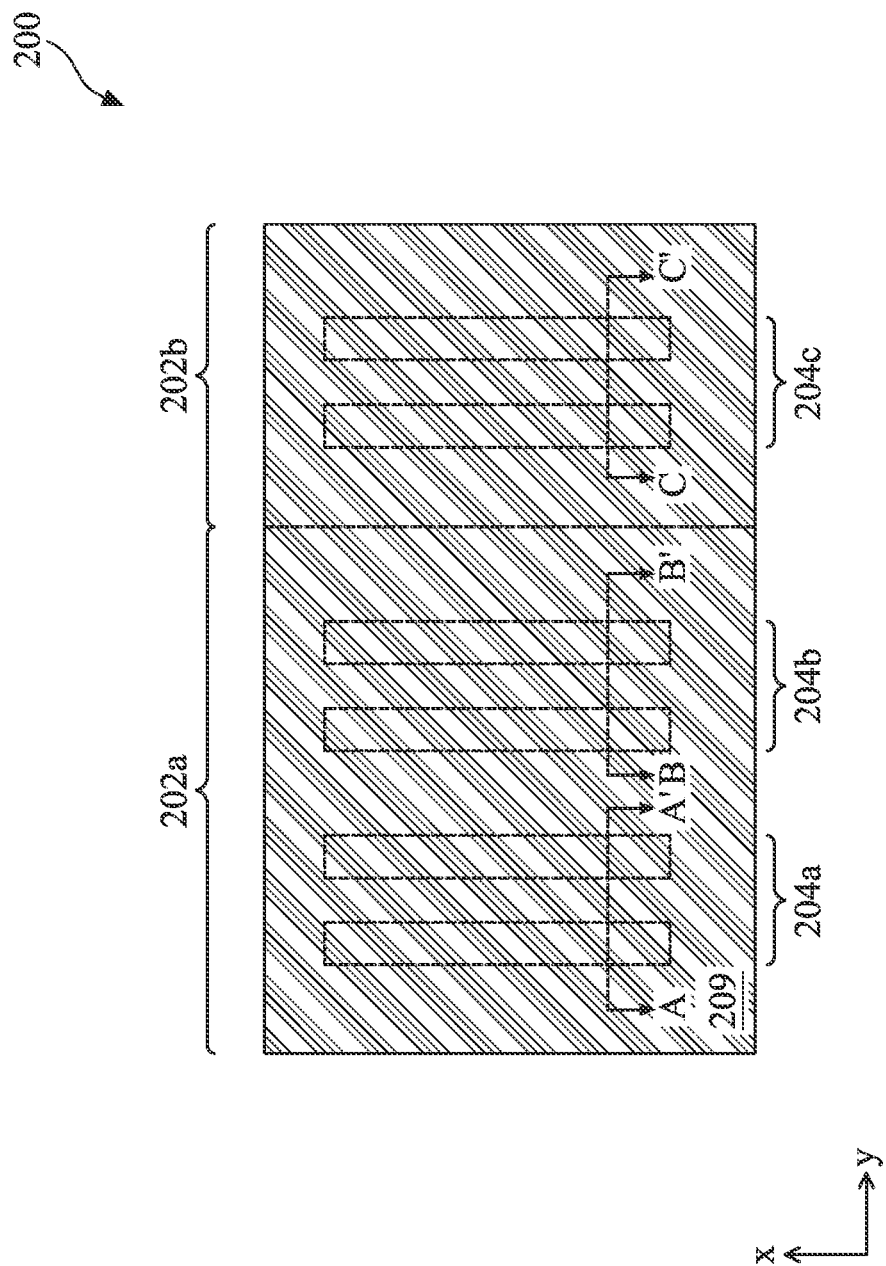
FIGS. 6B and 13A are planar top views of the semiconductor device as shown in FIG. 2 during intermediate stages of the method shown in FIGS. 1A, 1B, 1C, 1D, and/or 1E according to various embodiments of the present disclosure.
Figures 12A, 12B, 12C:
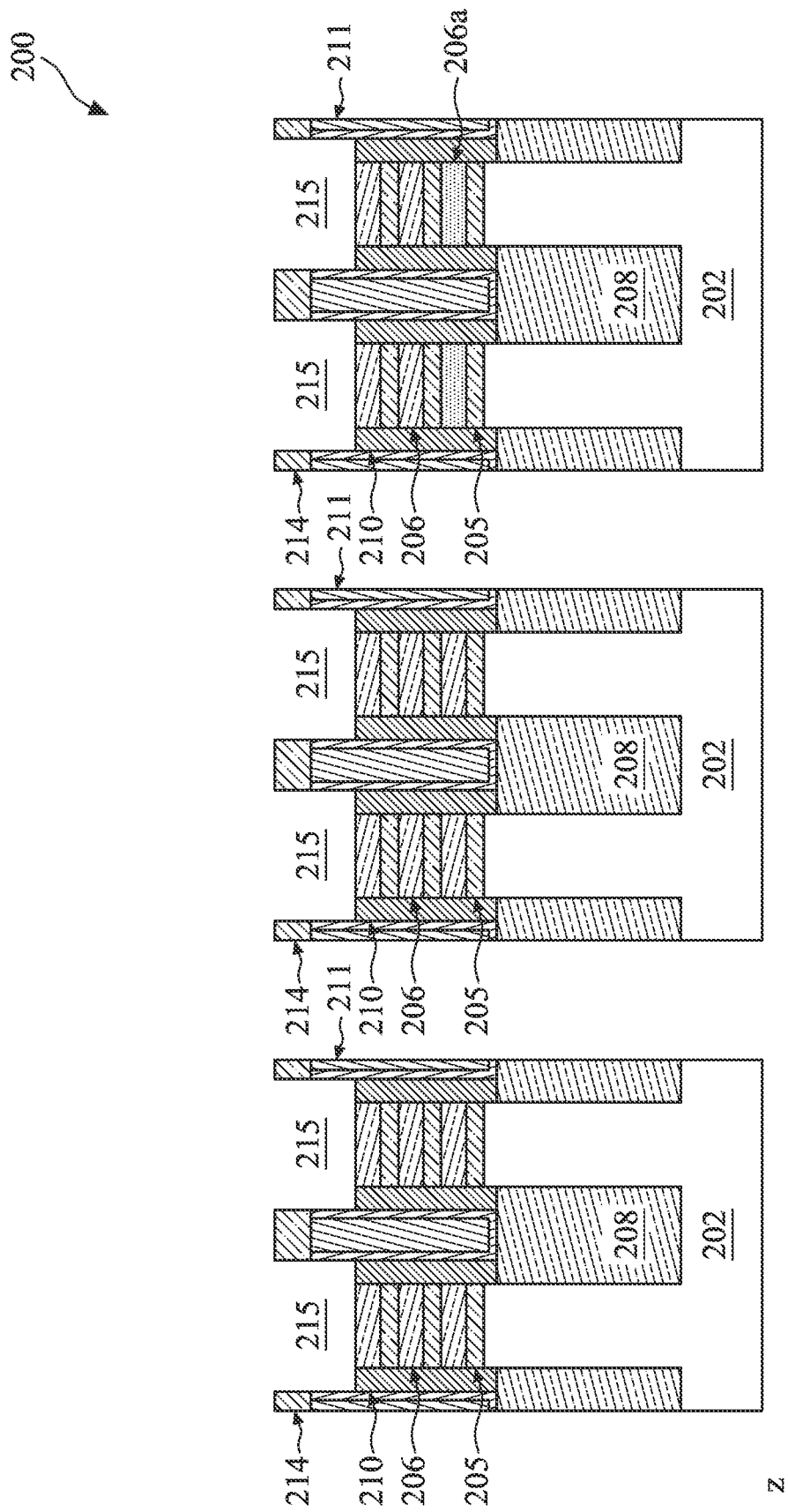

At operation 106, referring to FIGS. 6A-6B, method 100 completes the formation of the ML over the APT layer 206a.

The ML includes alternating non-channel layers 205 and channel layers 206 (which includes the APT layer 206a in the region 202b) stacked vertically over the substrate 202. In the present embodiments, method 100 at operation 106 forms at least one more pair of alternating non-channel layer 205 and channel layer 206 over the APT layer 206a. In other words, a total number N of the pairs of non-channel layers 205 and channel layers 206 (including the APT layer 206a) in the ML is at least M+1, or (M+1)≤N. Stated in another way, 1≤M≤(N−1). In some embodiments, as depicted herein, the ML includes more channel layers 206 than the APT layers 206a. In some embodiments, the ML includes more APT layers 206a than the channel layers 206. In some embodiments, N does not exceed six; of course, the present embodiments are not limited to this configuration, so long as at least one more pair is formed over the APT layer 206a. For example, as depicted herein, the ML includes one APT layer 206a and a total of three pairs of alternating non-channel layers 205 and channel layers 206/APT layer 206a, or M=1 and N=3. In the present embodiments, forming the remainder of the ML includes alternatingly growing the non-channel layers 205 and the channel layers 206 in a series of epitaxy processes as discussed in detail above at operation 102.

In the present embodiments, method 100 at operation 106 further forms a hard mask layer 205a over the ML and a hard mask layer 209 over the hard mask layer 205a. The hard mask layer 205a is a sacrificial layer configured to facilitate the formation of isolation features between the subsequently-formed fins. In some embodiments, the hard mask layer 205a may be formed to a thickness T1 that is greater than a thickness of the non-channel layer 205 and of the channel layer 206. The hard mask layer 205a may include any suitable material, such as a semiconductor material, so long as its composition is distinct from that of the isolation features and the channel layer 206 disposed thereunder to allow selective removal by an etching process. In some embodiments, the hard mask layer 205a has a composition similar to or the same as that of the non-channel layers 205 and includes, for example, SiGe. For embodiments in which the hard mask layer 205a has the same composition as the non-channel layers 205, the hard mask layer 205a is also grown by a similar epitaxy process as discussed above.

The hard mask layer 209, on the other hand, is configured to protect the underlying hard mask layer 205a and the ML during subsequent fabrication processes and may include any suitable dielectric material, such as silicon oxide (SiO and/or $SiO_2$), silicon nitride (SiN), silicon carbide (SiC), oxygen-containing silicon nitride (SiON), oxygen-containing silicon carbide (SiOC), carbon-containing silicon nitride (SiCN), aluminum oxide ($Al_2O_3$), other suitable materials, or combinations thereof. The hard mask layer 209 may be formed by any suitable method, such as atomic layer deposition (ALD), CVD, other suitable methods, or combinations thereof.

At operation 108, referring to FIGS. 6B and 7A-7C, method 100 forms fins 204a-204c the ML using a series of photolithography and etching processes similar to those discussed above with respect to forming the patterned masking element 207. In the present embodiments, the fins 204a and 204b protrude from the region 202a, while the fins 204c protrude from the region 202b. For example, the photolithography process may include forming a masking element over the ML, exposing the masking element, and developing the exposed masking element to form a patterned masking element (not depicted). The hard mask layer 209 is then etched using the patterned masking element as an etch mask, followed by the etching of the hard mask layer 205a and the ML to form fins 204a-204c protruding from the substrate 202. The etching process may include dry etching, wet etching, reactive ion etching (RIE), other suitable processes, or combinations thereof. The patterned masking element is subsequently removed from the ML using any suitable process, such as ashing and/or resist stripping.

At operation 110, referring to FIGS. 8A-8C, method 100 forms isolation structures 208 in trenches that separate the fins 204a204c. The isolation structures 208 may include silicon oxide (SiO and/or $SiO_2$), tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), a low-k dielectric material (having a dielectric constant less than that of silicon oxide, which is about 3.9), other suitable materials, or combinations thereof. The isolation structures 208 may include shallow trench isolation (STI) features. In one embodiment, the isolation structures 208 are formed by filling trenches that separate the fins 204a-204c with a dielectric material described above by any suitable method, such as CVD, flowable CVD (FCVD), spin-on-glass (SOG), other suitable methods, or combinations thereof. The dielectric material may subsequently be planarized by a chemical-mechanical planarization/polishing (CMP) process and selectively etched back to form the isolation structures 208. The isolation structures 208 may include a single-layer structure or a multi-layer structure. In some embodiments, the CMP process also removes the hard mask layer 209 from the structure 200. In some embodiments, the hard mask layer 209 is removed separately by an etching process after forming the isolation structures 208.

At operation 112, referring to FIGS. 9A-9C, method 100 forms a cladding layer 210 over the fins 204a-204c and the isolation structures 208. In the present embodiments, the cladding layer 210 and the non-channel layers 205 are sacrificial layers configured to be replaced with a metal gate stack in a channel region of each fin 204a-204c. In this regard, the cladding layer 210 has a composition substantially the same as that of the non-channel layers 205, such that they may be removed by a common etching process. In the present embodiments, the cladding layer 210 includes SiGe. In some embodiments, the cladding layer 210 is deposited epitaxially by a suitable method discussed above with respect to forming the ML. In some embodiments, as depicted FIGS. 9A-9C, the cladding layer 210 is deposited conformally, rather than grown epitaxially, over surfaces of the structure 200 as an amorphous layer, such that the cladding layer 210 is also formed over the isolation structures 208. In some examples, the cladding layer 210 may be formed to a thickness of about 5 nm to about 10 nm. Subsequently, method 100 performs a directional (or anisotropic) etching process to selectively remove portions of the cladding layer 210, thereby exposing portions of the isolation structures 208 and a top surface of the hard mask layer 205a. The etching process may include a dry etching process, a wet etching process, an RIE process, or combinations thereof. The etching process may implement an etchant that selectively removes horizontal portions of the cladding layer 210 without removing, or substantially removing the isolation structures 208 or vertical portions of the cladding layer 210.

At operation 114, referring to FIGS. 10A-10C, method 100 forms a dielectric feature 211 over the structure 200, thereby completely filling the trenches between adjacent fins 204a-204c. The dielectric feature 211 is configured to isolate adjacent fins 204a-204c and to provide a substrate over which gate isolation features may be subsequently formed. The dielectric feature 211 may include a single-layered structure or a multi-layered structure. As depicted herein, the dielectric feature 211 is separated from each sidewall of the fins 204a-204c by a portion of the cladding layer 210.

In the present embodiments, the dielectric feature 211 includes two layers, a dielectric layer 213 disposed over a dielectric layer 212. The dielectric layers 212 and 213 may each include silicon oxide (SiO and/or $SiO_2$), silicon nitride (SiN), silicon carbide (SiC), oxygen-containing silicon nitride (SiON), oxygen-containing silicon carbide (SiOC), carbon-containing silicon nitride (SiCN), aluminum oxide ($Al_2O_3$), tetraethylorthosilicate (TEOS), doped silicon oxide (e.g., borophosphosilicate glass (BPSG), FSG, phosphosilicate glass (PSG), boron-doped silicate glass (BSG), etc.), a high-k dielectric material (having a k value greater than that of silicon oxide, which is about 3.9), other suitable materials, or combinations thereof. The high-k dielectric material may include oxygen, lanthanum, aluminum, titanium, zirconium, tantalum, other suitable materials, or combinations thereof. For example, the high-k dielectric material may include hafnium oxide ($HfO_2$), lanthanum oxide ($La_2O_3$), other high-k oxide materials, or combinations thereof. In the present embodiments, the composition of the dielectric layer 212 differs from that of the dielectric layer 213. In some embodiments, the dielectric constant of the dielectric layer 213 is greater than that of the dielectric layer 212. In one example, the dielectric layer 212 may include SiN and the dielectric layer 213 may include $HfO_2$. In another example, the dielectric layer 212 may include silicon oxide, and the dielectric layer 213 may include SiN. In some embodiments, the dielectric feature 211 has a composition similar to or the same as that of the isolation structures 208. Of course, the present embodiments are not limited to these compositions. Various layers of the dielectric feature 211 may be deposited by any suitable method, such as CVD, FCVD, SOG, other suitable methods, or combinations thereof, and subsequently planarized by one or more CMP process to expose a top surface of the hard mask layer 205a.

At operation 116, referring to FIGS. 11A-11C, method 100 forms a dielectric helmet 214 over the dielectric feature 211. In some embodiments, the dielectric helmet 214 provides one or more gate isolation features configured to separate (or cut) a subsequently-formed metal gate stack over the fins 204a-204c. In the present embodiments, for purposes of enhancing etching selectivity, the dielectric helmet 214 is configured with a composition different from that of the dielectric layers 212 and 213, and may include silicon oxide, SiN, SiC, SiON, SiOC, SiCN, $Al_2O_3$, a high-k dielectric material, other suitable materials, or combinations thereof. In some embodiments, the dielectric helmet 214 includes a dielectric material having a higher dielectric constant than the dielectric layers 212 and 213. For example, the dielectric helmet 214 may include a high-k dielectric material, such as $HfO_2$, the dielectric layer 212 may include SiN, and the dielectric layer 213 may include silicon oxide.

In some embodiments, method 100 forms the dielectric helmet 214 by first recessing the dielectric feature 211 to form trenches (not depicted), depositing a dielectric material in the trenches by a suitable method, such as CVD and/or ALD, and planarizing the dielectric material by a CMP process to form the dielectric helmet 214. In some embodiments, the dielectric helmet 214 is formed to a thickness T2 that is no greater than the thickness T1 of the hard mask layer 205a. In some examples, T2 is at least about one half of T1.

Now referring to FIGS. 12A-13D, method 100 at operation 118 forms dummy gate stacks 220 over channel regions of the fins 204a-204c. In the present embodiments, referring to FIGS. 12A-12C, method 100 first removes the hard mask layer 205a to form trenches 215, thereby exposing the topmost channel layer 206 of the ML. In the present embodiments, method 100 selectively removes the hard mask layer 205a without removing, or substantially removing, the dielectric helmet 214 or the topmost channel layer 206 of the ML.

Subsequently, referring to FIGS. 13A-13D, method 100 forms the dummy gate stacks 220 over channel regions of the fins 204a-204c, thereby filling the trenches 215. In the present embodiments, one or more of the dummy gate stacks 220 are formed over the dielectric helmet 214. Each dummy gate stack 220 may include a dummy gate electrode (not depicted separately) disposed over an optional dummy gate dielectric layer. In some embodiments, at least portions of each dummy gate stack 220 are to be replaced with a metal gate stack, which may be separated (or cut) by the dielectric helmet 214.

The dummy gate stacks 220 may be formed by a series of deposition and patterning processes. For example, the dummy gate stacks 220 may be formed by depositing a polysilicon (poly-Si) layer over the fins 204a-204c separated by the dielectric helmet 214, and subsequently patterning the poly-Si layer via a series of photolithography and etching processes (e.g., an anisotropic dry etching process). In some embodiments, an interfacial layer 221 is formed over the fins 204a-204c before forming the dummy gate stacks 220. The interfacial layer 221 may include silicon oxide and may be formed by any suitable method, such as thermal oxidation, chemical oxidation, other suitable methods, or combinations thereof. In the depicted embodiments, to accommodate the patterning process and protect the dummy gate stacks 220 during subsequent fabrication processes, hard mask layers 223 and 225 are formed over the dummy gate stacks 220. The hard mask layers 223 and 225 may include any suitable dielectric material, including silicon oxide, SiN, SiC, SiON, SiOC, SiCN, $Al_2O_3$, a high-k dielectric material (e.g., hafnium oxide ($HfO_2$), lanthanum oxide ($La_2O_3$), etc.), other suitable materials, or combinations thereof, and may be formed by any suitable method, such as CVD and/or ALD.

Referring to FIG. 13A, method 100 at operation 118 subsequently forms top gate spacers 222a on sidewalls of the dummy gate stacks 220. The top gate spacers 222a may be a single-layer structure or a multi-layer structure and may include silicon oxide, SiN, SiC, SiON, SiOC, SiCN, air, a low-k dielectric material, a high-k dielectric material (e.g., hafnium oxide ($HfO_2$), lanthanum oxide ($La_2O_3$), etc.), other suitable materials, or combinations thereof. Each spacer layer of the top gate spacers 222a may be formed by first depositing a dielectric layer over the dummy gate stacks 220 via a suitable deposition method, such as CVD and/or ALD, and subsequently removing portions of the dielectric layer in an anisotropic (or directional) etching process (such as a dry etching process), leaving the top gate spacers 222a on the sidewalls of the dummy gate stacks 220.

At operation 120, method 100 forms epitaxial S/D features in portions of the fins 204a-204c adjacent to the dummy gate stacks 220. In the present embodiments, forming the epitaxial S/D features generally includes forming S/D recesses in the S/D regions of the fins 204a-204c (i.e., the ML), forming inner gate spacers on sidewalls of the non-channel layers 205 that are exposed in the S/D recesses, and forming epitaxial S/D features in the S/D recesses. In the present embodiments, operation 120 is implemented by any one of methods 300, 400, and 500 as depicted in FIGS. 1C, 1D, and 1E, respectively. It is noted that methods 300, 400, and 500 are independent and alternative to one another and are therefore equally applicable to the embodiments disclosed herein. Methods 300, 400, and 500 are discussed separately below for purposes of clarity. For example, method 300 is discussed in view of FIGS. 14A-17C; method 400 is discussed in view of FIGS. 18A-25C; and method 500 is discussed in view of FIGS. 26A-33A.

Referring to FIGS. 1D and 14A-15C, method 300 at operation 302 performs an etching process 604 to remove portions of the S/D regions from each fin 204a, 204b, and 204c to form S/D recesses 230a, 230b, and 230c, respectively. In the present embodiments, the etching process 604 selectively removes portions of the fins 204a-204c and the cladding layers 210 without removing, or substantially removing, the dummy gate stacks 220, the dielectric feature 211, the dielectric helmet 214, and the isolation structures 208. In some embodiments, the etching process 604 is a dry etching process employing a suitable etchant capable of removing Si (i.e., the channel layers 206) and SiGe (i.e., the non-channel layers 205) of the ML, which includes the APT layer 206a as a portion of the fins 204c. In some non-limiting examples, the dry etchant may be a chlorine-containing etchant including $Cl_2$, $SiCl_4$, $BCl_3$, other chlorine-containing gas, or combinations thereof. A cleaning process may subsequently be performed to clean the S/D recesses 230a-230c with a hydrofluoric acid (HF) solution or other suitable solution.

Figures 15A, 15B, 15C:
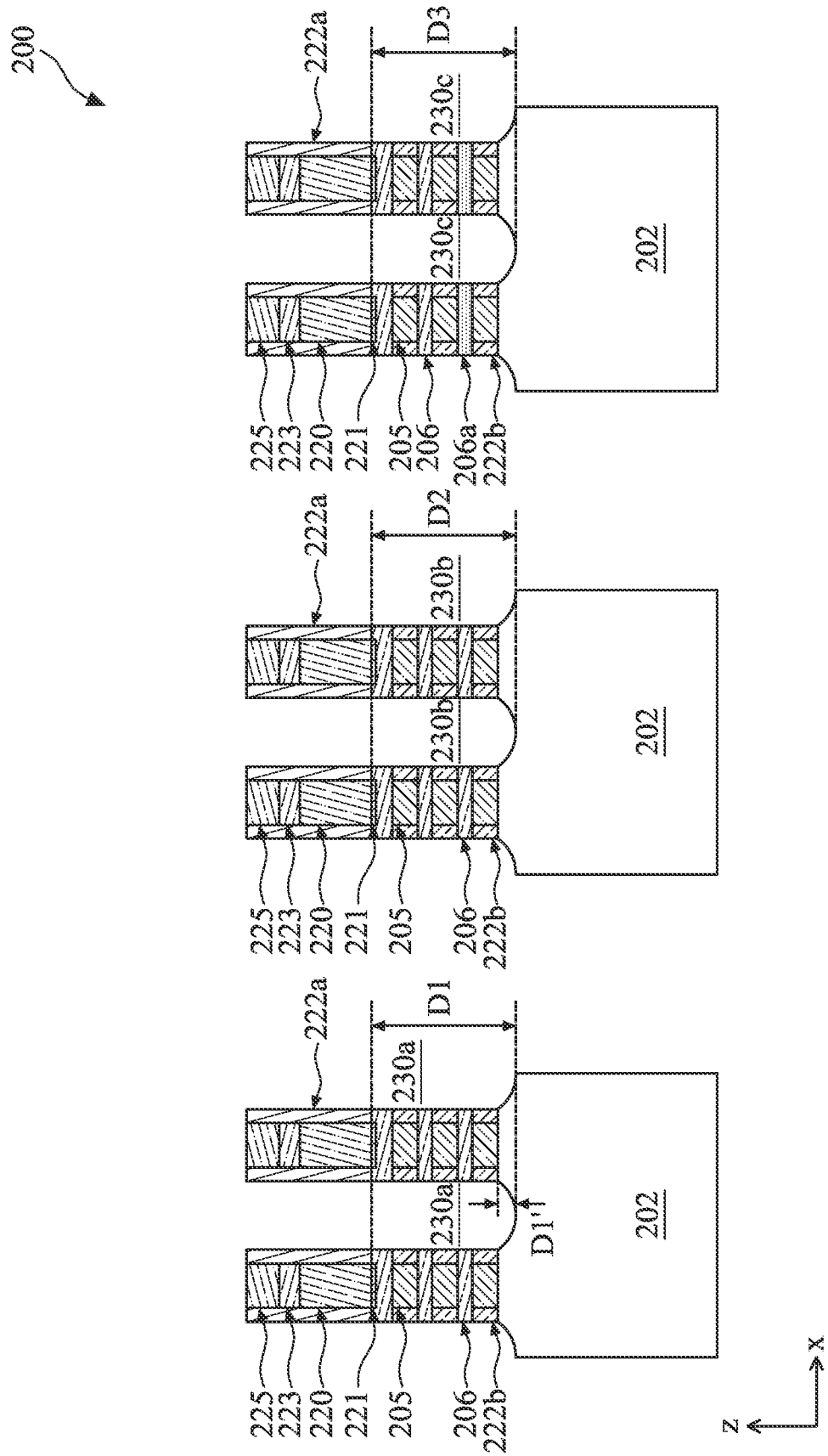
Figures 16A, 16B, 16C:
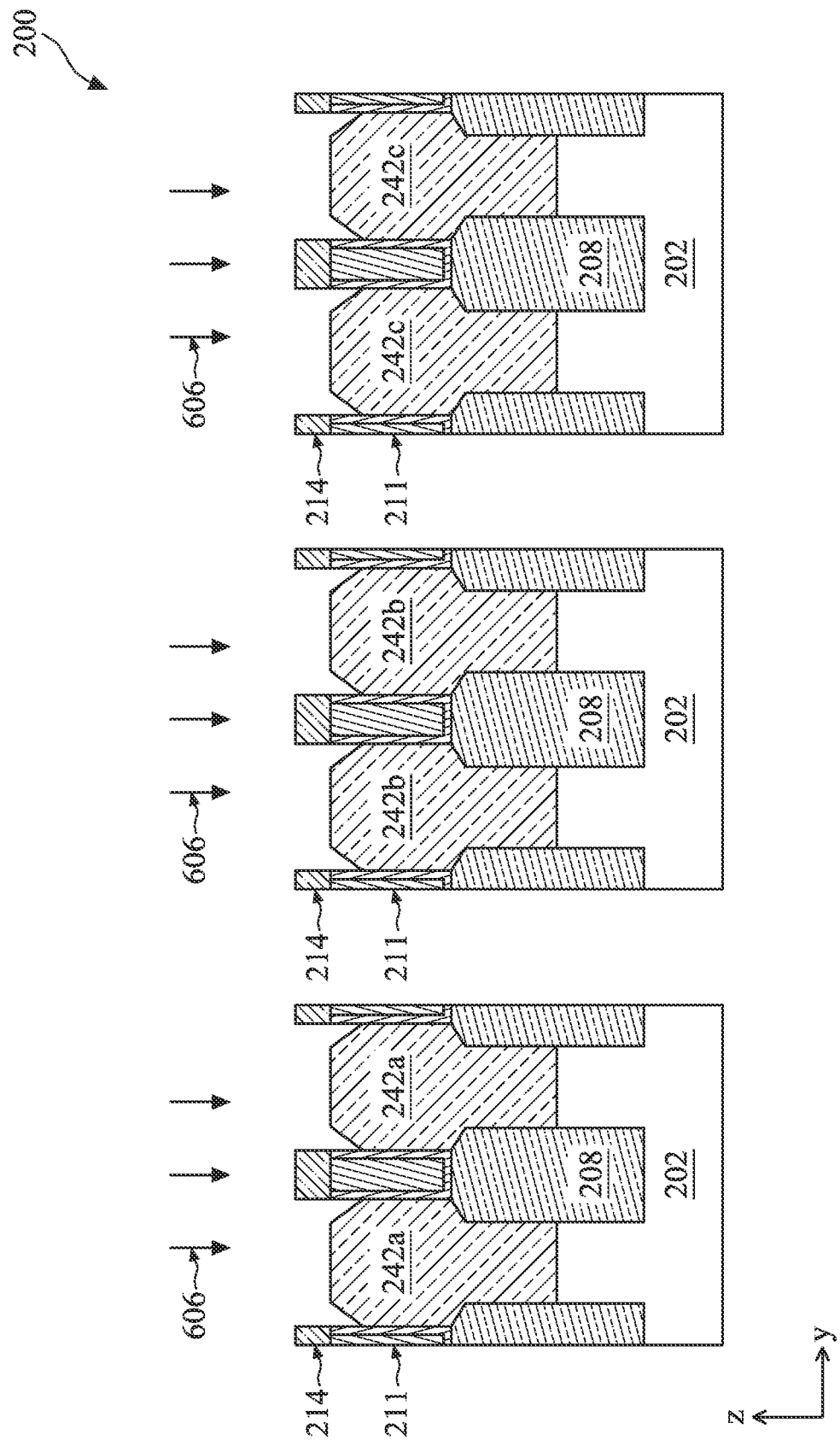

Referring to FIGS. 15A-15C, depth of each of the S/D recesses 230a, 230b, and 230c, measured from a bottom surface each S/D recess to a top of each fin and defined as D1, D2, and D3, respectively, is controlled by adjusting the duration of the etching process 604, and in the present embodiments, the depths D1, D2, and D3 are substantially the same because the etching process 604 is universally applied in both regions 202a and 202b. Furthermore, the depths D1-D3 are controlled such that each of the S/D recesses 230a-230c extends to below the bottommost sheet (i.e., the bottommost non-channel layer 205) of the ML. In some examples, a ratio of such extension, defined by depth D1', to the depth D1 (or either of D2 and D3) may be about 0.1 to about 0.4. The embodiments depicted in FIGS. 15A and 15B are substantially the same and each different from that depicted in FIG. 15C in that the S/D recess 230c exposes portions of the APT layer 206a.

Still referring to FIGS. 15A-15C, method 300 at operation 304 forms inner gate spacers 222b on sidewalls of the non-channel layers 205 exposed in the S/D recesses 230a-230c. The inner gate spacers 222b may be a single-layer structure or a multi-layer structure and may include silicon oxide, SiN, SiCN, SiOC, SiON, SiOCN, a low-k dielectric material, air, a high-k dielectric material (such as hafnium oxide ($HfO_2$), lanthanum oxide ($La_2O_3$)), other suitable dielectric material, or combination thereof. In some embodiments, the inner gate spacers 222b have a composition different from that of the top gate spacers 222a. Forming the inner gate spacers 222b includes performing a series of etching and deposition processes. For example, forming the inner gate spacers 222b may begin with selectively removing portions of the non-channel layers 205 without removing, or substantially removing, portions of the channel layers 206 to form trenches (not depicted). The non-channel layers 205 may be etched by a dry etching process. Subsequently, one or more dielectric layers are formed in the trenches, followed by one or more etching processes to remove (i.e., etch back) excess dielectric layer(s) deposited on surfaces of the channel layers 206 that are exposed in the S/D recesses, thereby forming the inner gate spacers 222b as depicted in FIGS. 15A-15C. The one or more dielectric layers may be deposited by any suitable method, such as ALD, CVD, physical vapor deposition (PVD), other suitable methods, or combinations thereof.

Subsequently, referring to FIGS. 16A-17C, method 300 at operation 306 forms epitaxial S/D features 242a, 242b, and 242c in the S/D recesses 230a, 230b, and 230c, respectively, in an epitaxial process 606. Each of the epitaxial S/D features 242a-242c may be suitable for forming a p-type device (i.e., including a p-type epitaxial material) or, alternatively, an n-type FET device (i.e., including an n-type epitaxial material). The p-type epitaxial material may include one or more epitaxial layers of silicon germanium (epi SiGe) each doped with a p-type dopant such as B, $BF_2$, other p-type dopants, or combinations thereof. The n-type epitaxial material may include one or more epitaxial layers of silicon (epi Si) or silicon carbon (epi SiC) each doped with an n-type dopant such as As, P, other n-type dopants, or combinations thereof. In the present embodiments, the conductivity type of the dopant in the epitaxial S/D features 242c is different from that of the dopant included in the APT layer 206a. For example, if the APT layer 206a includes a p-type dopant, then the epitaxial S/D features 242c includes an n-type dopant to provide an n-type device. Conversely, if the APT layer 206a includes an n-type dopant, then the epitaxial S/D features 242c includes a p-type dopant to provide a p-type device.

In the present embodiments, performing the epitaxial process 606 includes growing an epitaxial semiconductor material in each S/D recess 230a-230c and over the inner gate spacers 222b in a process similar to that discussed above with respect to forming the ML. In some embodiments, the epitaxial semiconductor material is doped in-situ by adding a dopant species discussed above to a source material during the epitaxial process 606. In some embodiments, the epitaxial semiconductor material is doped by an ion implantation process after performing the deposition process. In some embodiments, an annealing process is performed to activate the dopant species in the epitaxial S/D features 242a-242c.

Figures 17A, 17B, 17C:
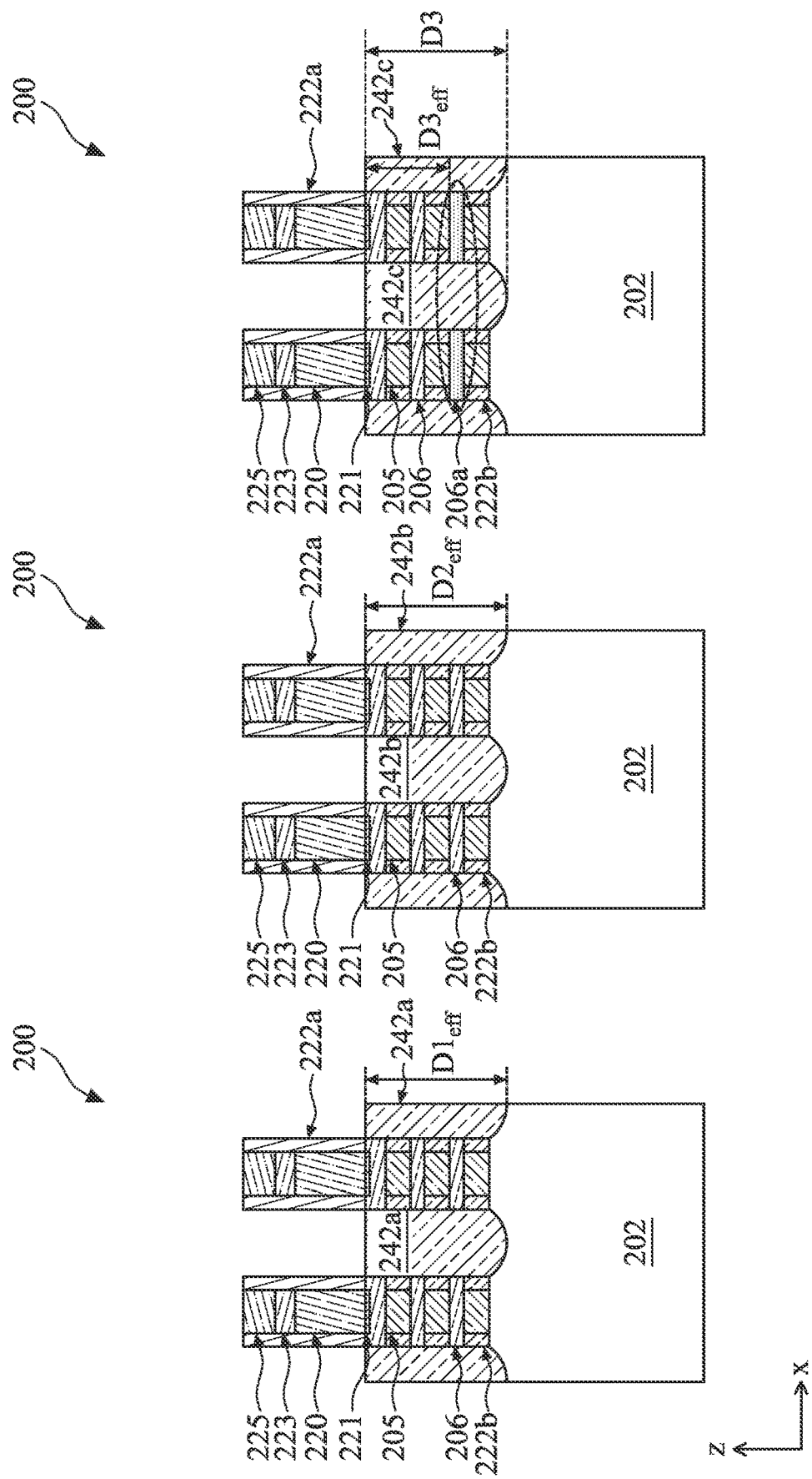
Figures 25A, 25B, 25C:
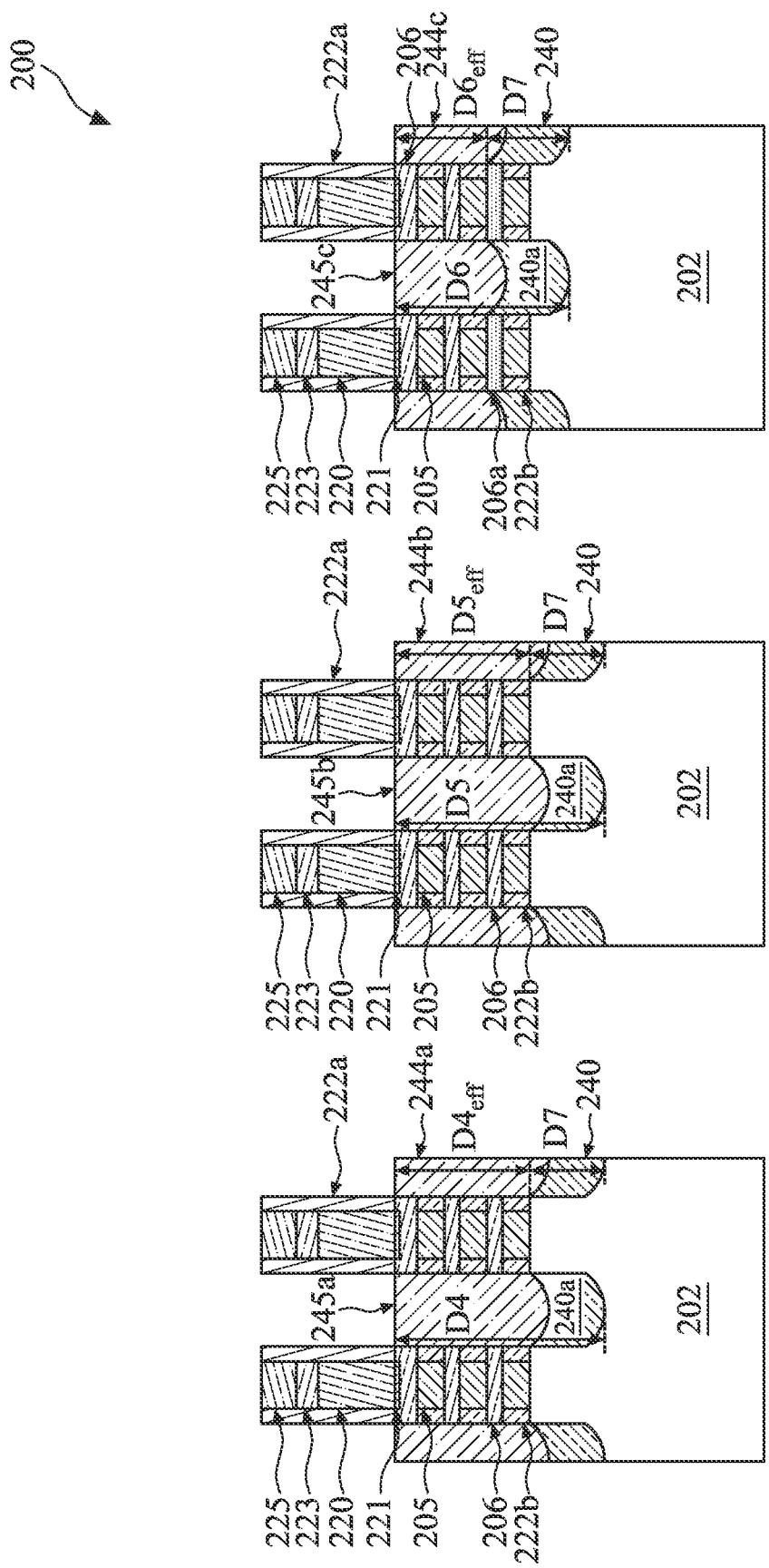

Because the S/D recesses 230a-230c are formed to substantially the same depth, the epitaxial S/D features 242a-242c are formed to substantially the same size as well. However, due to the presence of the APT layer 206a in the fin 204c as depicted in FIG. 17C, the effective overlapping area between the epitaxial S/D features 242c and the channel region of the fin 204c is defined by a depth $D3_{eff}$, which is less than the depth D3 of the S/D recess 230c depicted in FIG. 15C. In other words, the epitaxial S/D features 242c overlap with a less number of the channel layers 206 than each of the epitaxial S/D features 242a and 242b. In terms of device function, although the epitaxial S/D features 242c extend to contact the bottom surface of the S/D recess 230c, the APT layer 206a forms a dummy (or inactive) NS FET with the epitaxial S/D features 242c. In this regard, the reduction in the overlapping area lowers the parasitic gate-drain capacitance ($C_{gd}$) of the NS FET, thereby increasing processing speed (by reducing the RC delay, for example) of the NS FET when applied in alternating current (AC) settings. On the other hand, with the absence of the APT layer 206a, the effective overlapping areas between each of the epitaxial S/D features 242a and 242b and their respective channel regions are defined by $D1_{eff}$ and $D2_{eff}$, respectively, which are equivalent to the depths D1 and D2 and both greater than $D3_{eff}$. In other words, one additional channel layer 206 participates in the conduction of on-state current in each NS FET provided by the epitaxial S/D features 242a and 242b, making them more suitable for high-current (HC) or high-performance computing (HPC) applications than the NS FET provided by the epitaxial S/D features 242c. If the fin 204c includes more than one APT layer 206a, the $C_{gd}$ would be further reduced.

Accordingly, the present disclosure contemplates a semiconductor device (i.e., structure 200) that includes at least two distinct NS FETs with different overlapping areas between their respective epitaxial S/D features and channel layers, such that advantages of both reduced $C_{gd}$ and increased current conduction may be realized in the same semiconductor device. For embodiments depicted in FIGS. 14A-17C, such advantage is achieved by providing the APT layer 206a at the bottom of the ML in the region 202b thereby effectively "turning off" the bottom channel layer while keeping the size of the epitaxial S/D features 242a-242c substantially the same.

Now referring to FIGS. 1D and 18A-18C, method 400 at operation 402 performs an etching process 608 to selectively remove portions of the fins 204c in the region 202b to form the S/D recesses 230c. In the present embodiments, referring to FIGS. 18A and 18B, method 400 implements a patterned masking element 232 over the region 202a to protect the fins 204a and 204b from being etched. The patterned masking element 232 may be similar to the patterned masking element 207 discussed in detail above. The etching process 608 is similar to the etching process 604 in that it is configured to selectively remove the ML and the cladding layers 210 without removing, or substantially removing, the surrounding dielectric components. In the present embodiments, the S/D recesses 230c are defined by a depth D6 as depicted in FIG. 21C. After forming the S/D recesses 230c, method 400 removes the patterned masking element 232 by any suitable method, such as plasma ashing and/or resist stripping.

Referring to FIGS. 19A-19C, method 400 at operation 404 performs an etching process 610 to selectively remove portions of the fins 204a and 204b in the region 202a to form the S/D recesses 230a and 230b. In the present embodiments, referring to FIG. 19C, method 400 implements a patterned masking element 234, which may be similar to the patterned masking element 207, over the region 202b to protect the S/D recesses 230c from being further etched. The etching process 610 is similar to the etching process 608 in that it is configured to selectively remove the ML and the cladding layers 210 without removing, or substantially removing, the surrounding dielectric components. In the present embodiments, the S/D recesses 230a are defined by a depth (D4 as depicted in FIG. 21A) that is substantially the same as that of S/D recesses 230b (D5 as depicted in FIG. 21B), which are both greater than the depth D6 of the S/D recesses 230c. After forming the S/D recesses 230a and 230b, referring to FIGS. 20A-20C, method 400 removes the patterned masking element 234 by any suitable method, such as plasma ashing and/or resist stripping.

In the present embodiments, the etching process 610 is implemented with etching parameters different from those of the etching process 608 to ensure that the depths D4 and D5 are greater than the depth D6. In some embodiments, the duration of the etching process 610 is less than that of the etching process 608 with all other parameters being held constant. In some embodiments, the voltage bias applied during the etching process 610 is less than that of the etching process 608 with all other parameters being held constant. Although not discussed specifically, other etching parameters may also be adjusted to ensure that the S/D recesses 230c are shallower than the S/D recess 230a and 230b.

In the present embodiments, referring to FIGS. 20A-21C, the difference $D_{diff}$ between depths D5 (or D4) and D6 is measured between a bottom surface of the S/D recess 230b (or the S/D recess 203a) and a bottom surface of the S/D recess 230c. In some embodiments, a ratio of the depth $D_{diff}$ to the depth D5 (or D4) is about 0.1 to about 0.4, and a ratio of the depth $D_{diff}$ to the depth D6 is about 0.1 to about 0.5. In some examples, the depth $D_{diff}$ may be about 10 nm to about 30 nm.

Referring to FIGS. 21A-21C, method 400 at operation 406 forms the inner gate spacers 222b in the S/D recesses 230a-230c in a series of processes similar to that discussed above with respect to operation 304.

Subsequently, referring to FIGS. 22A-23C, method 400 at operation 408 forms a buffer layer 240 to partially fill the S/D recesses 230a-230c in a deposition process 612. In the present embodiments, the buffer layer 240 includes elemental Si and is free of any dopant species. This regard, the deposition process 612 is similar to the epitaxial process implemented to form the ML, where the deposition process 612 includes epitaxially forming an un-doped semiconductor layer, i.e., free of any dopant species, in the S/D recesses 230a-230c. In the present embodiments, the deposition process 612 is controlled such that the buffer layer 240 is formed to a thickness D7 that is no greater than the depth D6, i.e., the buffer layer 240 does not completely fill any of the S/D recesses 230a-230c. For embodiments in which the number M of the APT layer 206a is less than the number (N-M) of the un-doped channel layers (alternatively referred to as active channel layers) 206 formed thereover, such as that depicted herein, the thickness D7 is less than about half of the depth D6. Alternatively, for embodiments in which the number M of the APT layer 206a is greater than the number (N-M) of the un-doped channel layers 206 formed thereover, the thickness D7 is greater than about half of the depth D6. In some embodiments, the depth D7 is no greater than the depth $D_{diff}$. In some examples, the depth D7 may be about 5 nm to about 30 nm.

It is noted that the present embodiments do not limit the composition of the buffer layer 240 to elemental, epitaxially grown Si and may implement a buffer layer 240 that includes a different epitaxially grown semiconductor material and/or a dielectric material (e.g., SiN, SiCN, $SiO_2$, oxygen-and-carbon-containing silicon nitride (SiOCN), etc.), so long as it is free of any dopant species, i.e., any n-type and p-type dopant species. For embodiments in which the buffer layer 240 includes a dielectric material, the deposition process 612 may be implemented using CVD, ALD, other suitable processes, or combinations thereof.

Referring to FIGS. 24A-25C, method 400 at operation 410 forms semiconductor layers 244a, 244b, and 244c over the buffer layer 240 in an epitaxial process 614, resulting in epitaxial S/D features 245a, 245b, and 245c, respectively. In the present embodiments, the epitaxial process 614 is similar to the epitaxial process 606 discussed above with respect to operation 306, where the epitaxial process 614 includes forming the semiconductor layers 244a-244c to include one or more dopant species over the buffer layer 240 in the S/D recesses 230a-230c, respectively. For example, each of the doped semiconductor layers 244a-244c may be suitable for forming a p-type device (i.e., including a p-type epitaxial material) or, alternatively, an n-type FET device (i.e., including an n-type epitaxial material), both of which are discussed in detail above with respect to epitaxial S/D features 242a-242c. Similar to the discussion above, the conductivity type of the dopant in the semiconductor layer 244c is different from that of the dopant included in the APT layer 206a. For example, if the APT layer 206a includes a p-type dopant, then the semiconductor layer 244c includes an n-type dopant to provide an n-type device. Conversely, if the APT layer 206a includes an n-type dopant, then the semiconductor layer 244c includes a p-type dopant to provide a p-type device.

In contrast to the embodiments depicted in FIGS. 24A-25C, the epitaxial S/D features 242a-242c depicted in FIGS. 17A-17C are each free of any un-doped buffer layer. In this regard, the effective overlapping area in the epitaxial S/D features 245a, 245b, and 245c is defined by the depths $D4_{eff}$, $D5_{eff}$, and $D6_{eff}$, respectively, where the depth $D6_{eff}$ is less than the depths $D4_{eff}$ and $D5_{eff}$. As depicted herein, the depths $D4_{eff}$, $D5_{eff}$, and $D6_{eff}$ also define the thicknesses of the semiconductor layers 244a, 244b, and 244c, respectively. In the present embodiments, the semiconductor layer 244c does not, or at least not substantially, overlap with the APT layer 206a. In contrast, each epitaxial S/D feature 242c depicted in FIG. 17C overlaps with the APT layer 206a, although its effective overlapping area defined by the depth $D3_{eff}$ is less than the total depth D3 of the epitaxial S/D feature 242c.

Figures 29A, 29B, 29C:
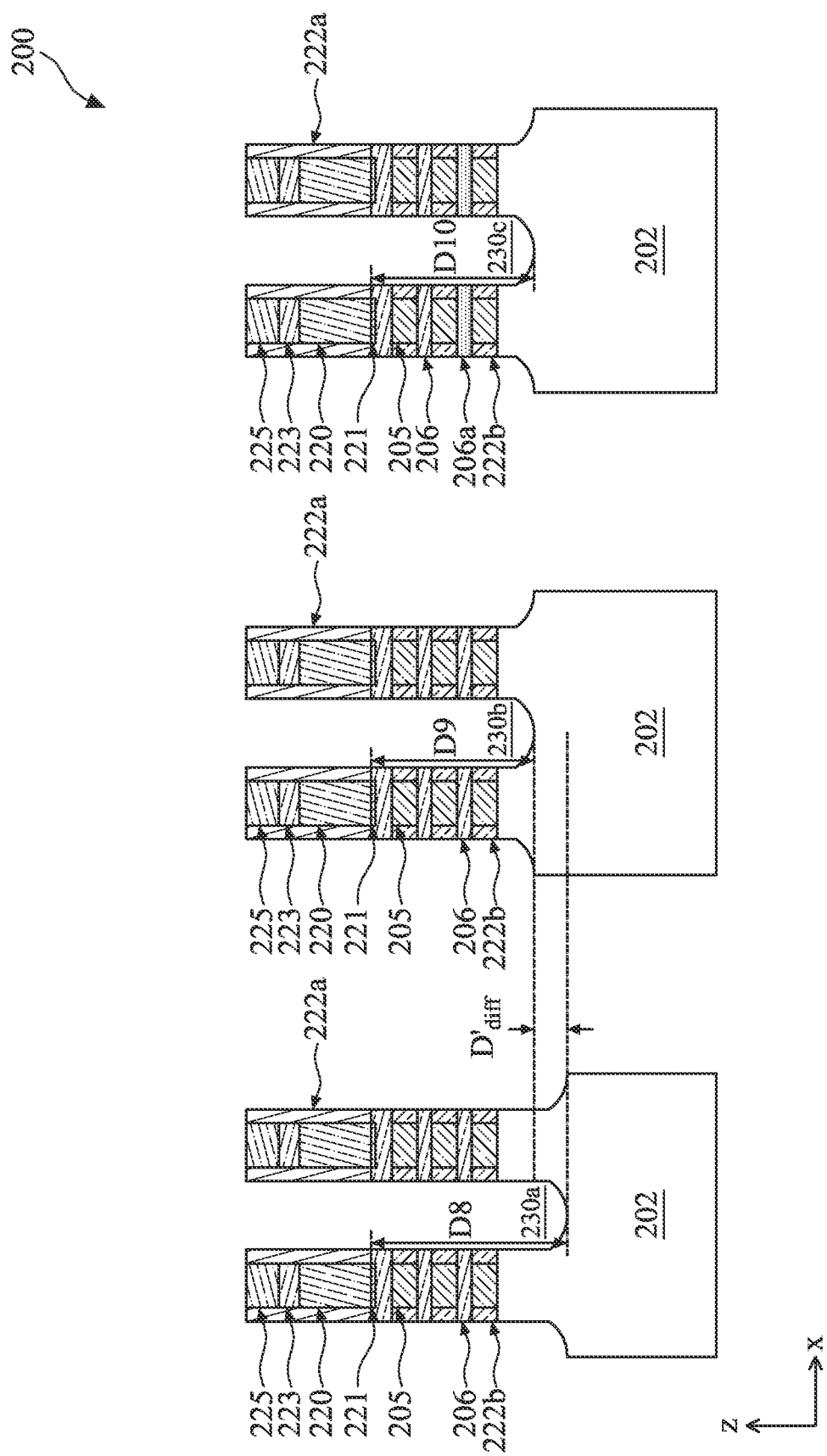
Figures 31A, 31B, 31C:
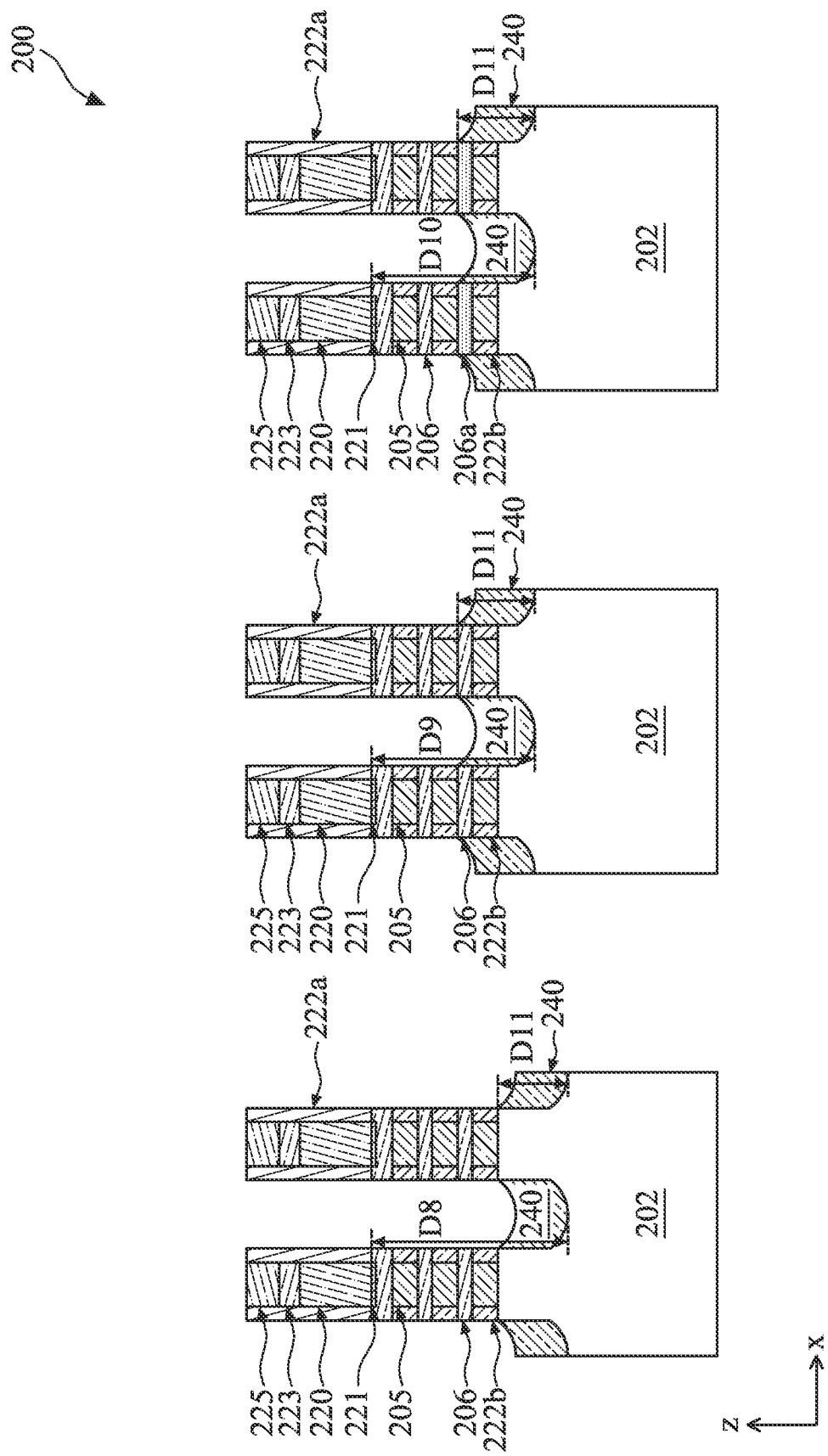
Figures 34A, 34B, 34C:
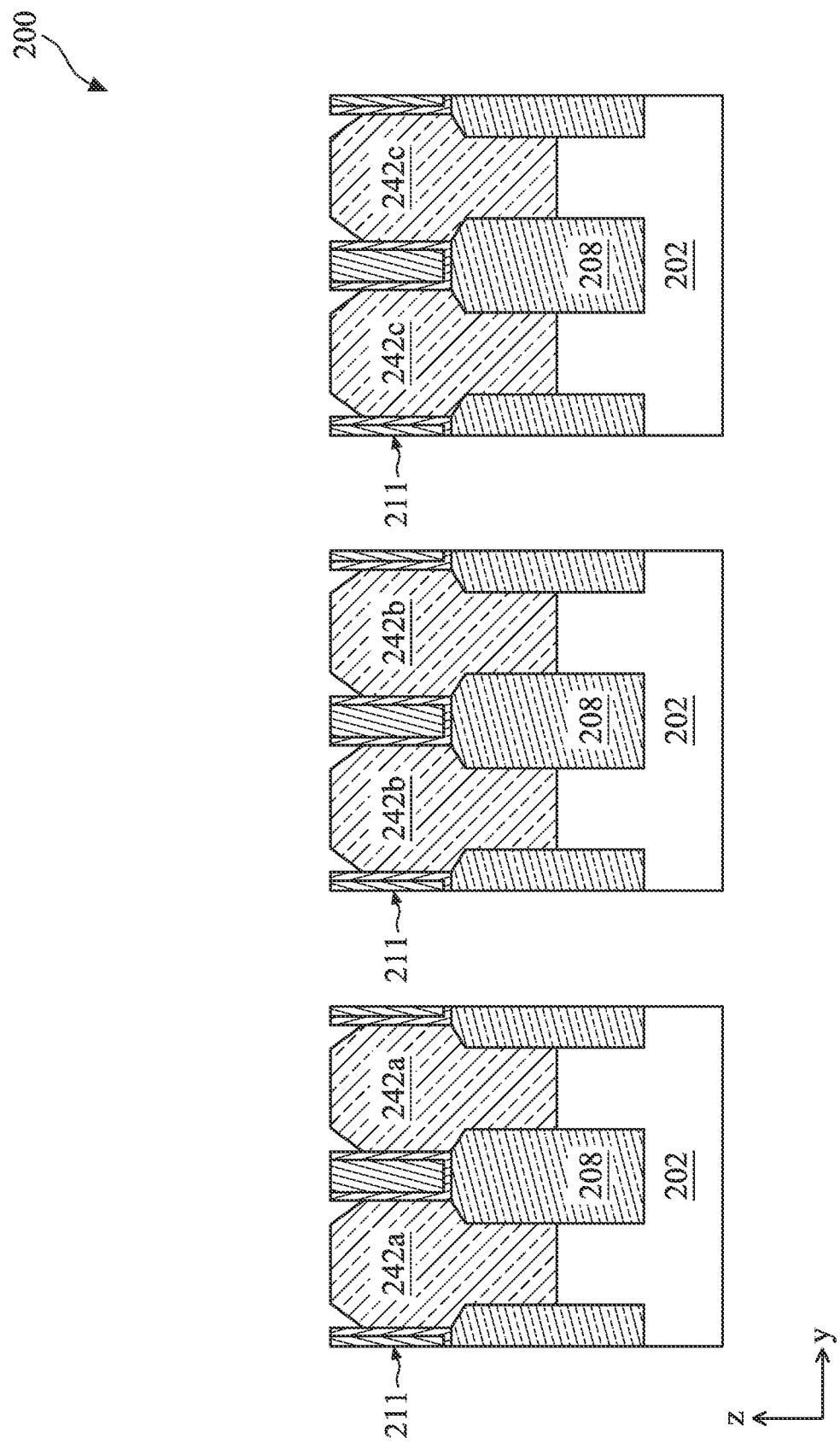

Now referring to FIGS. 1E and 26A-26C, method 500 at operation 502 performs an etching process 616 to selectively remove portions of the fins 204b and 204c to form S/D recesses 230b and 230c, respectively. In the present embodiments, referring to FIG. 26A, method 500 implements a patterned masking element 236 over a portion of the region 202a to protect the fins 204a from being etched. The patterned masking element 236 may be similar to the patterned masking element 207 discussed in detail above. The etching process 616 is similar to the etching process 604 in that it is configured to selectively remove the ML and the cladding layers 210 without removing, or substantially removing, the surrounding dielectric components. In the present embodiments, the S/D recesses 230b are defined by a depth (D9 as depicted in FIG. 29B) that is substantially the same as a depth (D10 as depicted in FIG. 29C) of the S/D recesses 230c. After forming the S/D recesses 230b and 230c, method 100 removes the patterned masking element 236 by any suitable method, such as plasma ashing and/or resist stripping.

Referring to FIGS. 27A-27C, method 500 at operation 504 performs an etching process 618 to selectively remove portions of the fins 204a in the region 202a to form S/D recesses 230a. In the present embodiments, referring to FIGS. 27B and 27C, method 100 implements a patterned masking element 238, which may be similar to the patterned masking element 207, over a portion of the region 202a and the region 202b to protect the S/D recesses 230b and 230c from being further etched. The etching process 618 is similar to the etching process 608 in that it is configured to selectively remove the ML and the cladding layers 210 without removing, or substantially removing, the surrounding dielectric components. In the present embodiments, the S/D recesses 230a are defined by a depth D8 as depicted in FIG. 29A, where the depth D8 is greater than the depths D9 and D10. After forming the S/D recesses 230a, referring to FIGS. 28A-28C, method 500 removes the patterned masking element 238 by any suitable method, such as plasma ashing and/or resist stripping.

Similar to the discussion of method 400 above, the etching process 618 is implemented with etching parameters different from those of the etching process 616 to ensure that the depth of the resulting S/D recesses 230a is greater than the depths of the S/D recesses 230b and 230c. In some embodiments, the duration of the etching process 618 is greater than that of the etching process 616 with all other parameters being held constant. In some embodiments, the voltage bias applied during the etching process 618 is greater than that of the etching process 616 with all other parameters being held constant. Although not discussed specifically, other etching parameters may also be adjusted to ensure that the S/D recesses 230a are deeper than the S/D recesses 230b and 230c.

In the present embodiments, referring to FIGS. 28A-29C, a difference $D'_{diff}$ in depths of the S/D recesses 230a and 230b (or 230c) is measured between a bottom surface of the S/D recess 230a and a bottom surface of the S/D recess 230b (or 230c). In some embodiments, a ratio of the depth $D'_{diff}$ to the depth D8 is about 0.1 to about 0.4 and a ratio of the depth $D'_{diff}$ to the depth D9 is about 0.1 to about 0.5 In some examples, the depth $D'_{diff}$ may be about 10 nm to about 30 nm.

Referring to FIGS. 29A-29C, method 500 at operation 506 forms the inner gate spacers 222b in the S/D recesses 230a-230c in a series of processes similar to that discussed above with respect to operation 304.

Subsequently, referring to FIGS. 30A-31C, method 500 at operation 508 forms a buffer layer 240 to partially fill the S/D recesses 230a-230c in a deposition process 620. Details of the buffer layer 240 and the method of forming it have been discussed above with respect to operation 408. In the present embodiments, the deposition process 620 is controlled such that the buffer layer 240 does not completely fill the S/D recesses 230a-230c, i.e., the thickness D11 is less than the depths D8, D9, and D10. For embodiments in which the number M of the APT layer 206a is less than the number (N-M) of the un-doped channel layers 206 formed thereover, such as that depicted herein, the thickness D11 is less than about half of the depth D10. Alternatively, for embodiments in which the number M of the APT layer 206a is greater than the number (N-M) of the un-doped channel layers 206 formed thereover, the thickness D11 is greater than about half of the depth D10. In some embodiments, the depth D11 is no greater than the depth $D'_{diff}$. In some examples, the depth D11 may be about 5 nm to about 30 nm.

Referring to FIGS. 32A-33C, method 500 at operation 510 forms doped semiconductor layers 246a, 246b, and 246c over the buffer layer 240 in an epitaxial process 622, resulting in epitaxial S/D features 247a, 247b, and 247c, respectively. Details of the doped semiconductor layers 246a-246c and the method of forming them are similar to those of the doped semiconductor layers 244a-244c and have been discussed above with respect to operation 410.

In contrast to the embodiments depicted in FIGS. 33A-33C, the epitaxial S/D features 242a-242c depicted in FIGS. 17A-17C are each free of any un-doped buffer layer. In this regard, the effective overlapping area in the epitaxial S/D features 247b and 247c is defined by the depth $D9_{eff}$ and $D10_{eff}$, respectively, and the effective overlapping area in the epitaxial S/D feature 247a is defined by the depth $D8_{eff}$, which is greater than the depths $D9_{eff}$ and $D10_{eff}$. As depicted herein, the depths $D8_{eff}$, $D9_{eff}$, and $D10_{eff}$ also define the thicknesses of the semiconductor layers 246a, 246b, and 246c, respectively. Similar to the embodiment depicted in FIG. 25C, the semiconductor layer 246c does not, or at least not substantially, overlap with the APT layer 206a. Furthermore, referring to FIGS. 33A and 33B, although the epitaxial S/D features 247a and 247b engage with the same number of channel layers 206, their effective overlapping areas are different due to difference in depths of the S/D recesses as well as the presence of the un-doped buffer layer 240, which together result in a difference between the depths $D8_{\textit{eff}}$ and $D9_{\textit{eff}}$.

After forming the epitaxial S/D features (242a-242c, 245a-245c, or 247a-247c) in the fins 204a-204c, method 100 proceeds to operation 122 as depicted in FIG. 1B. For purposes of simplicity, subsequently operations of method 100, i.e., operations 122 to 136, are discussed using the embodiments depicted in FIGS. 16A-17C as examples. Of course, these operations are equally applicable to the embodiments depicted in FIGS. 24A-25C and 32A-33C.

Now referring to FIGS. 1B and 34A-34C, method 100 at operation 122 removes portions of the dielectric helmet 214 exposed in S/D regions of the fins 204a-204c. In the present embodiments, method 100 implements a selective etching process (such as a dry etching process) to remove portions of the dielectric helmet 214 without removing, or substantially removing, the epitaxial S/D features 242a-242c.

Figure 35C:
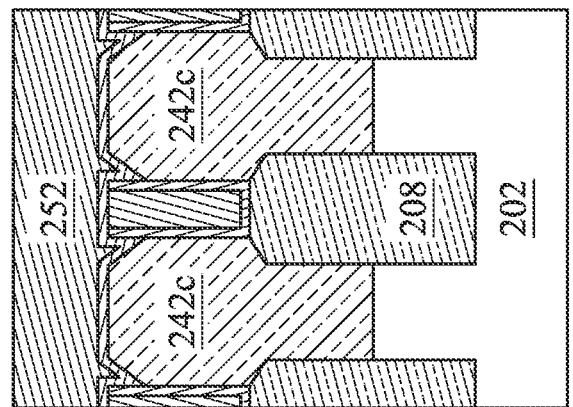
Figure 35B:
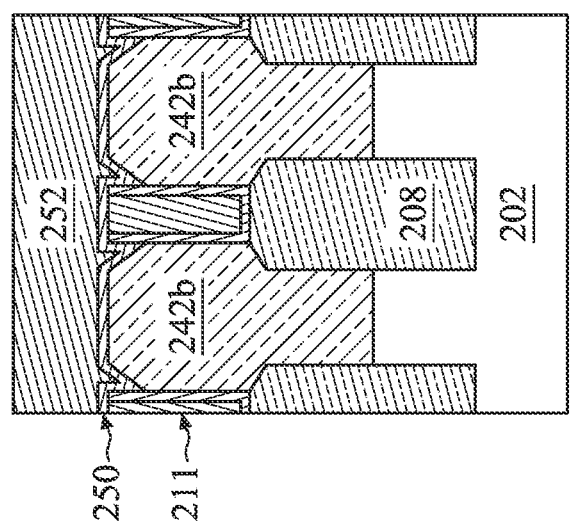
Figure 35A:
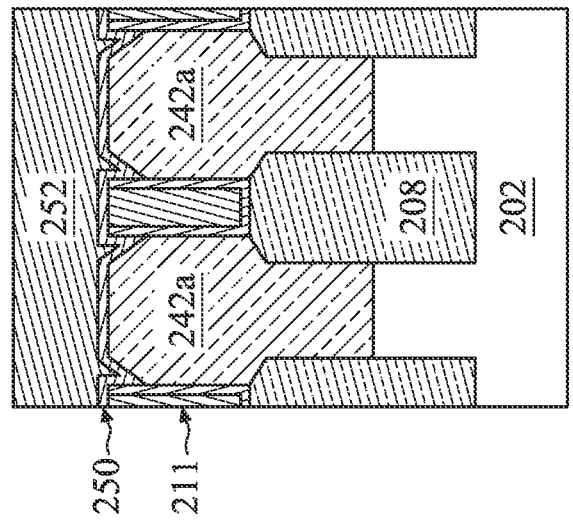

Thereafter, referring to FIGS. 35A-36C, method 100 at operation 124 removes the dummy gate stacks 220 (and the interfacial layer 221) from the structure 200. Referring to FIGS. 35A-35C, method 100 first forms an etch-stop layer (ESL) 250 over the structure 200 to protect the underlying components, such as the epitaxial S/D features 242a-242c, during subsequent fabrication processes. The ESL 250 may include any suitable dielectric material, such as SiN, SiCN, SiON, $Al_2O_3$, other suitable materials, or combinations thereof, and may be formed by CVD, ALD, PVD, other suitable methods, or combinations thereof. In the present embodiments, the ESL 250 provides etching selectivity with respect to its surrounding dielectric components to ensure protection against inadvertent damage.

Subsequently, method 100 forms an interlayer dielectric (ILD) layer 252 over the ESL 250, thereby filling the space between adjacent dummy gate stacks 220. The ILD layer 252 may include silicon oxide, a low-k dielectric material, TEOS, doped silicon oxide (e.g., BPSG, FSG, PSG, BSG, etc.), other suitable dielectric materials, or combinations thereof, and may be formed by any suitable method, such as CVD, FCVD, SOG, other suitable methods, or combinations thereof. Method 100 subsequently performs one or more CMP process to expose top surfaces of the dummy gate stacks 220.

Figure 36A:
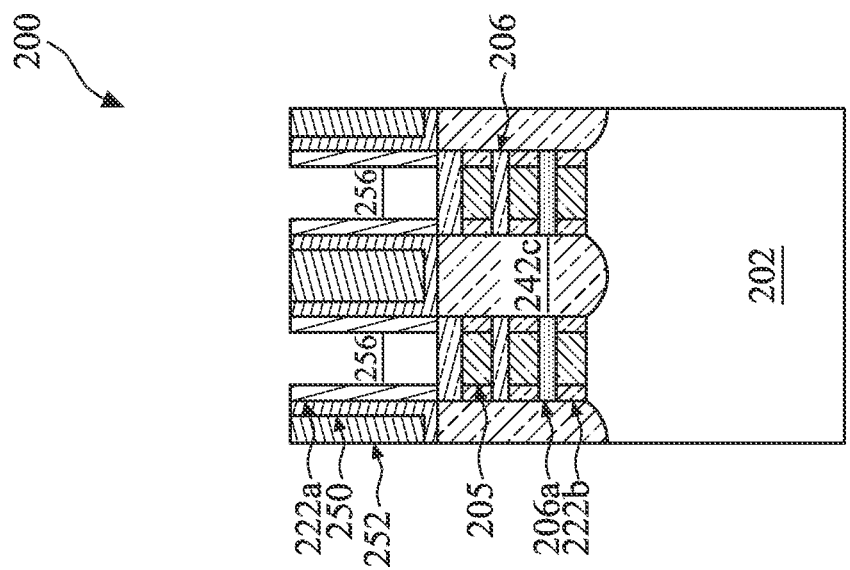
Figure 36B:
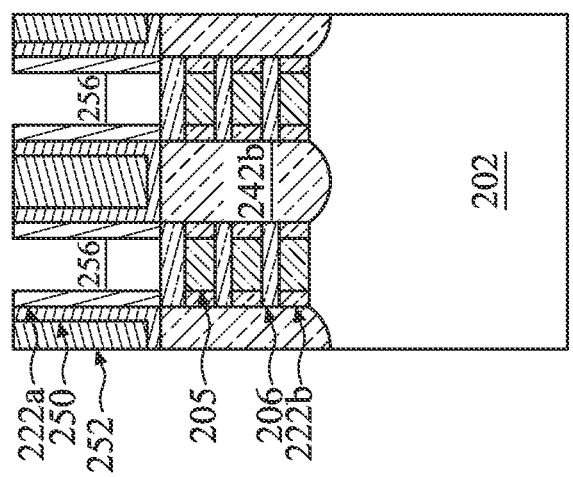
Figure 36C:
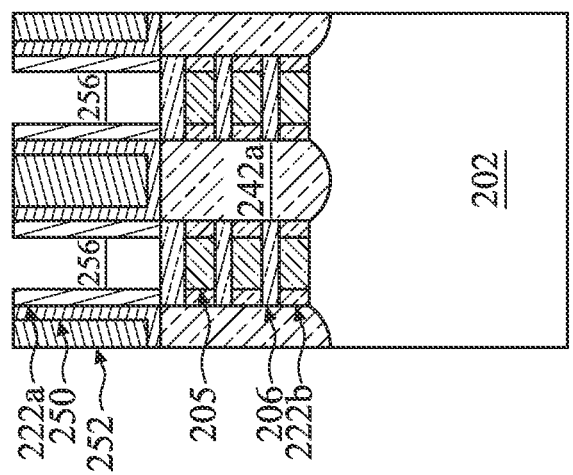
Figure 38C:
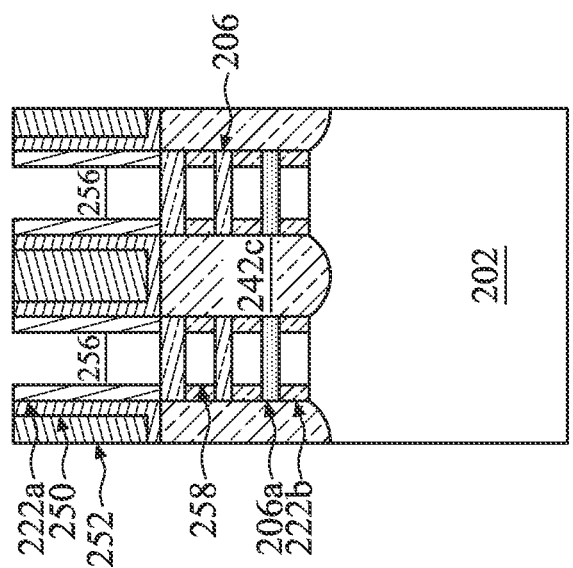
Figure 38B:
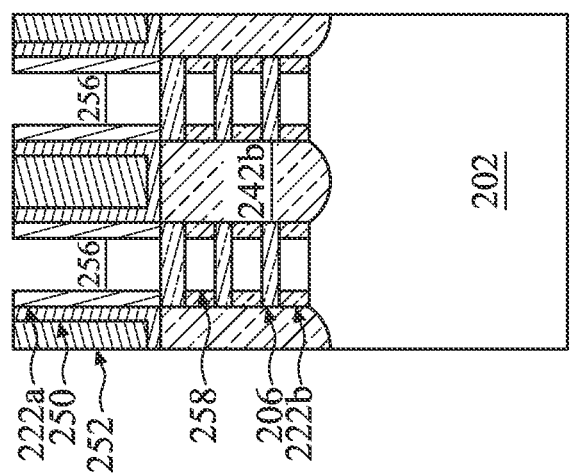
Figure 38A:
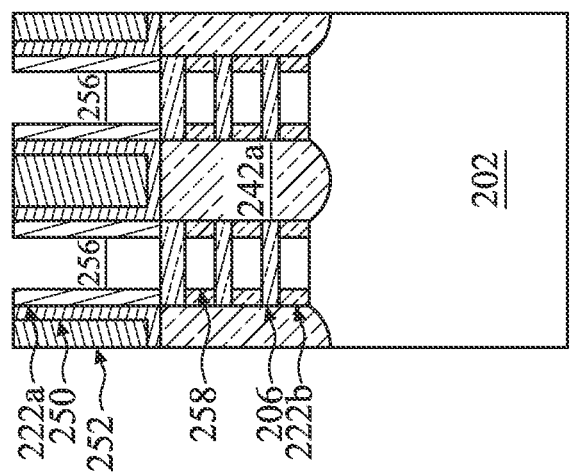
Figures 39A, 39B, 39C:
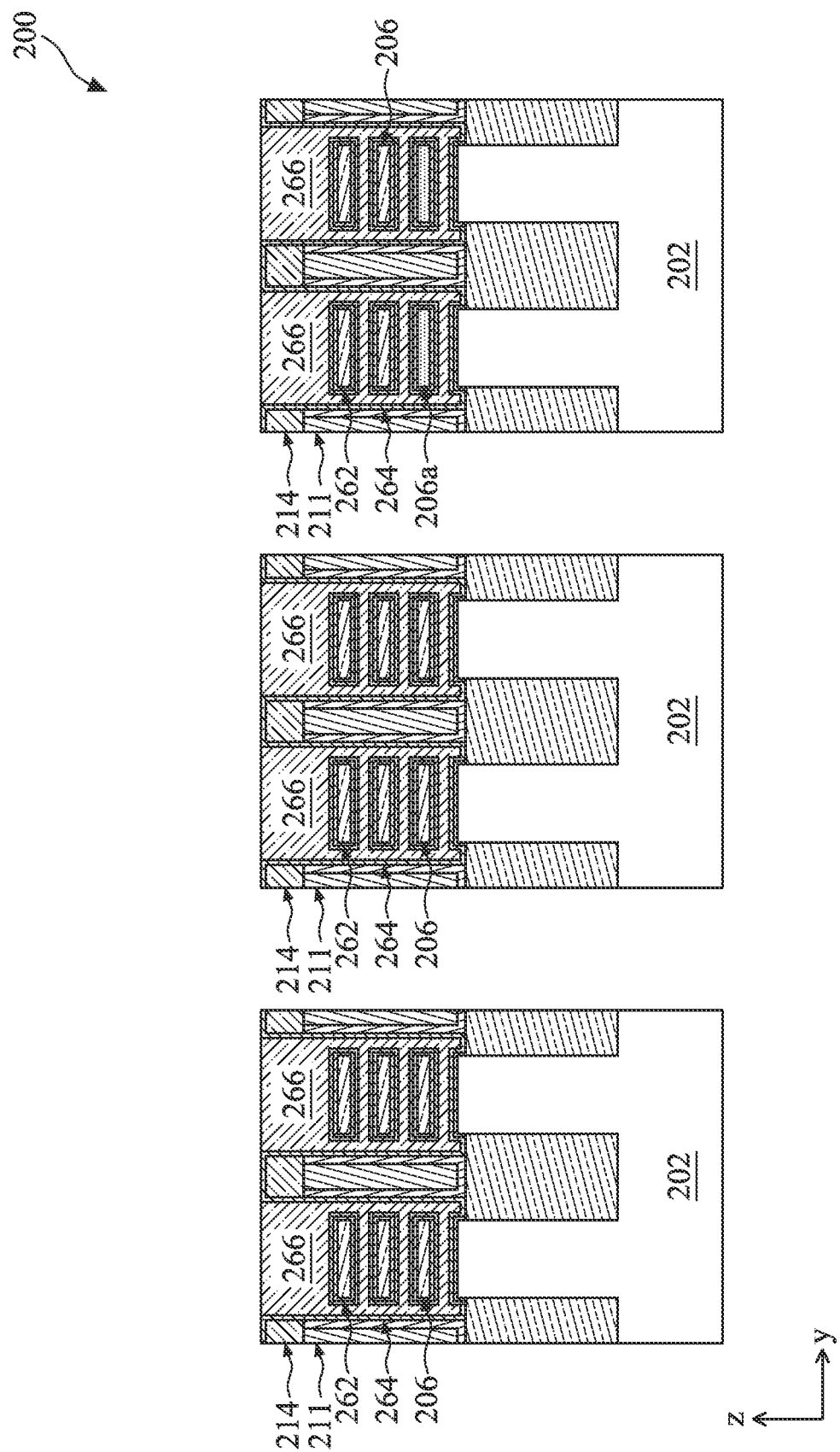
Figure 40C:
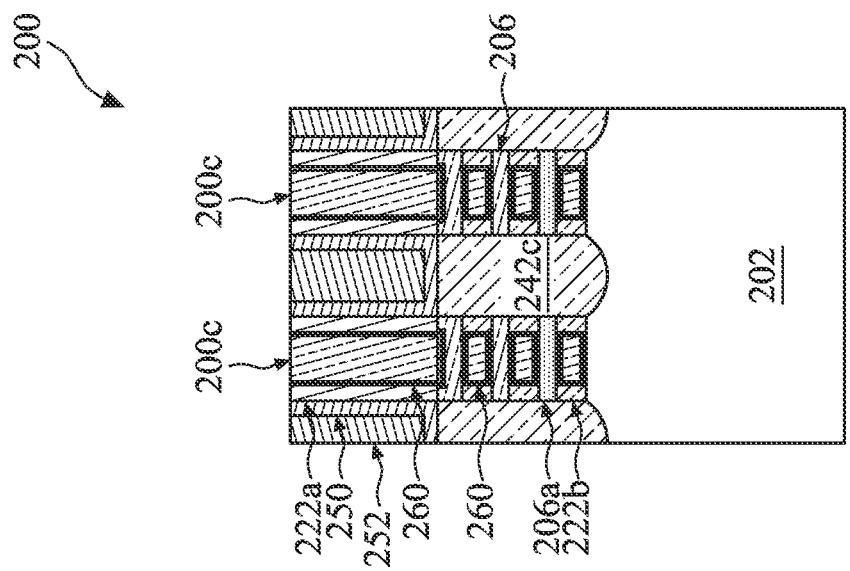
Figure 40B:
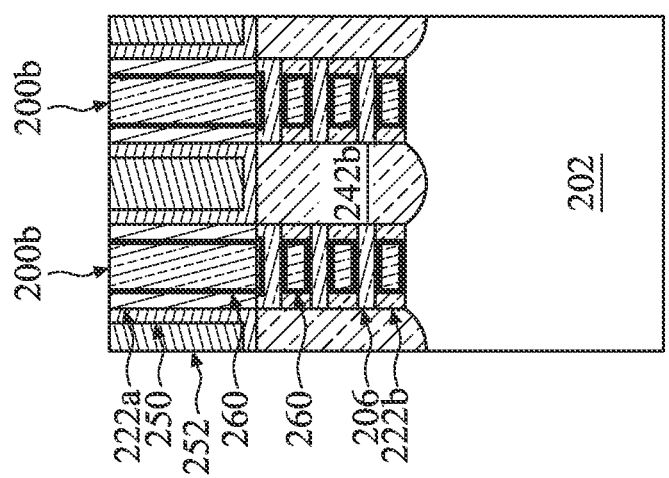
Figure 40A:
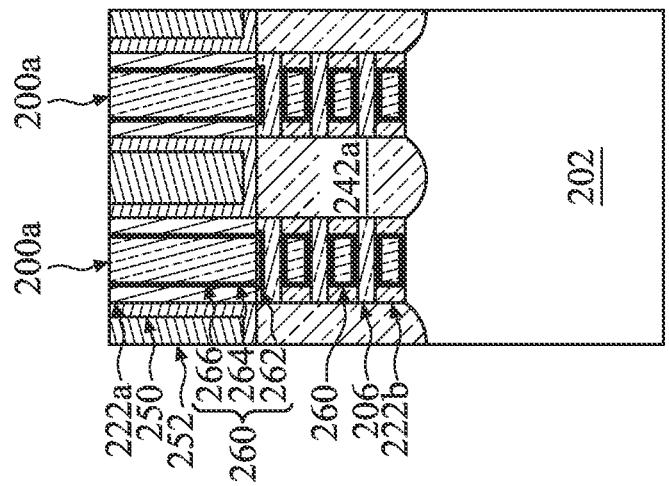
Figures 41A, 41B, 41C:
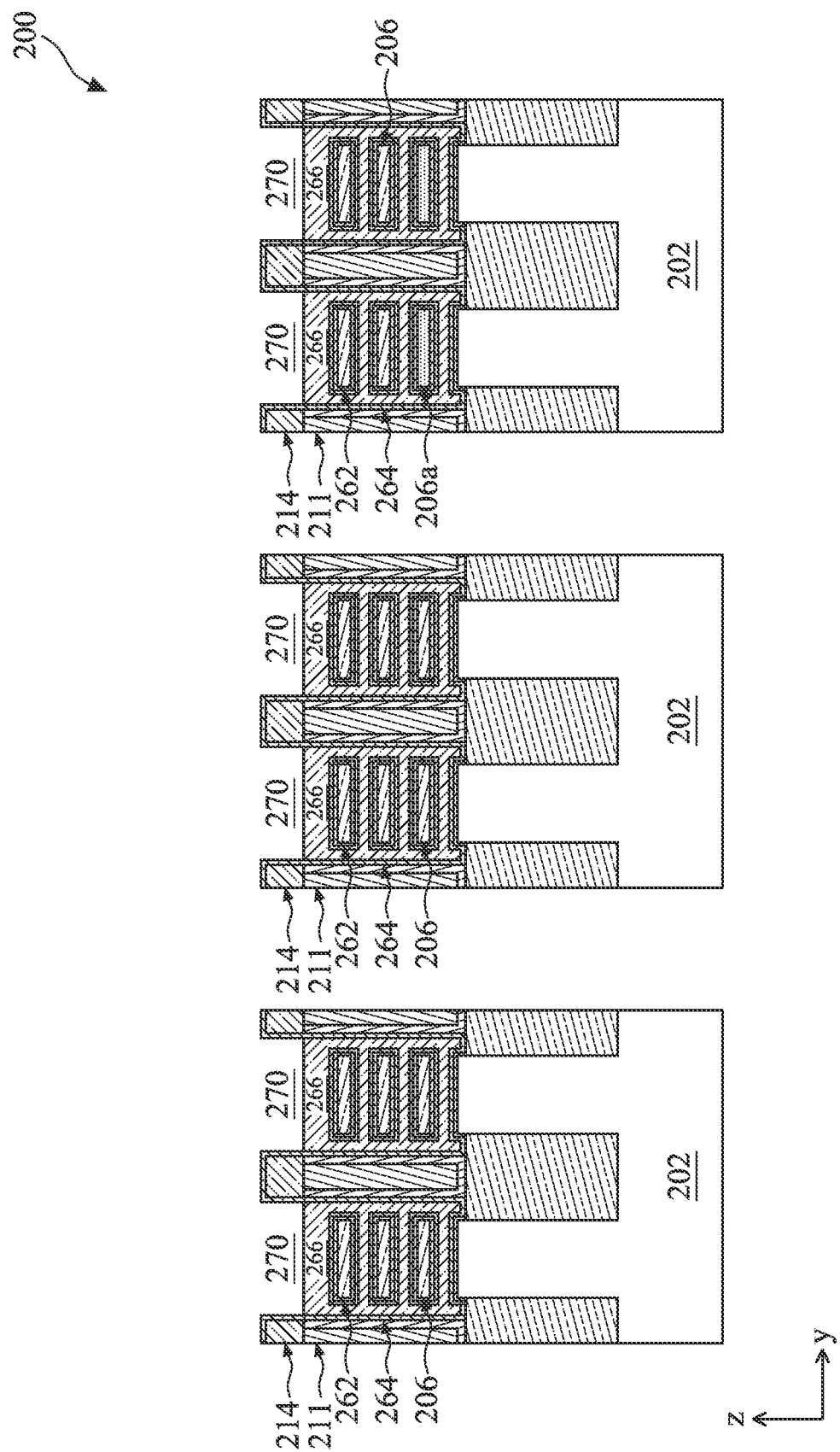
Figure 42C:
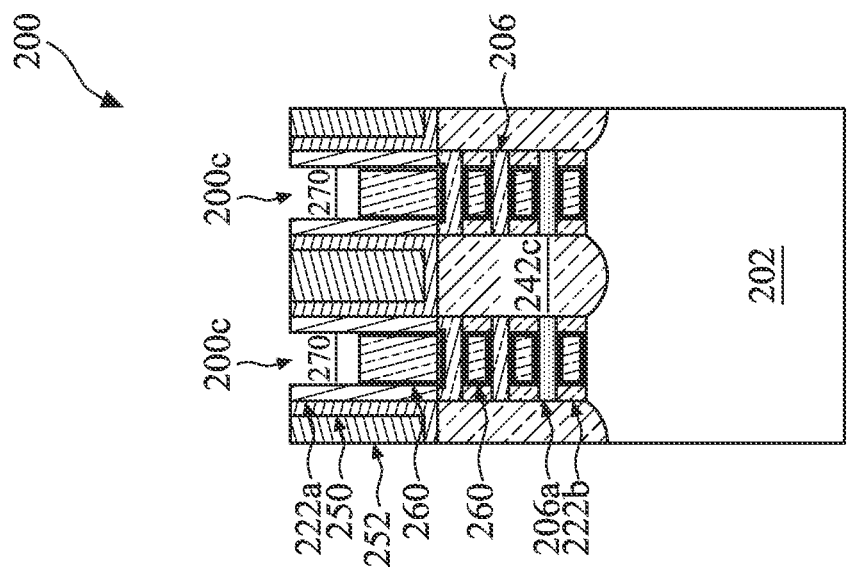
Figure 42B:
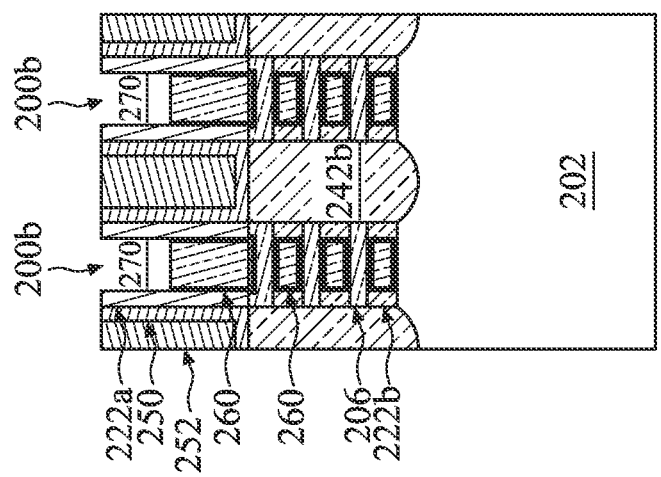
Figure 42A:
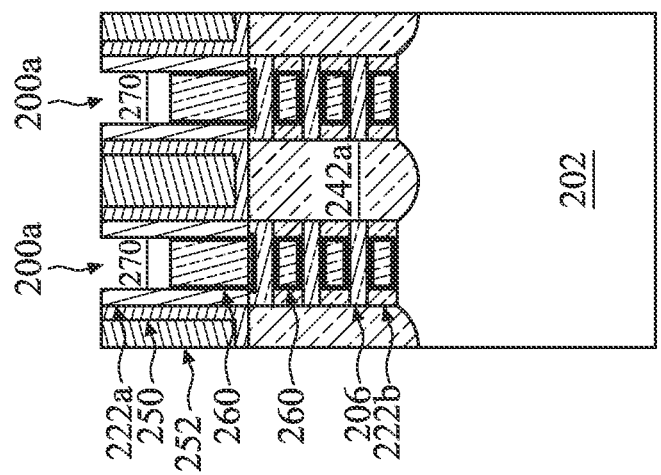
Figures 43A, 43B, 43C:
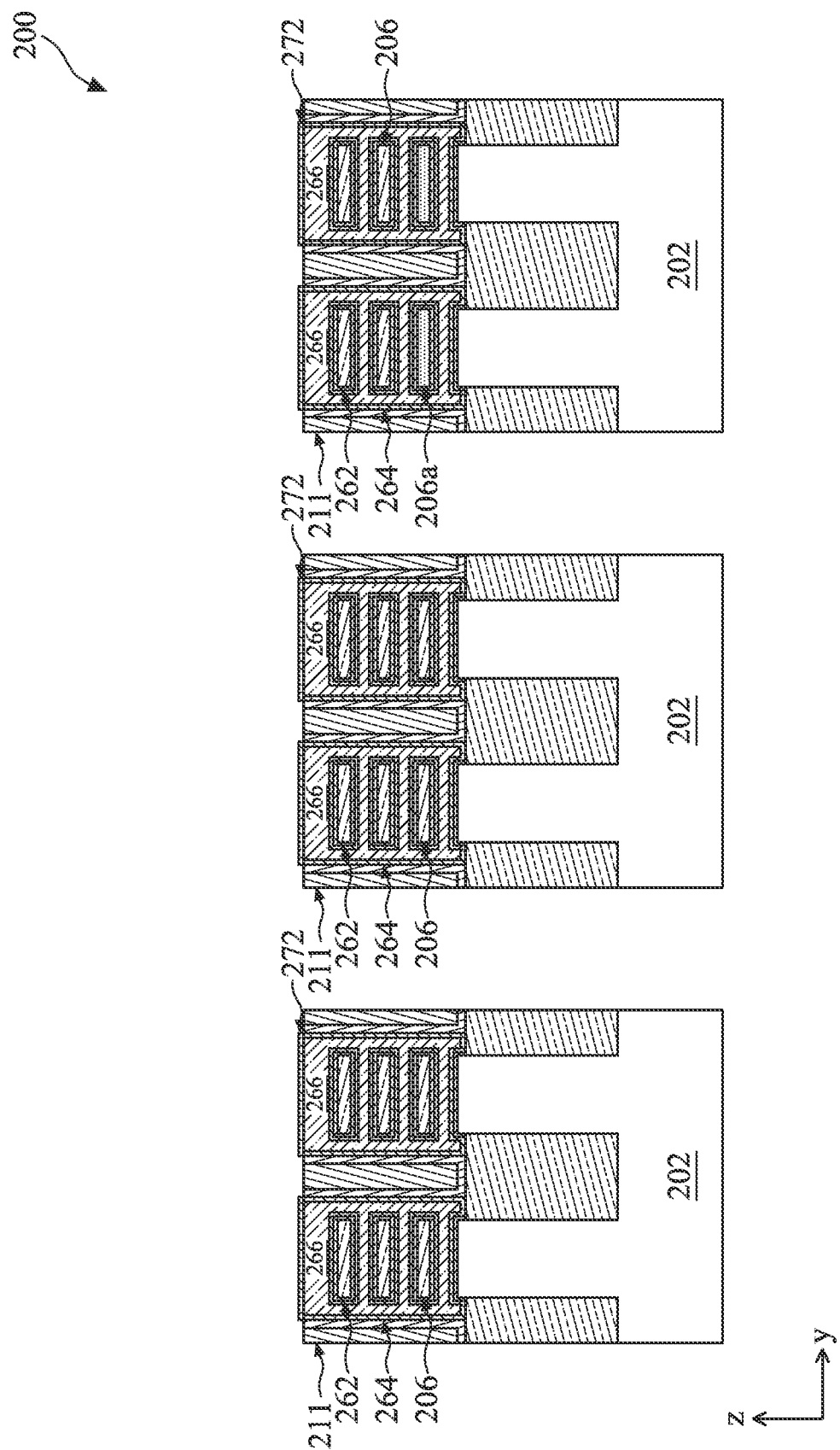
Figures 44A, 44B, 44C:
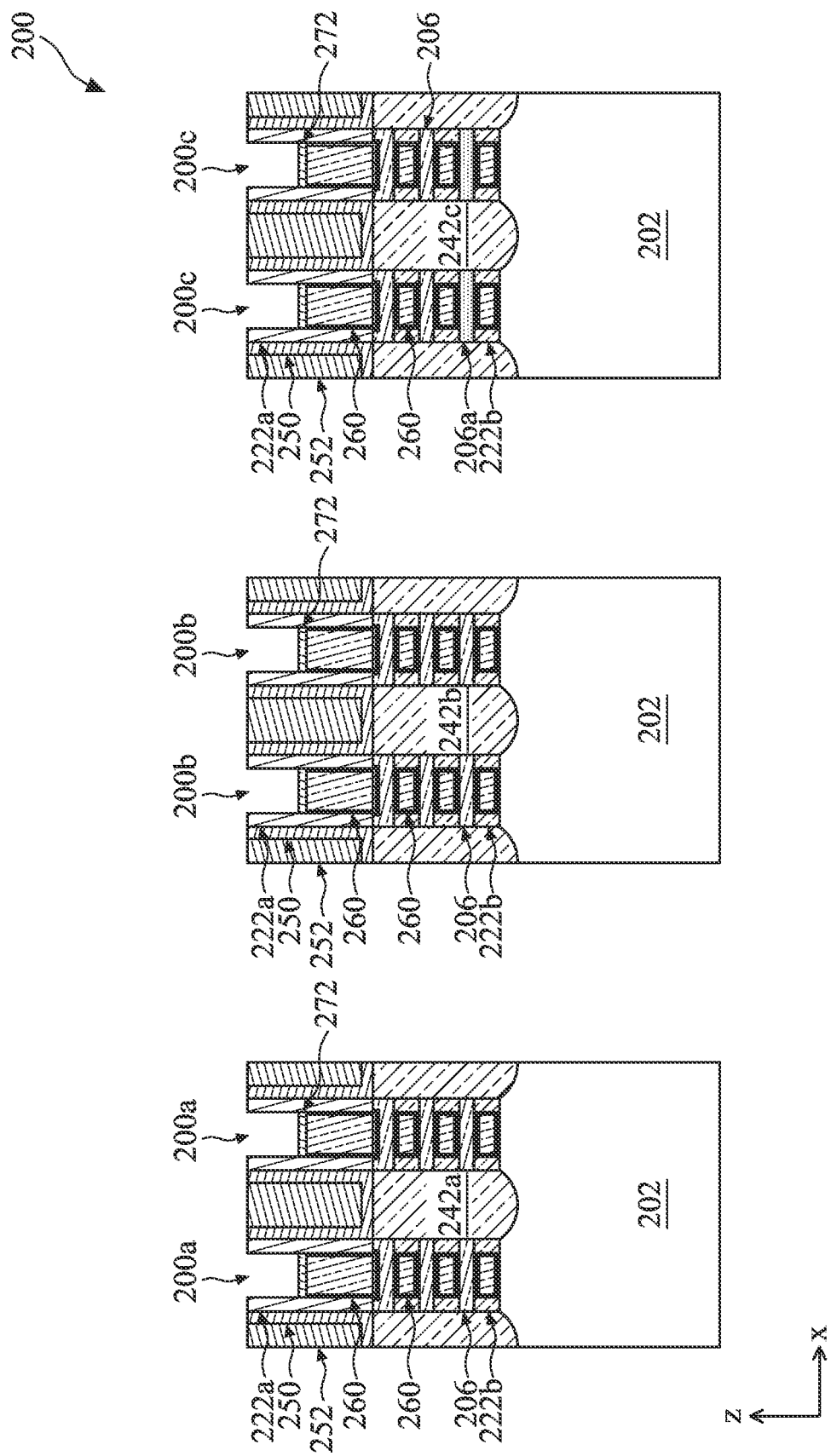

Referring to FIGS. 36A-36C, method 100 then removes the dummy gate stacks 220 from the structure 200 to form gate trenches 256 in an etching process. In the present embodiments, method 100 selectively removes the dummy gate stacks 220 (including the interfacial layer 221) without removing, or substantially removing, the channel layers 206 and the surrounding dielectric components. The etching process may include any suitable process, such as a dry etching process, a wet etching process, an RIE, or combinations thereof.

In some embodiments, though not depicted herein, method 100 optionally patterns the dielectric helmet 214 remaining in the channel regions of the fins 204a-204c to form gate isolation features for separating the subsequently-formed metal gate stack. The patterning process may include forming a patterned masking element over the structure 200 to expose portions of the dummy gate stack 220, removing the exposed portions of the dummy gate stack 220, thereby exposing portions of the underlying dielectric helmet 214, and removing the exposed portions of the dielectric helmet 214. After removing the patterned masking element, the remaining portions of the dielectric helmet 214 become the gate isolation features for the subsequently-formed metal gate stack. In alternative embodiments, as will be discussed in detail below, the dielectric helmet 214 are removed in its entirety at a subsequent operation and gate isolation features are formed separately after forming the metal gate stack.

At operation 126, referring to FIGS. 37A-38C, method 100 removes the non-channel layers 205 from the ML to form openings 258 between the channel layers 206 in a sheet formation, or sheet release, process. In the present embodiments, the sheet formation process further removes the remaining cladding layer 210, which has a composition similar to or the same as that of the non-channel layers 205, to form trenches 259 along the sidewalls of the fins 204a-204c. The sheet formation process is configured to selectively remove the non-channel layers 205 and the cladding layer 210 without removing, or substantially removing, the channel layers 206 or any other surrounding components of the structure 200. In other words, the openings 258 are interleaved with the channel layers 206. In some embodiments, the sheet formation process is implemented in a series of etching and trimming processes. In one example, a wet etching process employing an oxidant (or oxidizer) such as ozone ($O_3$; dissolved in water), nitric acid ($HNO_3$), hydrogen peroxide ($H_2O_2$), other suitable oxidants, and a fluorine-based etchant such as hydrofluoric acid (HF), ammonium fluoride ($NH_4F$), other suitable etchants, or combinations thereof may be performed to selectively remove the non-channel layers 205.

At operation 128, referring to FIGS. 39A-40C, method 100 forms a metal gate stack 260 in the gate trenches 256, the openings 258, and the trenches 259, such that the metal gate stack 260 contacts the sidewalls of the fins 204a-204c and wraps around (or interleaved with) each channel layer 206. As depicted herein, the metal gate stack 260 engages with the fins 204a, 204b, and 204c to form NS FETs 200a, 200b, and 220c, respectively.

In the present embodiments, the metal gate stack 260 includes an interfacial layer 262, a gate dielectric layer 264 over the interfacial layer 262, and a metal gate electrode 266 over the gate dielectric layer 264. Composition of the interfacial layer 262 may be similar to that of the interfacial layer 221. In the present embodiments, the gate dielectric layer 264 includes a high-k dielectric material, such as $HfO_2$, $La_2O_3$, other suitable materials, or combinations thereof, and the metal gate electrode 266 includes at least one work function metal layer (not depicted separately) and a bulk conductive layer (not depicted separately) disposed thereover. The work function metal layer may be a p-type or an n-type work function metal layer. Example work function metals include TiN, TaN, WN, $ZrSi_2$, $MoSi_2$, $TaSi_2$, $NiSi_2$, Ti, TaAl, TaAlC, TiAlN, TaC, TaCN, TaSiN, Mn, Zr, other suitable work function metals, or combinations thereof. The bulk conductive layer may include copper (Cu), tungsten (W), aluminum (Al), cobalt (Co), ruthenium (Ru), other suitable materials, or combinations thereof. The metal gate stack 260 may further include other material layers (not depicted), such as a capping layer, a barrier layer, other suitable layers, or combinations thereof. Various layers of the metal gate stack 260 may be formed by various methods, including chemical oxidation, thermal oxidation, ALD, CVD, PVD, plating, other suitable methods, or combinations thereof. After forming the bulk conductive layer, one or more CMP processes are performed to remove excessive material formed on top surface of the ILD layer 252, thereby planarizing the structure 200.

At operation 130, referring to FIGS. 41A-42C, method 100 recesses the metal gate stack 260 in an etching process to form trenches 270. In the present embodiments, the etching process selectively removes the top portion of the metal gate stack 260, including at least portions of the gate dielectric layer 264 and the metal gate electrode 266, without removing, or substantially removing, the dielectric helmet 214 and other dielectric components nearby. The etching process may be implemented by any suitable method, including a dry etching process, a wet etching process, RIE, other suitable methods, or combinations thereof, utilizing one or more etchant configured to etch components of the metal gate stack 260. In the present embodiments, the etching process is controlled to recess the metal gate stack 260 such that a top surface of the recessed metal gate stack 260 is below a top surface of the dielectric helmet 214. In other words, the dielectric helmet 214 protrudes from the top surface of the recessed metal gate stack 260.

At operation 132, referring collectively to FIGS. 43A-48C, method 100 forms gate isolation features 274 configured to separate the metal gate stack 260. Referring to FIGS. 43A-44C, method 100 forms a metal layer 272 over the recessed metal gate stack 260 and the dielectric helmet 214. In some embodiments, the metal layer 272 includes titanium (Ti), titanium nitride (TiN), tantalum nitride (TaN), nickel (Ni), W, Ru, Al, Co, other suitable metals, or combinations thereof. The metal layer 272 may be deposited using CVD or metal organic chemical vapor deposition (MOCVD). In one embodiment, the metal layer 272 includes fluorine-free W and may be deposited using MOCVD. In some embodiments, the metal layer 272 is formed by a bottom-up scheme. Subsequently, method 100 remove the dielectric helmet 214 from the structure 200 in a selective etching process (such as a dry etching process or a wet etching process) configured to not remove, or not substantially remove, the dielectric feature 211 or the metal layer 272.

Figures 45A, 45B, 45C:
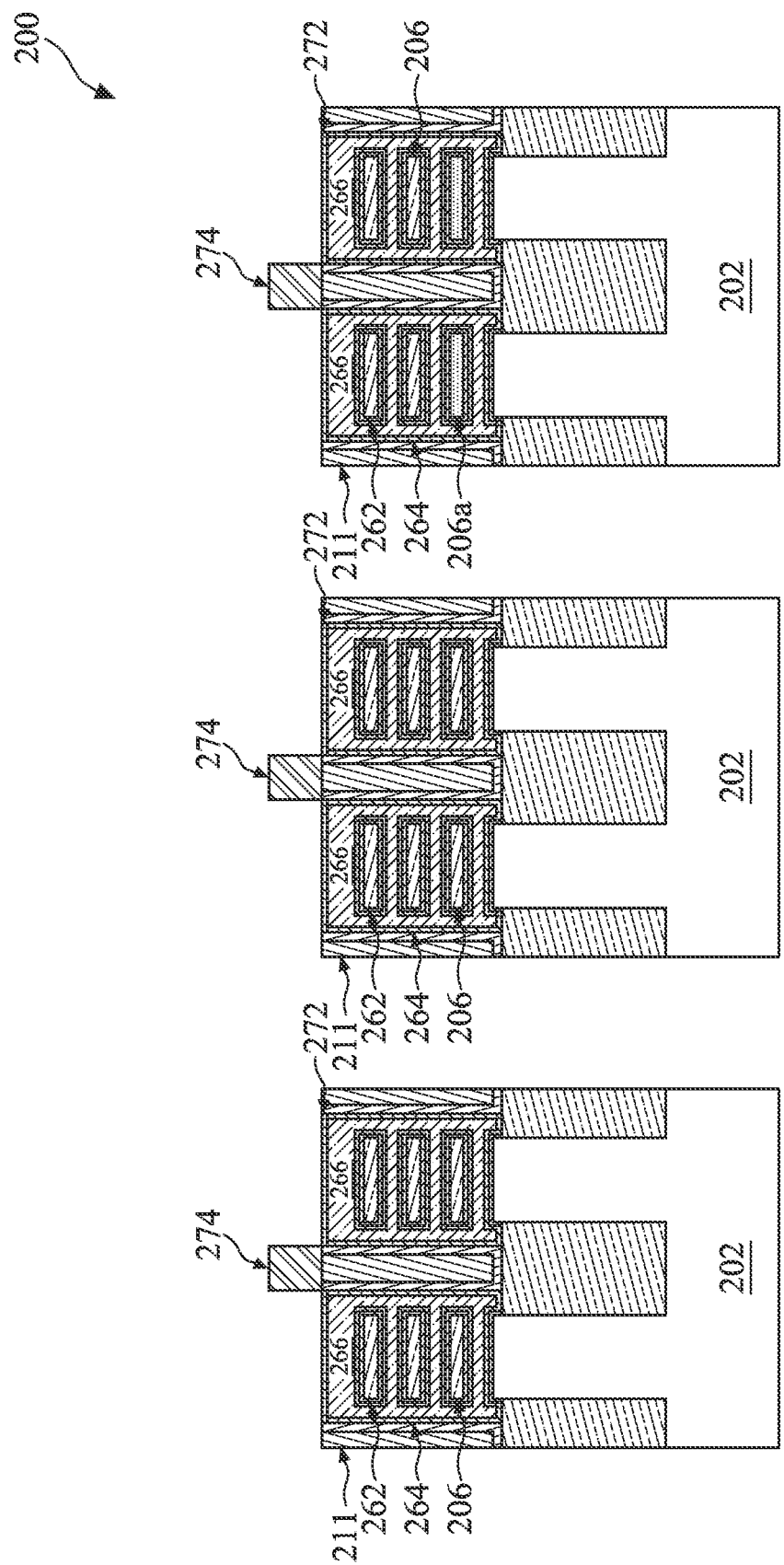

Referring to FIGS. 45A-45C, method 100 forms the gate isolation features 274 over at least some portions of the dielectric feature 211. The gate isolation features 274 may include any suitable material, such as SiN, SiCN, SiON, Al$_2$O$_3$, other suitable materials, or combinations thereof and may be formed by a series of deposition and patterning processes. For example, forming the gate isolation features 274 may include depositing a sacrificial layer (not depicted) over the metal layer 272, patterning the sacrificial layer to form openings configured for the gate isolation features 274, depositing a dielectric layer over the patterned sacrificial layer to fill the openings, planarizing the dielectric layer to form the gate isolation features 274, and selectively removing the sacrificial layer with respect to the gate isolation features 274. The sacrificial layer may include any suitable material, such as a photoresist layer, a BARC layer, a silicon layer, or other suitable material, so long as its composition differs from that of the gate isolation features 274 to ensure adequate etching selectivity therebetween.

Figures 46A, 46B, 46C:
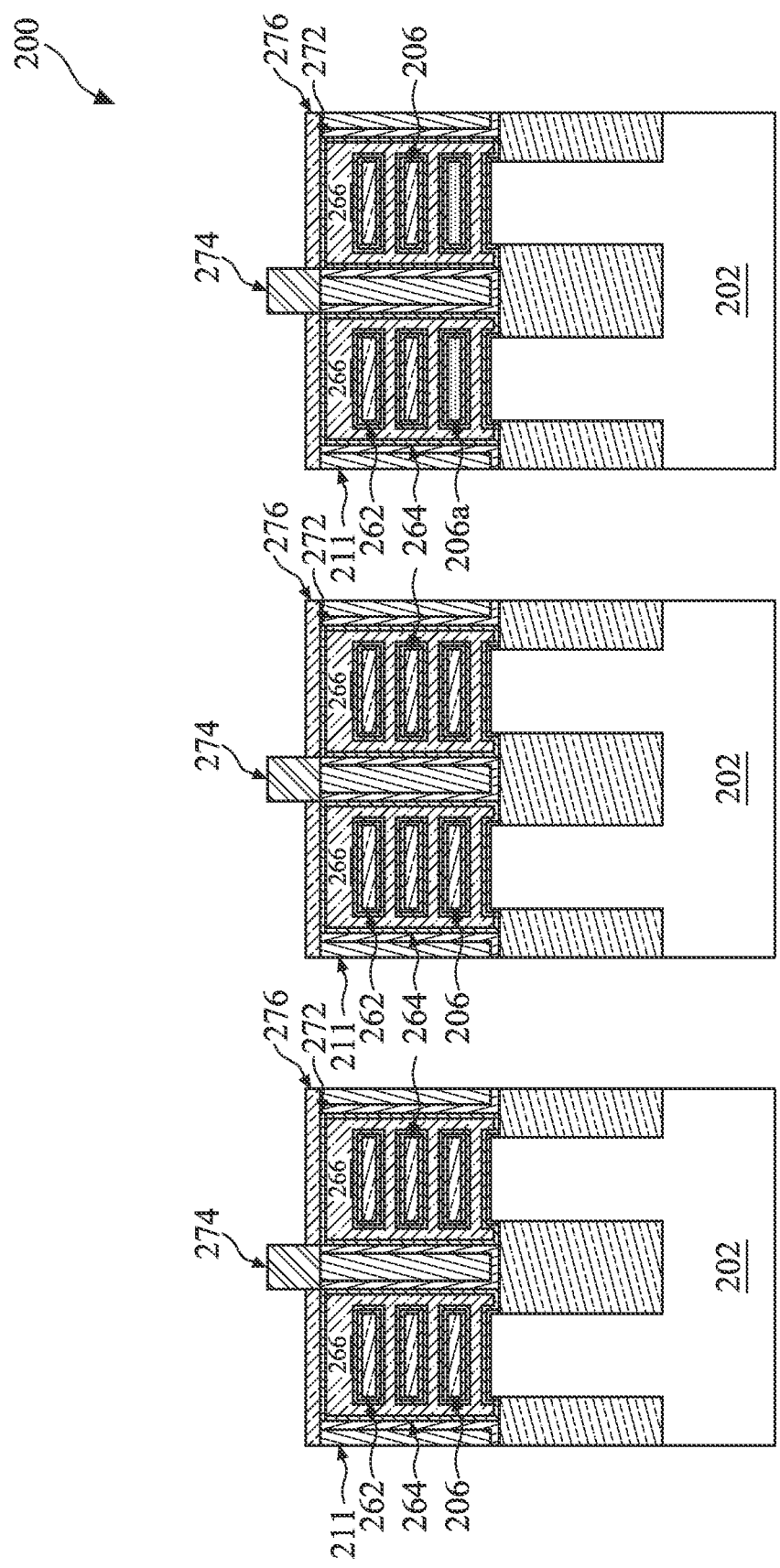
Figures 48A, 48B, 48C:
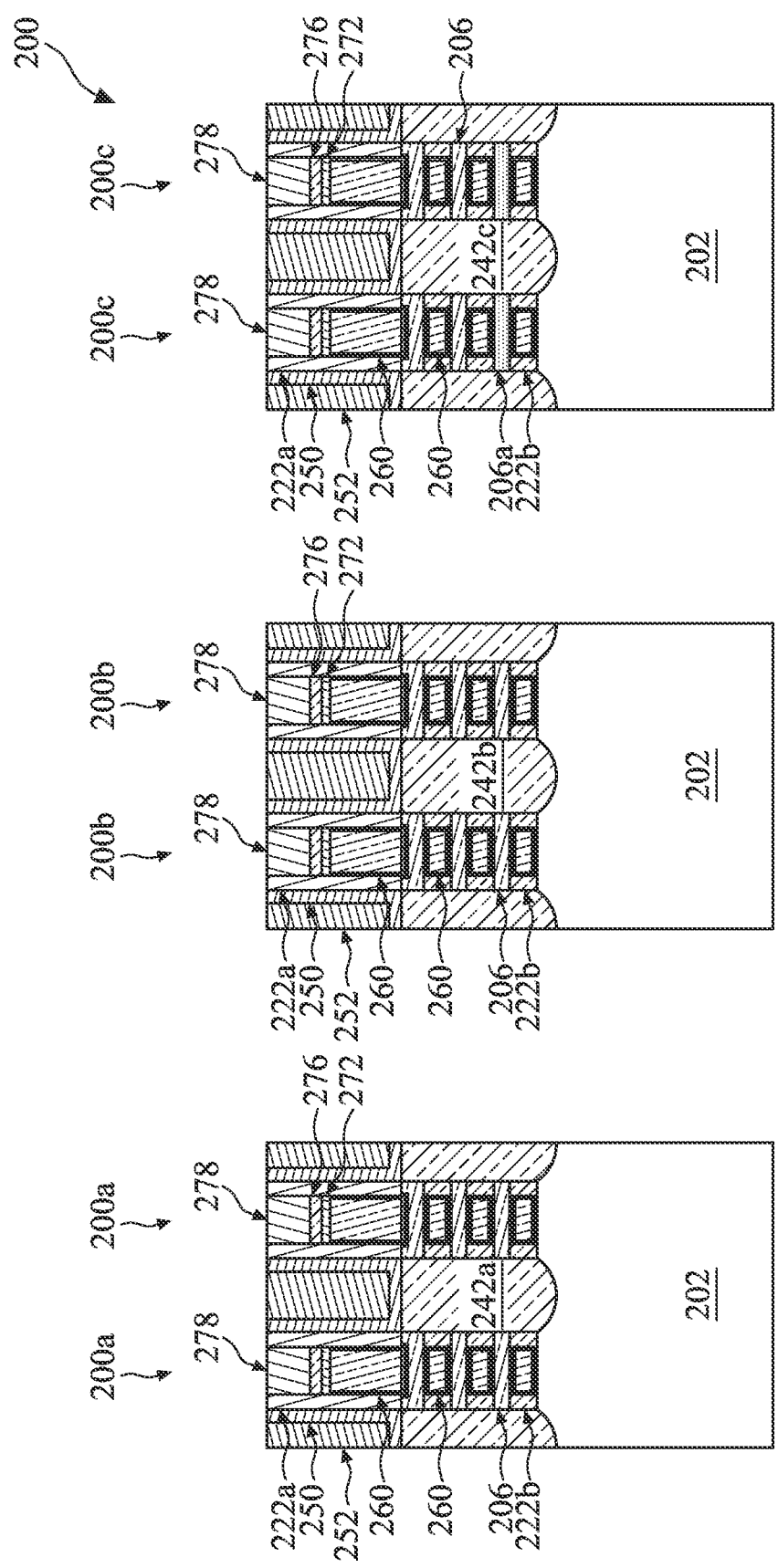
Figure 49C:
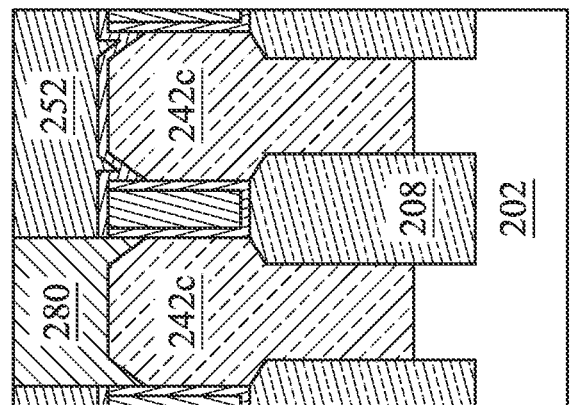
Figure 49B:
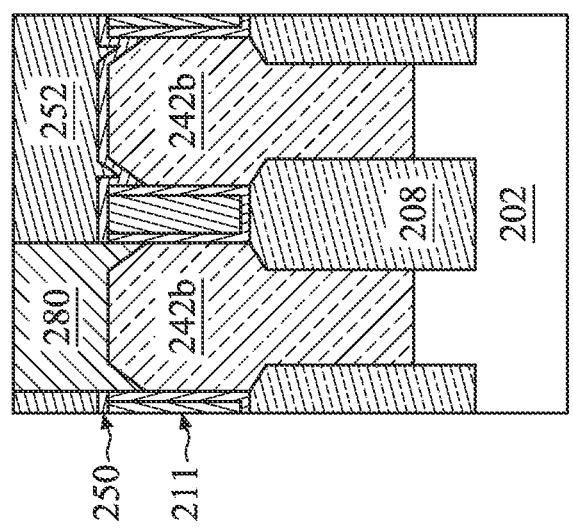
Figure 49A:
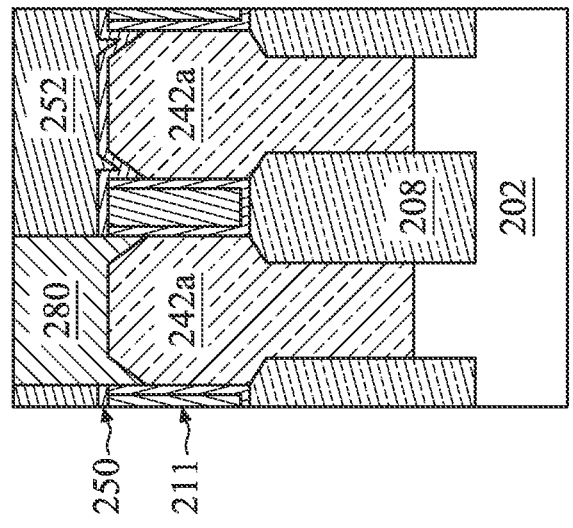
Figures 50A, 50B, 50C:
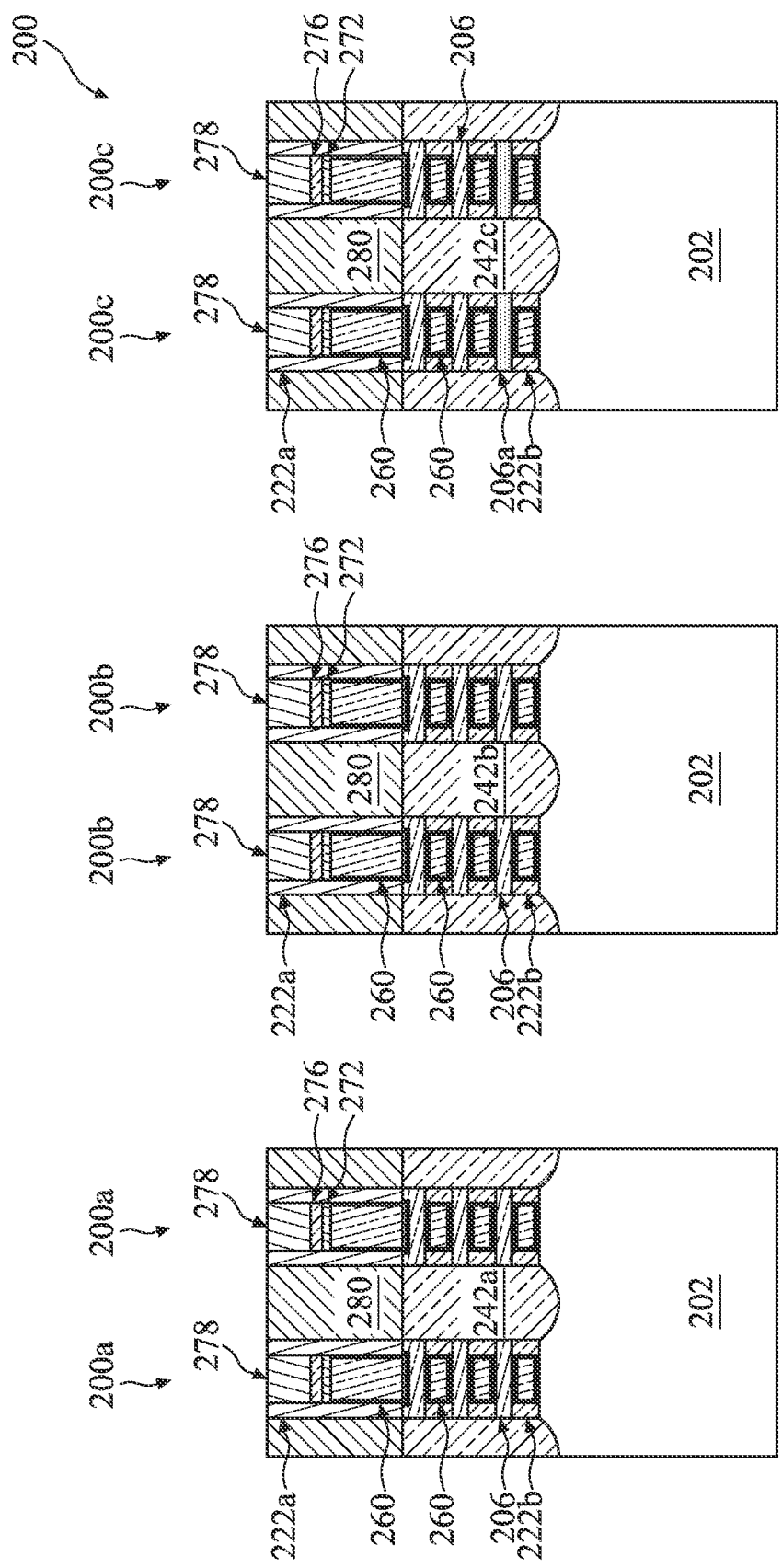
Figures 52A, 52B, 52C:
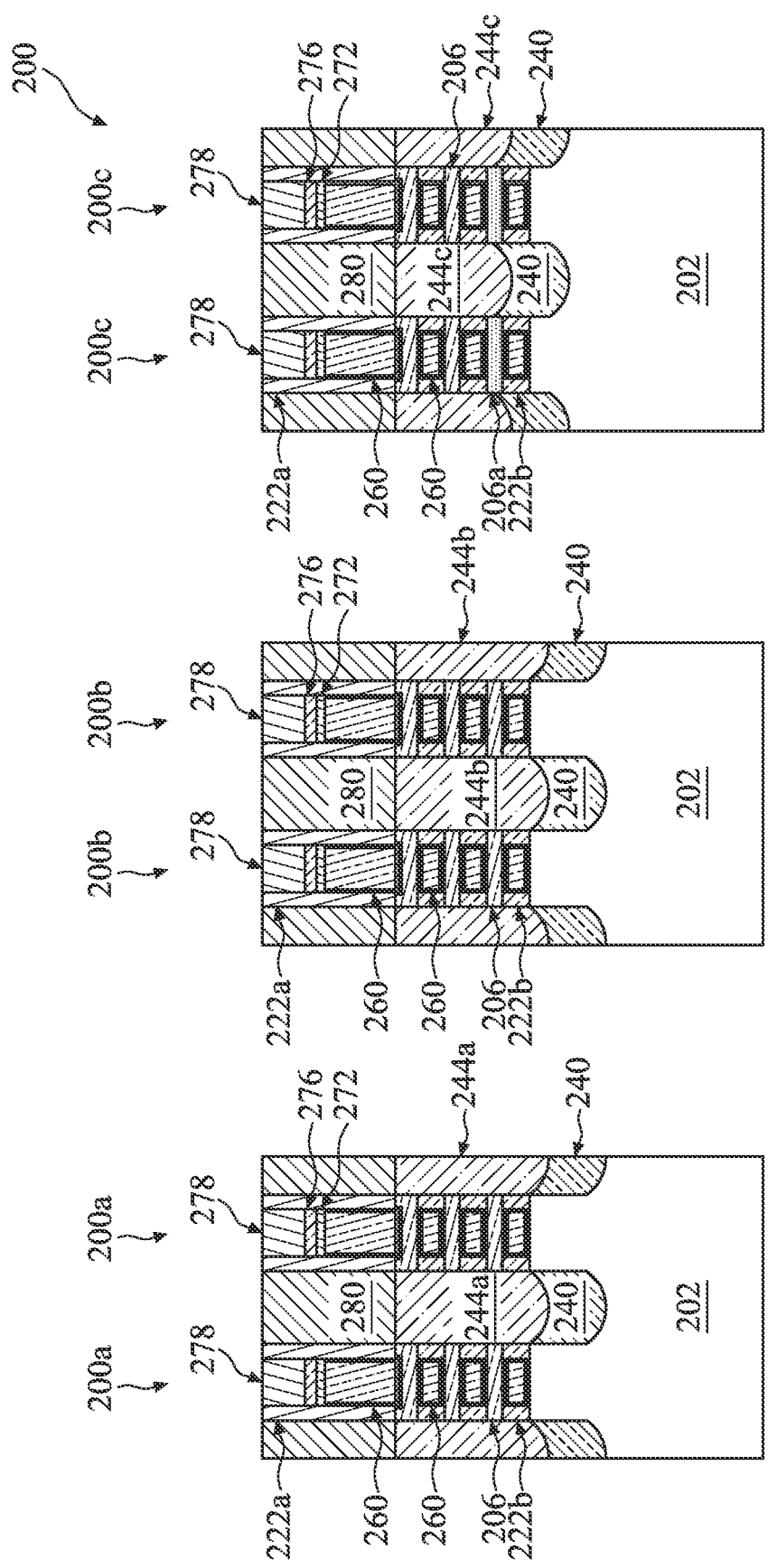
Figures 53A, 53B, 53C:
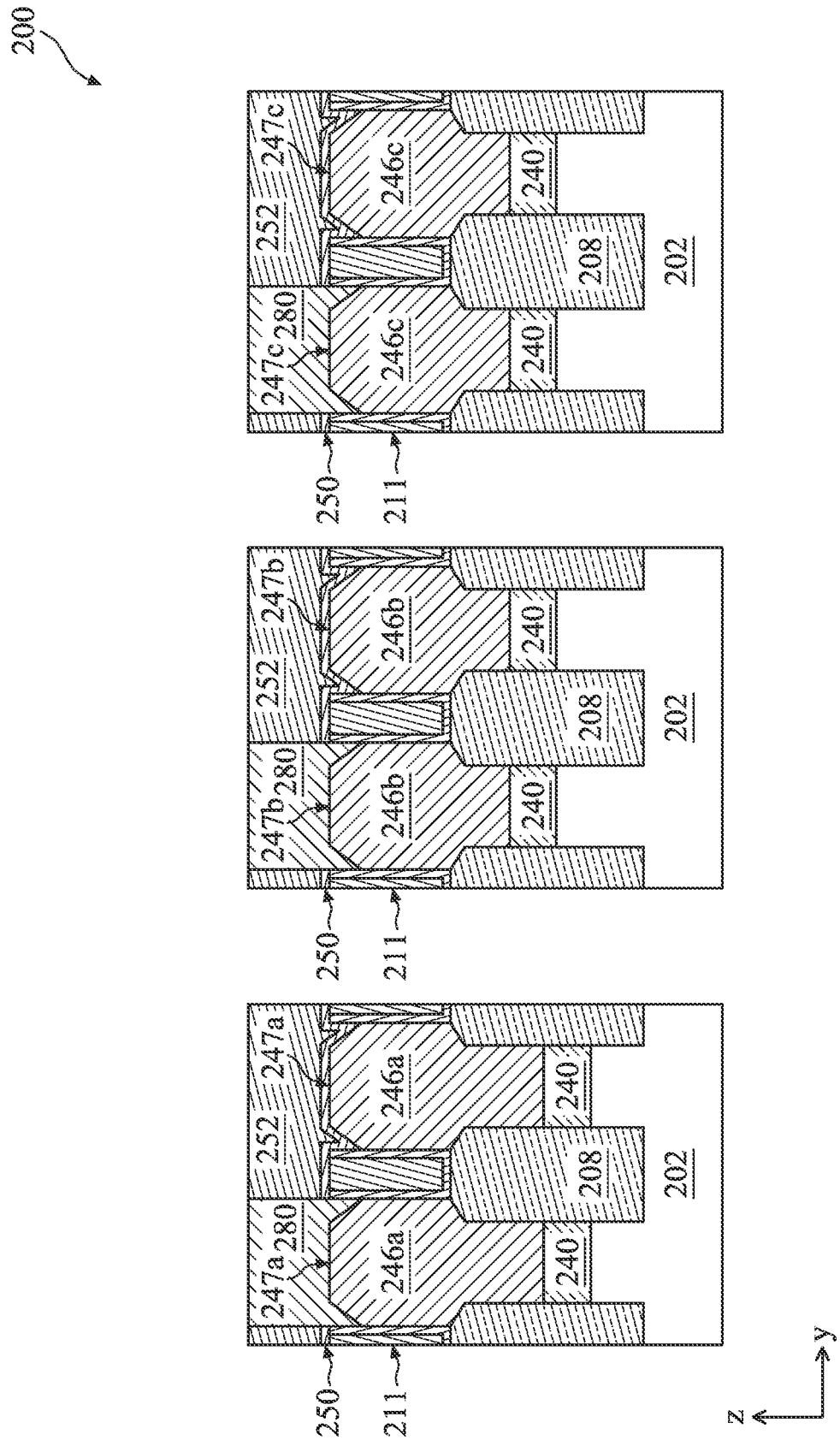

Subsequently, referring to FIGS. 46A-46C, method 100 deposits another metal layer 276 over the metal layer 272 and between adjacent gate isolation features 274. In some embodiments, the metal layer 276 includes Ti, TiN, Ta, Ni, W, Ru, Al, Co, other suitable metals, or combinations thereof. In some embodiments, the metal layers 272 and 276 have the same composition. In some embodiments, the metal layer 276 has a multi-layer structure. The metal layer 276 may be formed in a manner similar to the metal layer 272. In some embodiments, the metal layer 276 includes fluorine-free W and may be deposited using MOCVD. In some embodiments, the metal layer 272 serves as a seed layer for forming the metal layer 276 in a bottom-up scheme. In the present embodiments, the metal layer 276 is configured to electrically connect portions of the metal gate stack 260 between two gate isolation features 274. As such, the metal layer 276 is formed to a thickness that is less than that of the gate isolation features 274, such that the gate isolation features 274 protrude from the metal layer 276.

Now referring to FIGS. 47A-48C, method 100 forms a dielectric layer 278 over the metal layer 276 and adjacent to the gate isolation features 274. In some embodiments, the dielectric layer 278 includes SiN, SiCN, SiOC, SiON, SiOCN, other suitable materials, or combinations thereof. The dielectric layer 278 may be deposited by any suitable method, such as ALD, CVD, PVD, other suitable methods, or combinations thereof. Subsequently, method 100 removes portions of the dielectric layer 278 formed over the gate isolation features 274 in one or more CMP process, thereby planarizing the top surface of the structure 200.

Referring to FIGS. 49A-50C, method 100 at operation 134 forms S/D contacts 280 over one or more of the epitaxial S/D features 242a-242c. In some embodiments, the S/D contacts 280 include Co, W, Ru, Cu, Al, Ti, Ni, Au, Pt, Pd, other suitable metals, or combinations thereof. In some embodiments, forming the S/D contacts 280 includes patterning the ILD layer 252 and the ESL 250 to form contact openings (not depicted), forming a metal silicide layer over the epitaxial S/D features 242a-242c in the contact openings, depositing a metal layer in the contact openings and over the metal silicide layer, and performing a CMP process to the metal layer to form the S/D contacts 280. Depositing the metal layer may be implemented by any suitable method, such as CVD, PVD, plating, other methods, or combinations thereof. The metal silicide layer may be formed by depositing a metal layer over the epitaxial S/D features 242a-242c, treating the metal layer such that it reacts with the epitaxial S/D features 242a-242c to form the metal silicide layer, and performing an etching process to remove an unreacted top portion of the metal layer and expose the underlying metal silicide layer. In some embodiments, a barrier layer may be formed over the metal silicide layer before forming the S/D contacts 280, where the barrier layer may include Ti, TiN, Ta, TaN, WN, other suitable materials, or combinations thereof.

FIGS. 51A-52C and 53A-54C depict embodiments of the NS FETs 200a-200c alternative to those of FIGS. 49A-50C discussed in detail above. For example, embodiments of FIGS. 51A-52C depict the NS FETs 200a, 200b, and 200c including the epitaxial S/D features 245a, 245b, and 245c, respectively, which each include a doped epitaxial layer over the un-doped buffer layer 240 and where the effective overlapping area of the epitaxial S/D feature 245c is less than that of each of the epitaxial S/D features 245a and 245b. In this regard, the $C_{gd}$ of the NS FET 200c is less than that of each of the NS FETs 200a and 200b, while the NS FETs 200a and 200b are configured to provide greater current conduction than the NS FET 200c. Additionally, embodiments of FIGS. 53A-54C depict the NS FETs 200a, 200b, and 200c including the epitaxial S/D features 247a, 247b, and 247c, respectively, which each include a doped epitaxial layer over the un-doped buffer layer 240 and where the effective overlapping area of each of the epitaxial S/D features 247b and 247c is less than that of the epitaxial S/D feature 247a. In this regard, the $C_{gd}$ of the NS FETs 200b and 200c are each less than that of the NS FET 200a, while the NS FET 200a is configured to provide greater current conduction than the NS FETs 200b and 200c. It is noted that, for embodiments of the NS FETs 200a and 200b depicted in FIGS. 54A and 54B, although no APT layer 206a is included in either of the devices, the effective overlapping area is tuned by adjusting the depths of their respective S/D recesses as well as the presence of the un-doped buffer layer 240.

Thereafter, method 100 at operation 136 performs additional fabrication processes to the structure 200, such as forming a multi-layer interconnect (MLI) structure (not depicted) thereover. The MLI may include various interconnect features, such as vias and conductive lines, disposed in dielectric layers, such as ESLs and ILD layers. In some embodiments, the vias are vertical interconnect features configured to interconnect a device-level contact, such as the S/D contact 280 or a gate contact (not depicted), with a conductive line or interconnect different conductive lines, which are horizontal interconnect features. The ESLs and the ILD layers of the MLI may have substantially same compositions as those discussed above with respect to the ESL 250 and the ILD layer 252, respectively. The vias and the conductive lines may each include any suitable conductive material, such as Co, W, Ru, Cu, Al, Ti, Ni, Au, Pt, Pd, a metal silicide, other suitable conductive materials, or combinations thereof, and be formed by a series of patterning and deposition processes. Additionally, each via and conductive line may additionally include a barrier layer that comprises TiN and/or TaN.

Although not intended to be limiting, one or more embodiments of the present disclosure provide many benefits to a semiconductor device and the formation thereof. For example, the present disclosure provides different (i.e., hybrid) NS FETs each configured with a stack of channel layers engaging with a metal gate stack and formed over different regions of the same substrate. In the present embodiments, the NS FETs differ in the configuration of their respective epitaxial S/D features. In some embodiments, one of the NS FETs includes one or more doped, anti-punch-punch-through (APT) layer in its stack of channel layers, such that the overlapping area (defined by a vertical extension or depth) between the stack and the epitaxial S/D features is reduced compared to another one of the NS FETs whose stack of channel layers is free of any APT layer. In some embodiments, the overlapping area in one or more of the NS FETs is adjusted by controlling a depth of the S/D recess and/or by forming an un-doped buffer layer below a doped epitaxial layer with or without the presence of any APT layer. In other words, NS FETs having different overlapping areas between their respective epitaxial S/D features and channel regions are formed over the same substrate, which in turn provide benefits of devices having relatively less overlapping area that leads to lowered parasitic capacitance ($C_{gd}$) as well as of devices having relatively more overlapping area that leads greater current conduction for HC or HPC applications. Embodiments of the disclosed methods can be readily integrated into existing processes and technologies for manufacturing NS FETs, FinFETs, and/or other suitable devices.

In one aspect, the present embodiments provide a semiconductor structure that includes a first stack of active channel layers and a second stack of active channel layers disposed over a semiconductor substrate, where the second stacking include a dummy channel layer and the first stack is free of any dummy channel layer, a gate structure engaged with the first stack and the second stack, and first S/D features disposed adjacent to the first stack and second S/D features disposed adjacent to the second stack, where the second S/D features overlap with the dummy channel layer.

In another aspect, the present embodiments provide a semiconductor structure that includes a first fin structure including a first stack of active channel layers and a second fin structure including a second stack of active channel layers disposed over at least one dummy channel layer, the first fin structure and the second fin structure protruding from the substrate, a gate structure engaged with the first stack and the second stack, a first S/D feature disposed in the first fin structure and adjacent to the first stack, where the first S/D feature includes a first doped epitaxial layer over an un-doped epitaxial layer, a second S/D feature disposed in the second fin structure and adjacent to the second stack, where the second S/D feature includes a second doped epitaxial layer over the un-doped epitaxial layer, and where the un-doped epitaxial layer overlaps with the at least one dummy channel layer.

In yet another aspect, the present embodiments provide a method of forming a semiconductor structure, where the method includes providing a semiconductor substrate having a first region and a second region, forming a first fin protruding from the first region and a second fin protruding from the second region, where the first fin includes a first stack of active channel layers and the second fin includes a second stack of active channel layers disposed over at least one dummy channel layer, and where the active channel layers and the at least one dummy channel layer have different compositions, forming a dummy gate stack over the first fin and the second fin, forming first S/D features in the first fin and second S/D features in the second fin, where the second S/D features overlap with the at least one dummy channel layer, and replacing the dummy gate stack with a metal gate stack, where the metal gate stack is formed adjacent to the first S/D features and the second S/D features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first stack of active channel layers disposed over a semiconductor substrate;
   a second stack of active channel layers disposed over the semiconductor substrate;
   a dummy channel layer disposed within the second stack, wherein the first stack is free of any dummy channel layer;
   a gate structure engaged with the first stack and the second stack; and
   first source/drain (S/D) features disposed adjacent to the first stack and second S/D features disposed adjacent to the second stack, wherein the second S/D features overlap with the dummy channel layer.

2. The semiconductor structure of claim 1, wherein the first stack includes a first number of active channel layers, the second stack includes a second number of active channel layers, and the second stack includes a third number of the dummy channel layers, and wherein a sum of the second number and the third number is equal to the first number.

3. The semiconductor structure of claim 2, wherein the third number ranges from one to one less than the first number.

4. The semiconductor structure of claim 1, wherein the dummy channel layer includes a first dopant species and the second S/D features include a second dopant species that has a conductivity type different from that of the first dopant species.

5. The semiconductor structure of claim 1, wherein the dummy channel layer includes a semiconductor material doped with a p-type dopant or an n-type dopant, and wherein each active channel layer in the first stack and the second stack is free of any dopant.

6. The semiconductor structure of claim 1, wherein the first S/D features and the second S/D features each include a doped semiconductor layer and have the same depth.

7. The semiconductor structure of claim 6, wherein the doped semiconductor layer of the second S/D features overlaps with the dummy channel layer.

8. The semiconductor structure of claim 1, wherein the first S/D features include a first doped semiconductor layer disposed over an un-doped semiconductor layer and the second S/D features include a second doped semiconductor layer disposed over the un-doped semiconductor layer, and wherein the first doped semiconductor layer extends to below the second doped semiconductor layer.

9. The semiconductor structure of claim 8, wherein the un-doped semiconductor layer in the second S/D features overlaps with the dummy channel layer.

10. A semiconductor structure, comprising:
a first fin structure including a first stack of active channel layers and protruding from a substrate;
a second fin structure including a second stack of active channel layers disposed over at least one dummy channel layer and protruding from the substrate;
a gate structure engaged with the first stack and the second stack;
a first source/drain (S/D) feature disposed in the first fin structure and adjacent to the first stack, wherein the first S/D feature includes a first doped epitaxial layer over an un-doped epitaxial layer; and
a second S/D feature disposed in the second fin structure and adjacent to the second stack, wherein the second S/D feature includes a second doped epitaxial layer over the un-doped epitaxial layer, and wherein the un-doped epitaxial layer overlaps with the at least one dummy channel layer.

11. The semiconductor structure of claim 10, wherein the at least one dummy channel layer includes a first dopant and the second S/D feature includes a second dopant, and wherein the first dopant and the second dopant differ in conductivity type.

12. The semiconductor structure of claim 10, wherein a total number of the at least one dummy channel layer and the active channel layers in the second stack is the same as a total number of the active channel layers in the first stack.

13. The semiconductor structure of claim 10, further comprising:
a third fin structure including a third stack of active channel layers and protruding from the substrate, wherein the first stack and the third stack include the same number of the active channel layers; and
a third S/D feature disposed in the third fin structure and adjacent to the first stack, wherein the third S/D feature includes a third doped epitaxial layer over the un-doped epitaxial layer, and wherein the first S/D feature extends to below the third S/D feature.

14. The semiconductor structure of claim 13, wherein a first number of the active channel layers in the first stack that overlap with the first S/D feature is greater than a second number of the active channel layers in the third stack that overlap with the third S/D feature.

15. The semiconductor structure of claim 13, wherein an offset between a bottom surface of the first S/D feature and the third S/D feature is greater than a thickness of the un-doped epitaxial layer.

16. A method, comprising:
providing a semiconductor substrate having a first region and a second region;
forming a first fin protruding from the first region and a second fin protruding from the second region, wherein the first fin includes a first stack of active channel layers and the second fin includes a second stack of active channel layers disposed over at least one dummy channel layer, and wherein the active channel layers and the at least one dummy channel layer have different compositions;
forming a dummy gate stack over the first fin and the second fin;
forming first source/drain (S/D) features in the first fin and second S/D features in the second fin, wherein the second S/D features overlap with the at least one dummy channel layer; and
replacing the dummy gate stack with a metal gate stack, wherein the metal gate stack is formed adjacent to the first S/D features and the second S/D features.

17. The method of claim 16, wherein forming the first fin and the second fin includes:
forming a sacrificial layer over the semiconductor substrate;
forming a bottommost active channel layer over the sacrificial layer;
selectively performing an implantation process to a portion of the bottommost active channel layer disposed in the second region with respect to a portion of the bottommost active channel layer disposed in the first region;
thereafter, alternatingly forming the sacrificial layers and the active channel layers over the bottommost active channel layer to form a stack; and
patterning the stack to form the first fin and the second fin.

18. The method of claim 16, wherein a total number of the active channel layers and the at least one dummy channel layer in the second stack is the same as a total number of the active channel layers in the first stack.

19. The method of claim 16, wherein forming the first S/D features and the second S/D features include:
forming a first S/D recess in the first fin and a second S/D recess in the second fin;
epitaxially growing a first semiconductor layer in the first S/D recess and the second S/D recess, wherein the first semiconductor layer is free of any dopant species, and wherein the first semiconductor layer overlaps with the at least one dummy channel layer; and
epitaxially growing a second semiconductor layer over the first semiconductor layer, wherein the second semiconductor layer includes a dopant species.

20. The method of claim 16, wherein the active channel layers are free of any dopant species, the at least one dummy channel layer includes a first dopant species, and the second S/D features includes a second dopant species, and wherein the first dopant species and the second dopant species have different conductivity types.

* * * * *